US012804858B2

(12) United States Patent
Liang

(10) Patent No.: US 12,804,858 B2
(45) Date of Patent: Nov. 17, 2026

(54) TWO PHASE SHOWER IMMERSION COOLING SYSTEM FOR DATA CENTER: VAPOR PURGING

(71) Applicant: Jemm's Labs, Sunnyvale, CA (US)

(72) Inventor: Jemm Yue Liang, Sunnyvale, CA (US)

(73) Assignee: Jemm's Labs, Sunnyvale, CA (US)

( * ) Notice: Subject to any disclaimer, the term of this patent is extended or adjusted under 35 U.S.C. 154(b) by 0 days.

(21) Appl. No.: 19/409,813

(22) Filed: Dec. 5, 2025

(65) Prior Publication Data

US 2026/0164611 A1 Jun. 11, 2026

Related U.S. Application Data

(60) Provisional application No. 63/923,793, filed on Nov. 24, 2025, provisional application No. 63/753,423, filed on Feb. 3, 2025, provisional application No. 63/744,828, filed on Jan. 13, 2025, provisional application No. 63/729,934, filed on Dec. 9, 2024.

(51) Int. Cl.
*H05K 7/20* (2006.01)

(52) U.S. Cl.
CPC ................................ *H05K 7/20809* (2013.01)

(58) Field of Classification Search
CPC ............... H05K 7/203; H05K 7/20318; H05K 7/20327; H05K 7/2039; H05K 7/20809; H05K 7/20818; H05K 7/20236; H05K 7/20263; H05K 7/20272; H05K 7/2029; H05K 7/20381; H05K 7/20409; H05K 7/20418; H05K 7/20663; H05K 7/208; H05K 7/20881; H05K 7/209; H05K 7/20936
See application file for complete search history.

(56) References Cited

U.S. PATENT DOCUMENTS

| | | | | | |
|---|---|---|---|---|---|
| 4,949,164 | A * | 8/1990 | Ohashi | .................. | H10W 40/73 165/80.4 |
| 11,357,130 | B2 * | 6/2022 | Manousakis | ........... | H05K 7/203 |
| 11,375,638 | B2 * | 6/2022 | Cheng | ................ | H05K 7/20818 |
| 12,295,118 | B1 * | 5/2025 | Chigullapalli | ......... | H05K 7/203 |
| 2022/0221231 | A1 * | 7/2022 | Lee | ....................... | F28D 15/046 |
| 2022/0408587 | A1 * | 12/2022 | Kelley | ............... | H05K 7/20809 |
| 2024/0015930 | A1 * | 1/2024 | Tu | ...................... | H05K 7/20318 |
| 2024/0147664 | A1 * | 5/2024 | Tsang | ................ | H05K 7/20327 |
| 2024/0276676 | A1 * | 8/2024 | Yang | ...................... | H05K 7/203 |
| 2024/0414882 | A1 * | 12/2024 | Gorla | ........................ | F28F 3/12 |
| 2025/0040090 | A1 * | 1/2025 | Yang | .................. | H05K 7/20327 |

FOREIGN PATENT DOCUMENTS

CN 213694613 U * 7/2021 ......... H05K 7/20236

OTHER PUBLICATIONS

CN-213694613-U English Translation (Year: 2021).*

* cited by examiner

*Primary Examiner* — Amir A Jalali
(74) *Attorney, Agent, or Firm* — Winston Hsu

(57) ABSTRACT

A cooling system, including a coolant chamber; wherein liquid coolant in the coolant chamber is vaporized as coolant vapor because of a heat generating component on a circuit board disposed within the coolant chamber and bubbles are produces from a heating surface associated with a heat generating component; wherein a liquid coolant movement relative to the heating surface is produced in order to remove the bubbles produced from the heating surface.

22 Claims, 27 Drawing Sheets

(a) (b)

TWO PHASE SHOWER IMMERSION COOLING SYSTEM FOR DATA CENTER: VAPOR PURGING

CROSS REFERENCE TO RELATED APPLICATIONS

This application claims the benefit of U.S. Provisional Application No. 63/753,423, filed on Feb. 3, 2025. Further, this application claims the benefit of U.S. Provisional Application No. 63/744,828, filed on Jan. 13, 2025. Further, this application claims the benefit of U.S. Provisional Application No. 63/729,934, filed on Dec. 9, 2024. Further, this application claims the benefit of U.S. Provisional Application No. 63/923,793, filed on Nov. 24, 2025. The contents of these applications are incorporated herein by reference.

BACKGROUND OF THE INVENTION

1. Field of the Invention

The present application relates to a cooling system, and more particularly, to a cooling system capable of improving efficiency.

2. Description of the Prior Art

Unless otherwise indicated herein, the approaches described in this section are not prior art to the claims in this application and are not admitted as prior art by inclusion in this section.

Existing implementations of Two-Phase Liquid Immersion Cooling (2P-LIC) technology present several architectural and operational deficiencies that limit their viability for high-density, hyper-scale data center environments. As shown in FIG. 25, a primary structural limitation arises from the methods employed for maintenance access. Due to the requirement for the vertical lifting of Printed Circuit Boards (PCBs) out of the coolant soaking bath for servicing, these systems inherently suffer from very poor vertical packing density (①). This vertical extraction mechanism dictates a significant clearance for PCB movement, thereby wasting valuable rack space.

Furthermore, this vertical service model complicates the mechanical design, often requiring a clumsy motorized top-lid to provide access to the submerged components. Such heavy lids, which must also serve to seal the vapor space, potentially generate significant vapor pressure during normal operation, add unnecessary complexity, cost, and maintenance burden to the chassis design, while compromising the overall service efficiency of the system.

A considerable operational challenge is posed by the inherent messiness and environmental risk of the maintenance process (②). When a PCB is lifted for service, it is saturated with liquid coolant, leading to inevitable coolant dripping and spillage during this procedure. This mechanical necessity to lift the components, combined with the vapor pressure buildup due to the volatility of the working fluid when operating GPU/CPU mounted on PCB, results in the need to prevent uncontrolled release of fugitive emissions by the use of heavy duty covers (④) atop the coolant tank, particularly where the coolant contains Per- and Polyfluoroalkyl Substances (PFAS). This presents a critical industry challenge, as the escape of these regulated materials raises serious concerns regarding environmental, health, and rapidly evolving regulatory compliance (PFAS compliance), thereby increasing operational overhead and liability.

The containment aspect of conventional 2P-LIC also contributes to poor resource utilization. To ensure sufficient buffer for vapor expansion and pressure stability within the system—especially given the regulatory need for PFAS compliance which necessitates a heavy lid to seal in pressurized coolant vapor—the chassis typically require a full tank of coolant (③) to fully immerse the components. Additionally, the need to manage and prevent pressure runaway from the evaporating fluid requires dedicating a large volume of internal chassis space solely for vapor circulation, thus reducing the effective volume available for computing hardware.

This large, sealed vapor volume directly impacts the design of the condenser element. Systems that rely on passive or diffusion-based condensation mechanisms (i.e., as pointed out by ⑤, coolant vapor is made to permeate alongside, but not passing through, the condensers), inherently require a condenser with a very large surface area. Consequently, the supporting infrastructure must also provide large space for vapor circulation, which results in overall poor horizontal space utilization (⑥) within the chassis and rack footprint.

Finally, the required vertical orientation for PCB lifting impacts cabling and connectivity. With the back side of the chassis frequently blocked (⑦) to support the vertical service path, all networking and power cables must be routed on the bottom. This architectural compromise necessitates the use of long cables for vertical lifting clearance. Long networking cables may preclude the use of short, high-speed fiber optical connections, and the cable management requirements can become unnecessarily complicated or restricted. Likewise, long power cables introduce undesirable resistive losses, thereby decreasing overall power efficiency.

Beyond these implementation challenges, the rapidly escalating power density of modern computing components has exposed a fundamental heat dissipation bottleneck in existing cooling technologies. With the power consumption of GPUs (or other variants like NPUs, TPUs) projected to quadruple from current levels of 1.2 kW per-chip up to 3 kW to 5 kW per-chip within the coming 4-7 years, current cooling solutions will soon exceed their thermal limits. For example, in the most advanced cooling technologies like direct-to-chip (D2C) liquid cooling, the overall thermal resistance $R_H$, from transistor junctions to surfaces contacting coolant, is 0.012-0.013°/W/chip which, at the anticipated power levels of 3 kW-5 kW per-chip results in junction-to-coolant temperature difference (ΔT) up to 40° C. or 60° C. ($0.013\times3000=39$, $0.012\times5000=60$). Such massive temperature rise makes it difficult to achieve target chip performance with desirable reliability, indicating evolutionarily cooling technology progress is insufficient to manage future jumps in power density, necessitating a revolutionary approach.

A core limitation of current thermal solutions, whether air-cooled or liquid-cooled, is the reliance on the Integrated Heat Spreader (IHS) scheme. The IHS scheme introduces a long chain of series thermal resistance $R_H$, from the transistor junction $T_r$, through the substrate, multiple Thermal Interface Materials ($TIM_1$ and $TIM_2$), the IHS itself, and finally the heatsink, before reaching the final cooling medium. The effective IHS depends strongly on the $R_{H\_Heatsink \rightarrow Coolant}$ being significantly higher than $R_H$ of all other subsection (so that heatsink can function properly). This assumption is easily satisfied when the final cooling medium is air. But nowadays liquid coolants are gaining popularity in AI-server racks and $R_{H\_Coldplate \rightarrow Coolant}$ is no longer the clear dominant factor, even in the 1.5 kW/AI-chip power density. To address the coming massive jump in power-per-chip, the overall $R_H$ must be sharply reduced, and the first subsection $R_H$ to be focused on should be the one with the highest value currently, which is the final stage, the $R_{H\_Coldplate \rightarrow Coolant}$. From this perspective, the 1-phase cooling technologies, even the liquid cooled version, have already approached their limits in the current (2025) generation AI servers, and there's little room of improvement left. The future direction for drastic lower $R_{H\_Coldplate \rightarrow Coolant}$ no doubt falls on 2-phase cooling technologies, since in 2-phase cooling, by utilizing the latent vaporization heat absorption at coolant's boiling point, $R_{H\_Coldplate \rightarrow Coolant@BP} \rightarrow 0$ ($R_{H\_Coldplate \rightarrow Coolant@BP}$ approach 0 at coolant's boiling point), making it idea to handle the rapid rise of per-chip power consumption.

However, the $R_{H \rightarrow Coldplate \rightarrow Coolant@BP} \rightarrow 0$ means the basis for the IHS operation ($R_{H \rightarrow Coolant}$ being the dominant $R_H$ component) has disappeared, and the very act of adding the IHS and heatsink may be ultimately counterproductive in high-power GPU/CPU/NPU two-phase cooling environments. This is due to two critical factors: firstly, the thermal conductivity $G_H$ of materials like Copper (Cu) and Aluminum (Al) is only 1.5× to 2.5× greater than Silicon (Si); secondly, in a two-phase immersion scenario, the liquid-to-coolant thermal resistance ($R_{H \rightarrow Coolant}$) at the boiling point approaches zero due to latent heat absorption during evaporation (liquid→vapor phase change). Consequently, the additional heat resistance introduced by the IHS, TIM and heatsink does not provide any benefit, while unnecessarily increasing the total thermal resistance $R_{H,\ Total}$ and exacerbating the heat management crisis.

Hence, there is a need to improve over prior art.

SUMMARY OF THE INVENTION

It is therefore a primary objective of the present application to provide a cooling system, to improve over disadvantages of the prior art.

An embodiment of the present application provides a cooling system, comprising a coolant chamber; wherein liquid coolant in the coolant chamber is vaporized as coolant vapor because of a heat generating component on a circuit board disposed within the coolant chamber and bubbles are produces from a heating surface associated with a heat generating component; wherein a liquid coolant movement relative to the heating surface is produced in order to remove the bubbles produced from the heating surface.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
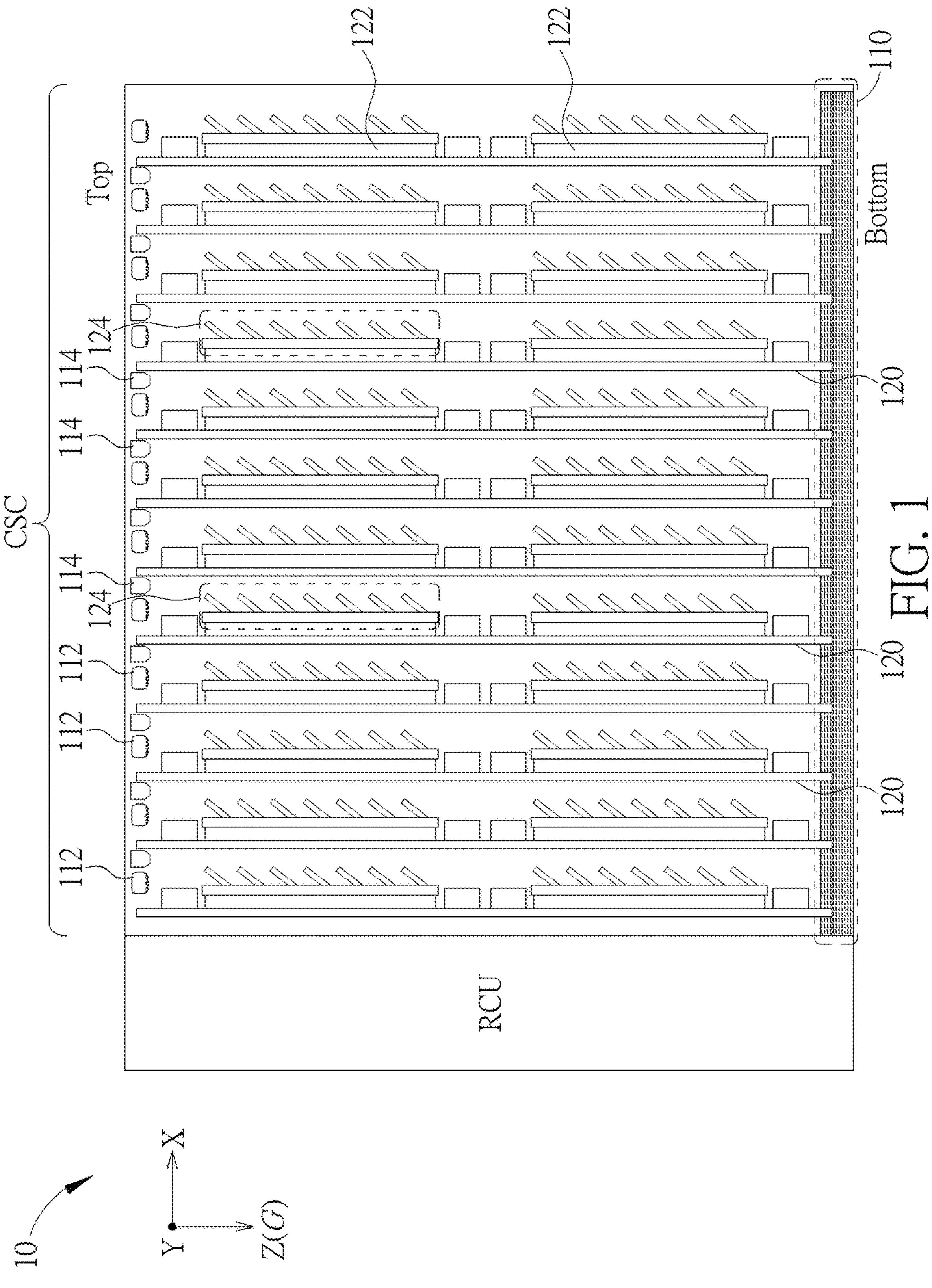
FIG. 1 is a schematic diagram of a cooling system according to an embodiment of the present invention.

The technical features described in the embodiments of the present invention may be mixed or combined in various ways as long as there are no conflicts between them.

Two-Phase Liquid Immersion Cooling (2P-LIC) systems achieve their cooling effect mainly by turning liquid coolant into vapor on the surface where the liquid coolant meets hot GPU/CPU. Once coolant turns into vapor, it will become highly thermal resistant. If left unaddressed, as in prior 2P-LIC embodiments, such vapor forms bubbles and can cover large percentages of surfaces of GPU/CPU. Such vapor covered surfaces (VCS) will lose their exposure to liquid coolant and become poorly cooled. To make things worse, the ratio of surface covered by vapor rises along with the local power consumption, i.e., imagine the GPU chip surface is divided into 500×500 subdivisions, then subdivisions consuming higher power will have a higher ratio of VCS⇒lower exposure to liquid coolant⇒poorer 2P cooling⇒hotter subdivision surface⇒higher ratio of VCS . . . forming a vicious cycle.

Furthermore, when PCBs (printed circuit boards) are vertically inserted down into the coolant tank, the pressure from liquid coolant will rise along the depth of immersion. This rising liquid coolant pressure will cause boiling point of coolant (defined as vapor pressure equals pressure locally) to also rise, implying GPU/CPU operating temperature may rise along with the depth of immersion. In the field of AI-compute, the speed and efficiency of data access/exchange is of paramount importance. To minimize the time and power required for data traffic, the PCB is trending larger (to accommodate more data traffic locally within one PCB, instead going off the PCB into backplane or out of the rack), which means the depth of immersion will grow and the boiling point rise will increase.

All the effects are highly undesirable, and it would be beneficial if the 2P-LIC system can include native/organic mechanisms to address issues like vapor purging/scrubbing/bubble-breaking-up, liquid coolant circulation, etc. mentioned above.

One approach to counter the effect of "rising boiling point due to immersion depth" is to lower the effective density of the liquid-vapor coolant mixture by increasing the coolant's vapor-to-liquid ratio, and do so while minimizing the negative impact on the cooling capability of 2P-LIC, such as by breaking up large vapor bubbles into very small ones by ultrasonic means. An alternative to counter the effect of "rising boiling point due to immersion depth" is to partition the total "immersion depth" into multiple shorter segments of "virtual immersion depth" by breaking up the one giant "universal coolant soaking tank" containing many PCB into many small, vertically partitioned, "local soaking tub" each covering one or a small number of chips, therefore limiting the physical "depth" and its associated gravity induced pressure increase.

In order to maximize the contact between coolant and heat generating surface (or heating surface), one may create micro surface structure directly on the back side (opposite to the FET circuit side) of the silicon substrate to create local surface tension (within liquid coolant) profile and local adhesion (between liquid coolant and surface of microstructure) profile such that liquid coolant and coolant vapor form structures/fabrics of micro liquid coolant supply drivers (keep pulling new liquid coolant in) & pipes (maintain liquid coolant flowing in well-formed streams, minimize disruption to coolant flow), micro vapor exhausts (make vapor travel in opposite direction of incoming coolant, away from heating surface, without fighting the incoming coolant supply), and micro vapor conduits (travel in parallel to heating surface, from coolant supply pipe to vapor exhaust pipe).

FIG. 1 is a schematic diagram of a cooling system 10 according to an embodiment of the present invention. The cooling system 10 may be applied for a server system (deployed, e.g., in data center) with high/tremendous computation capacity. Specifically, the cooling system 10 may be applied for a chassis in a server rack of the server system. The cooling system 10 comprises a coolant chamber CSC, a plurality of coolant injectors 112, a plurality of air-vapor return vents 114, a liquid coolant collector 110 and a recycle-and-condense unit RCU.

In the present invention, the following terminologies may be used interchangeably:

coolant chamber vs. CSC; vaporization space (i.e., the space where coolant vaporizes) vs. VPS;

condensation space (i.e., the space within condenser) vs. CDS; after condenser space (i.e., the space right after condenser, e.g., the space above coolant tank) vs. ACS.

In FIG. 1 and some figures of the present application, X (pointing right) and Y (pointing into or out of the page) represent horizontal directions, and Z (pointing down) represents vertical or gravity direction, where G herein represents gravity. Downward sometimes means toward earth, in the direction of gravity force; while upward sometimes means toward sky in the direction opposite to gravity force.

Figure 2:
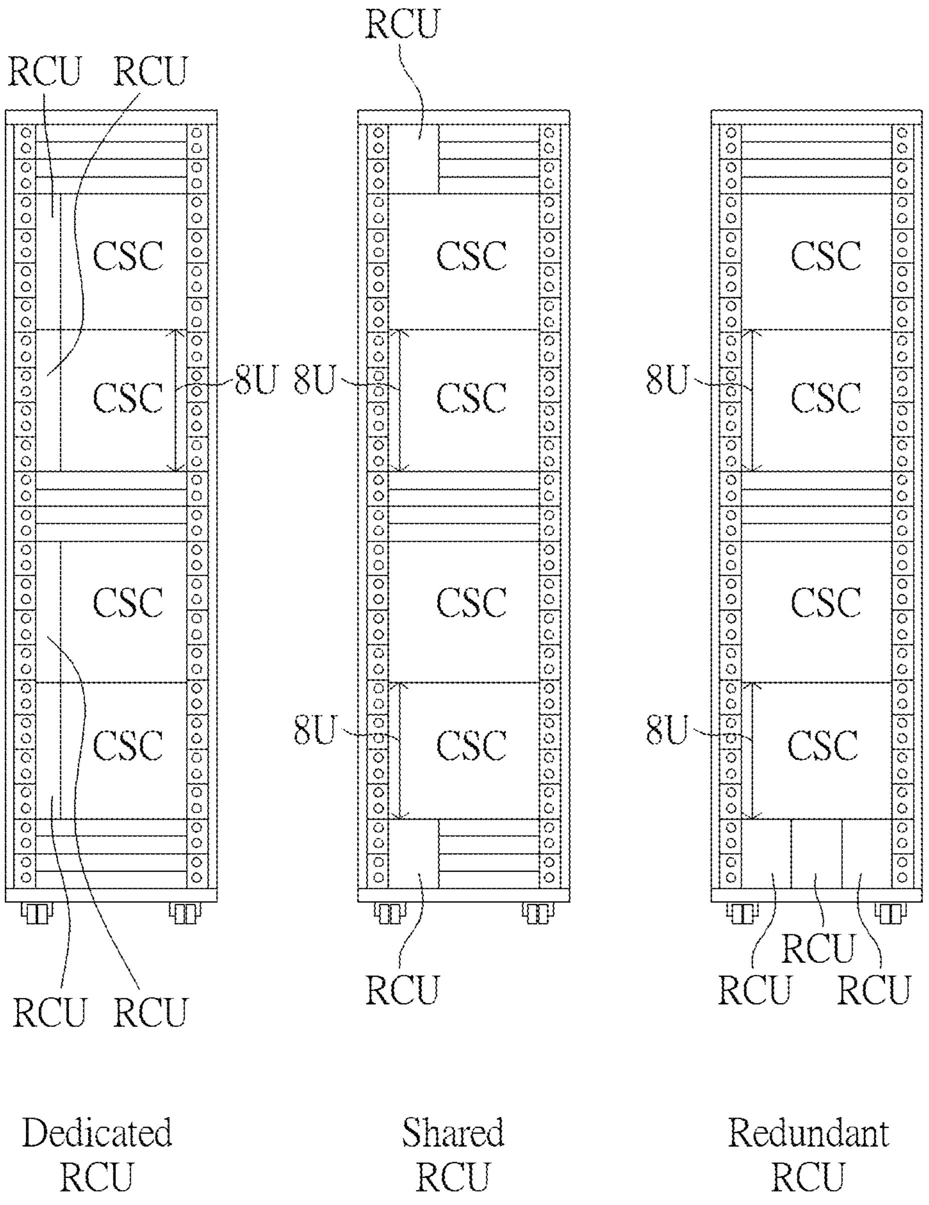
FIG. 2 is a schematic diagram of server racks according to embodiments of the present invention.

FIG. 2 illustrates three different configurations of coolant chambers CSC and recycle-and-condense unit RCU deployed in server rack. The coolant chamber CSC may be disposed within the chassis (housed) in/on the server rack of the server system.

Back to FIG. 1, a plurality of circuit boards 120 is disposed vertically within the coolant chamber CSC. In the present application, "the circuit boards 120 being disposed vertically" or "the circuit boards 120 being vertically oriented" includes a case that the circuit boards 120 may be slanted by an angle, where the angle may be within a specific (narrow) range, e.g., a range of [−15°, +15°]. A plurality of heat generating components 122 are disposed on the circuit boards 120.

The heat generating components 122 generate heat during their operations. The heat generating components 122 may be CPU, GPU, NPU, TPU or XPU, where C/G/N/T refers to Central/Graphics/Neural-network/Tensor, and PU refers to Processing Unit. XPU may refer to Extension Processing Unit or any other kind of Processing Unit. Component 122 may also refer to DRAM, PMIC, network interface IC, etc.

The coolant injectors 112 are disposed on a top of the coolant chamber CSC. The coolant injectors 112 are configured to inject/shower liquid coolant into the coolant chamber. In an embodiment, the coolant injector 112 may be, comprise or function like a shower head, which produces multiple liquid coolant steams toward multiple stream directions. The liquid coolant collector 110, on the other hand, is disposed on the bottom of the coolant chamber CSC. In addition to a horizontally oriented plate, liquid coolant collector 110 may further comprise networks of trenches and/or grooves to help collect/gather liquid coolant not vaporized after passing through heat generating components 122 and the circuit boards 120.

In the embodiment shown in FIG. 1, the air-vapor return vents 114 is disposed on a top of the coolant chamber CSC, but not limited thereto. The air-vapor return vents 114 connect to the recycle-and-condense unit RCU and is configured to deliver a mixture of air and coolant vapor from the coolant chamber CSC to the recycle-and-condense unit RCU. Practically, the air-vapor return vents 114 may be disposed on suitable positions within the coolant chamber CSC where coolant-vapor will be collected before (or, at higher priority over) air and transported to RCU efficiently. For example, the vapor is heavier than air, and the air-vapor return vents 114 may be disposed on bottom sides of the coolant chamber CSC.

The liquid coolant can be injected/showered into the coolant chamber CSC, e.g., via the coolant injectors 112. The liquid coolant would flow downward (from top to bottom) due to gravity and through the circuit boards 120

(specifically, through the heat generating components 122). Along the way liquid coolant flows toward the bottom of the CSC, some of the liquid coolant may be vaporized as coolant vapor by absorbing heat from components 122 on circuit boards (e.g., PCBs) 120. The liquid coolant not vaporized would fall/drip down to the bottom of the coolant chamber CSC and would be collected by the liquid coolant collector 110.

Note, in order to properly cool the very last (lowest) component 122 in CSC under all conditions, it is critical to oversupply coolant from injector 112, so that more than sufficient coolant will flow down every possible path, whether the components along the path generate lots of heat or no heat at that moment. So, it is a normal operating condition for the coolant collector 110 to have a certain level "excess coolant". The specific level of that "excess coolant" is a factor for system designer to decide.

The recycle-and-condense unit RCU would recycle the liquid coolant collected by the liquid coolant collector 110 and reclaim coolant (via condensation) from the vapor retrieved from the coolant chamber CSC.

Different from existing immersion liquid cooling scheme, the circuit boards 120 are not physically immersed in liquid coolant. Instead, the cooling system 10 demonstrates a shower cooling scheme, where the circuit boards 120 can be regarded as taking shower of liquid coolant during the cooling process/operation. In other words, during an operation (or the cooling operation) of the cooling system 10, the cooling system 10 comprises a flowing liquid coolant which flows over or through the plurality of circuit boards 120 due to gravity. Namely, due to gravity the flowing liquid coolant is continuously flowing from top of the coolant chamber CSC to bottom of the coolant chamber CSC during the (cooling) operation of the cooling system 10. In addition, space between adjacent circuit boards is filled with mixture of air and coolant vapor. In this case, demand for liquid coolant per chassis is significantly reduced.

Figure 16:
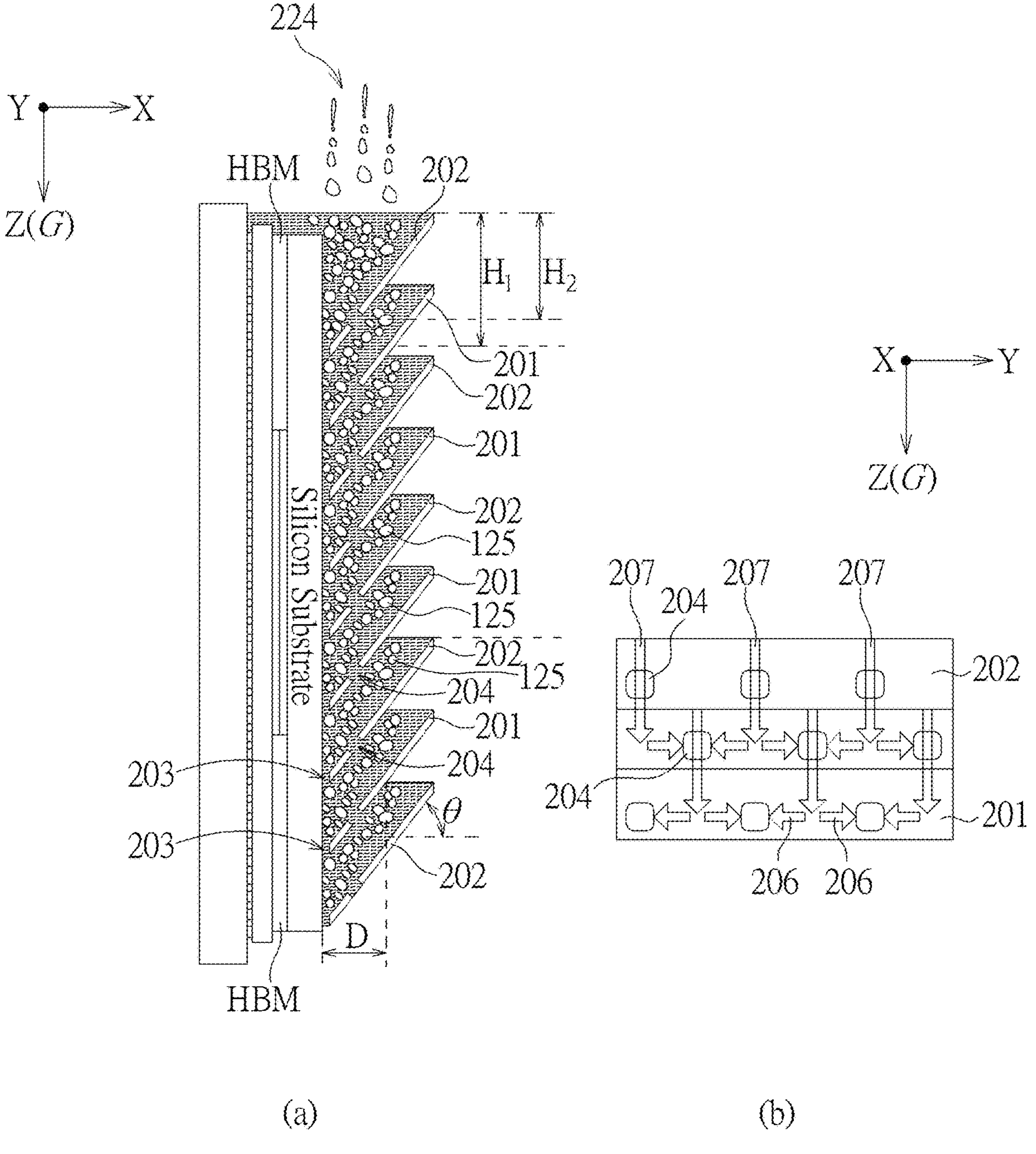
FIG. 16 is a schematic diagram of soaking pockets formed by tilting fins according to an embodiment of the present invention.

In an embodiment, structure with arrays of up-tilting fins, such as shown in FIG. 16, is applied to the heat generating surface of components 122. In this embodiment, between vertically adjacent up-tilting fins, soaking pockets 125 can be formed. When coolant flow rate is sufficient to keep the soaking pockets 125 filled, virtual soaking depth of D, in the X/horizontal direction, is established. There are two major differences between soaking pockets 125 and soaking tank in 2P-LIC system. First, the immersion depth is horizontal, orthogonal to gravity. Therefore, all negative effects associated with gravity (such as vapor is pushed against to heating surface of component 122 by G, or boiling point rises with immersion depth) mostly vanishes. Second, the soaking pocket is formed ad hoc, temporarily, rather than permanently, which means, after coolant shower is stopped, soaking pockets 125 vanish, and all the problems associated with 2P-LIC soaking tank become irrelevant.

Due to these two fundamental differences, soaking pocket 125 is referred to as being "virtual", contrasting with the conventional soaking tank being "physical".

Figure 3:
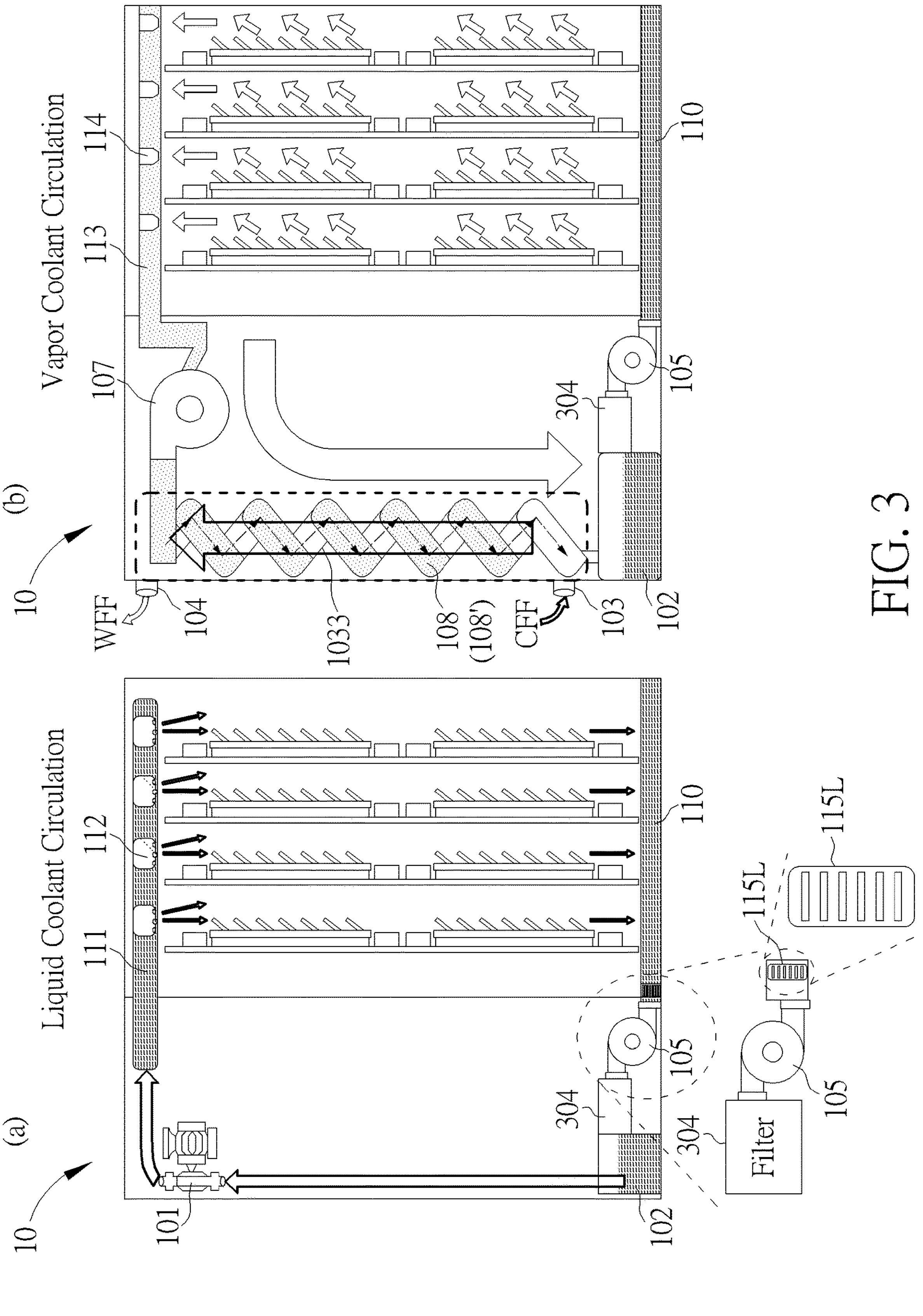
FIG. 3 is a schematic diagram of a cooling system according to an embodiment of the present invention.

The recycle-and-condense unit RCU, along with the coolant chamber CSC, would establish a liquid coolant circulation, as shown in FIG. 3(*a*), and a coolant vapor circulation for the cooling system 10, as shown in FIG. 3(*b*).

For the liquid coolant circulation, the recycle-and-condense unit RCU comprises a coolant reservoir/tank 102, pumps 101 and 105. The pump 105 is connected to the liquid coolant collector 110 and configured to drain the collected liquid coolant from the liquid coolant collector 110 to the coolant reservoir/tank 102. A filter 304 is optionally disposed between the pump 105 and the coolant reservoir/tank 102, to filter out dust or other kinds of impurity/contamination within the collected liquid coolant. The pump 101 is connected between the coolant reservoir/tank 102 and a coolant (distribution) pipe 111. The pump 101 is configured to force the liquid coolant in the coolant reservoir/tank 102 to flow toward the coolant injectors 112 via the coolant (distribution) pipe 111, so that the coolant injectors 112 can inject/shower the liquid coolant into the coolant chamber CSC.

In addition, the cooling system of the present invention may comprise a liquid level sensor 115L, disposed within the liquid coolant collector 110, configured to monitor a liquid level corresponding to the liquid coolant collector 110. If the liquid level of the liquid coolant collector 110 (sensed by the liquid level sensor 115L) is too low/high, representing more/less heat is generated by the heat generating component 122 and more/less liquid coolant has vaporized, an injection rate (or flow rate) of injected liquid coolant through the coolant injector 112 into the coolant chamber CSC should therefore be increased/decreased to compensate for the increased/decreased rate of vaporization of liquid coolant. In other words, the injection rate of injected liquid coolant into the coolant chamber may be controlled/adjusted according to a liquid level sensing result of coolant collector 110 by the liquid level sensor 115L.

In the present application, unless specified otherwise, the terms "coolant reservoir" and "coolant tank" are used interchangeably.

For the coolant vapor circulation (refer to FIG. 3*b*), the recycle-and-condense unit RCU comprises a condenser 108 and the coolant reservoir 102. The coolant vapor circulation involves vaporization of the liquid coolant in the coolant chamber CSC, transfer vapor to the recycle-and-condense unit RCU, which is external to the coolant chamber CSC, for coolant condensation and storage in the coolant reservoir 102 before recirculation to the coolant chamber CSC. In an embodiment, the cooling system 10 may optionally comprise a blower 107. The blower 107 is configured to produce an airflow from the coolant chamber CSC to the coolant condenser 108 in order to 1) drain a mixture of air and the coolant vapor to the coolant condenser 108; 2) establish a pressure difference between the coolant chamber CSC and the coolant condenser 108; 3) reduce an air pressure within the coolant chamber CSC ($P_{CSC}$) so as to reduce a boiling point BP of the coolant (which facilitate the coolant vaporization) and, when $P_{CSC}$ is slightly below atmosphere pressure, to help on sealing the chassis.

The condenser 108 is connected to the coolant reservoir/tank 102. The condenser 108 is configured to condense the coolant vapor exhausted by the blower 107 from the coolant chamber CSC into liquid coolant, and the condensed liquid coolant would be dripped and/or stored back to the coolant reservoir 102. Furthermore, the condenser 108 comprises a condensing channel 108' between the coolant chamber CSC and the coolant reservoir/tank 102. The airflow (including the mixture of air and the coolant vapor) from the coolant chamber CSC may flow through the condensing channel within the condenser 108. The coolant vapor may condense into liquid coolant on an interior surface of the condensing channel 108', and the condensed liquid coolant may drip/fall down to the coolant reservoir/tank 102.

The condensing channel 108' itself can be or comprise an enclosed subspace or space except connecting input/output port(s). In the embodiment shown in FIG. 3*b*, the condensing channel 108' may have a shape as a serpentine tube but not limited thereto. In some embodiments, the condenser 108 may be or comprise a plate heat exchanger, which will be shown later. The heat exchanger may comprise first channel(s) and second channel(s). A first/second fluid may flow through the first/second channel(s). Within the heat exchanger, the first fluid is isolated from the second fluid, but heat or thermal energy carried by the first and second fluids may be exchanged/rejected with/to each other. In an embodiment, the first fluid may be the airflow (including the mixture of air and the coolant vapor) from the coolant chamber CSC, and the second fluid may be a facility fluid (e.g., a source water from chiller, cooling tower, etc.), where the facility fluid in the present invention is configured to facilitate the condensation of the coolant vapor into the liquid coolant. In this case, the condensing channel(s) would be the first channel(s) within the heat exchanger connected to/between the coolant chamber CSC and the coolant reservoir/tank 102.

In the present invention. the liquid coolant circulation basically refers to a (liquid) coolant pathway where the liquid coolant is injected into CSC from the coolant injector 112, flowing through the circuit boards 120 and heat generating components 122 and the remaining unvaporized liquid coolant is collected by the liquid coolant collector 110, recycled by the pump 105, stored back into the coolant tank/reservoir 102, and driven by the pump 101 back to the coolant injector 112.

Converse to the "liquid" coolant circulation, the coolant "vapor" circulation basically refers to a coolant pathway including the liquid coolant is vaporized into coolant vapor in the coolant chamber CSC through direct contact with heat generated by elements 122, the coolant vapor is recycled (transported) through condenser 108 and condensed back into liquid coolant within the recycle-and-condense unit RCU by rejecting heat to facility fluid when passing through condenser, and the condensed liquid coolant stored in the coolant tank/reservoir 102, where the stored liquid coolant is driven by the pump 101 back to the coolant injector 112.

Figure 25:
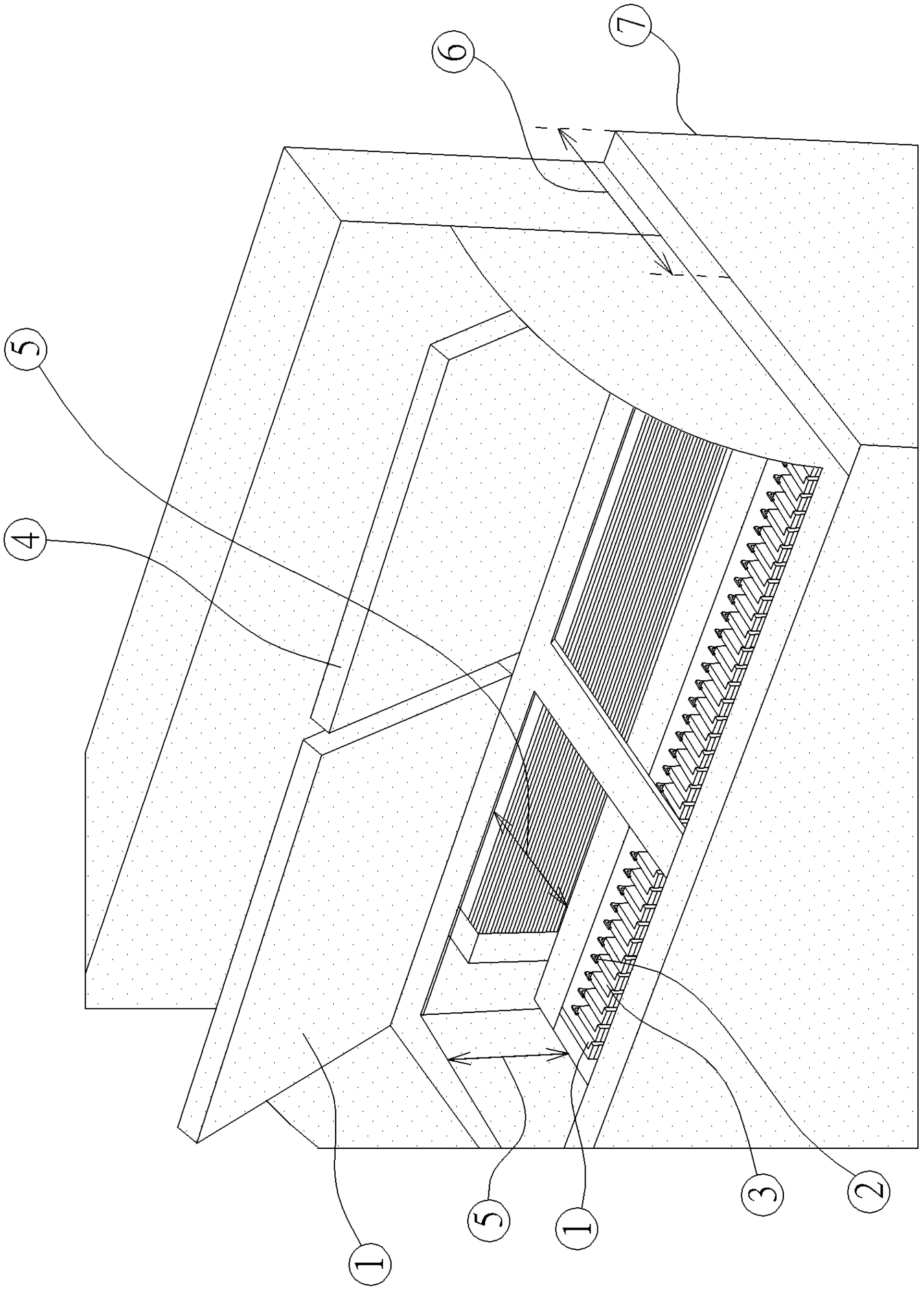
FIG. 25 Prior Art
FIG. 25 is a schematic diagram of a two-phase liquid immersion cooling (2P-LIC) system in the art.
Figure 26:
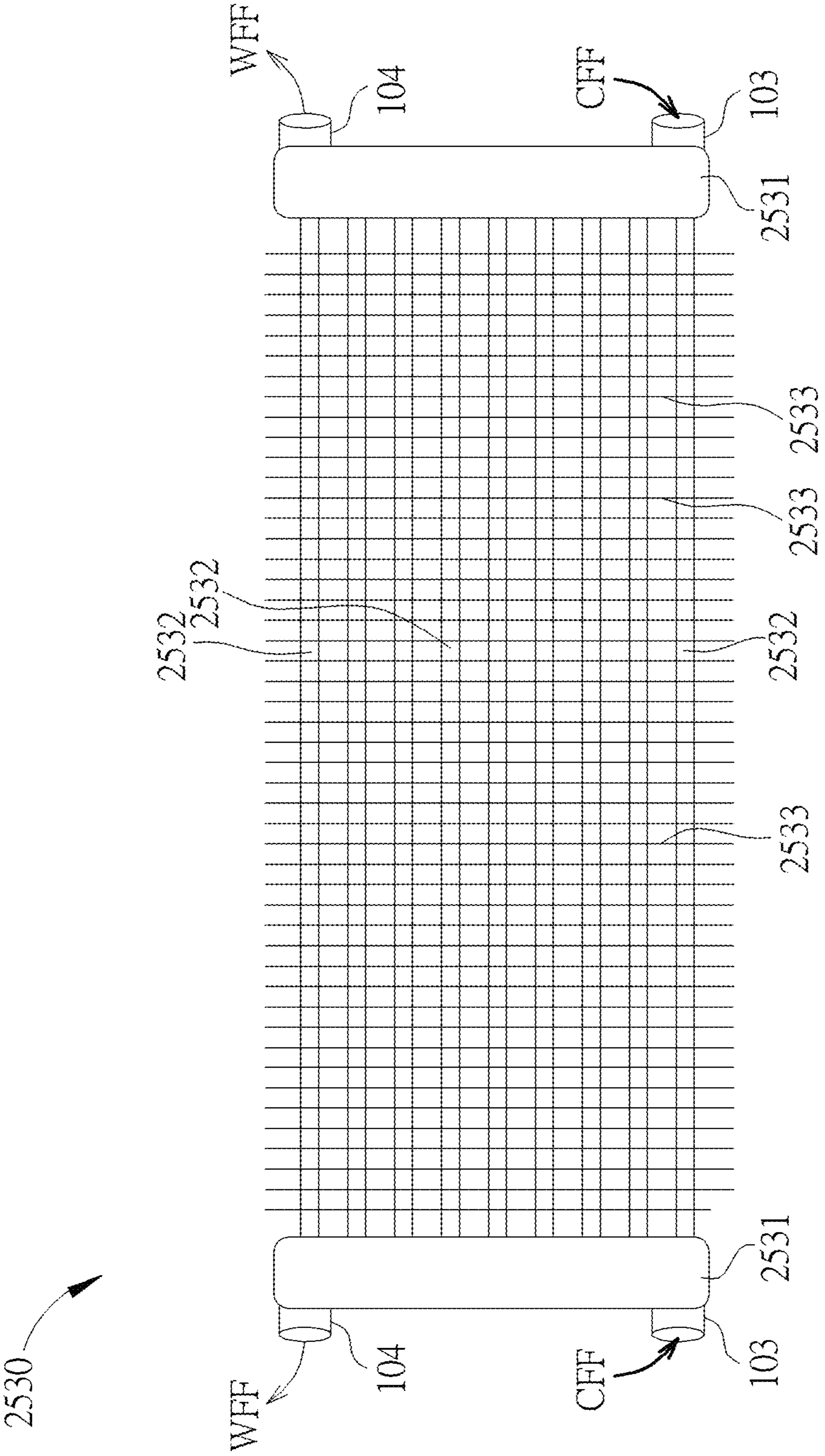
FIG. 26 PRIOR ART
FIG. 26 is a schematic diagram of a condenser system in the art.

Different from conventional 2P-LIC system, such as the one shown in FIG. 25 where the condenser 2530 may has a radiator-like structure as shown in FIG. 26 (cold/chilled facility fluid CFF enters end block 2531 via bottom port 103, warmed facility fluid WFF exits end blocks 2531 via top port 104, heat is exchanged with heat pipes 2532 and fins 2533) and the condensation happens on the exterior surfaces of fins 2533, in the present invention, cold facility fluid CFF enters via port 103, flows outside of the condensing channel 108, as indicated by 1033, exists from port 104, and the condensation happens on the interior surface of condensing channel (e.g., 108').

The change from the conventional 2P-LIC system's "passively waiting for vapor to diffuse or permeate across the condenser" to this invention's "actively pushing coolant vapor to pass through the condenser" leads to vastly higher maximum heat exchange rate and drastically smaller space required for the condensation function. Higher max heat exchange rate is critical in addressing the rapidly rising power consumption, and smaller space requirement ensures the heat-management solution is compact in size and highly effective in space.

In another perspective, the coolant chamber CSC may be regarded as comprising a vaporization space in which coolant is vaporized, the recycle-and-condense unit RCU or the condenser 108 may be regarded as comprising a condensation space in which coolant vapor is condensed into liquid coolant, the vaporization space and the condensation space are two isolated and enclosed spaces except connecting input/output port(s), and the vaporization space and the condensation space are separated from each other. Furthermore, the recycle-and-condense unit RCU comprising the condenser 108 and the coolant reservoir/tank 102 are disposed outside of the coolant chamber CSC or disposed outside of the vaporization space of the coolant chamber CSC.

In addition, airflow (carrying a mixture of air and coolant vapor) would be produced flowing from the vaporization space to the condensation space. In an embodiment, the airflow may be produced by blower 107. In another embodiment, the airflow may be produced by vapor pressure difference between a first higher vapor pressure in the vaporization space and a second lower vapor pressure in/after the condensation space (which will be detailed later).

Figure 4:
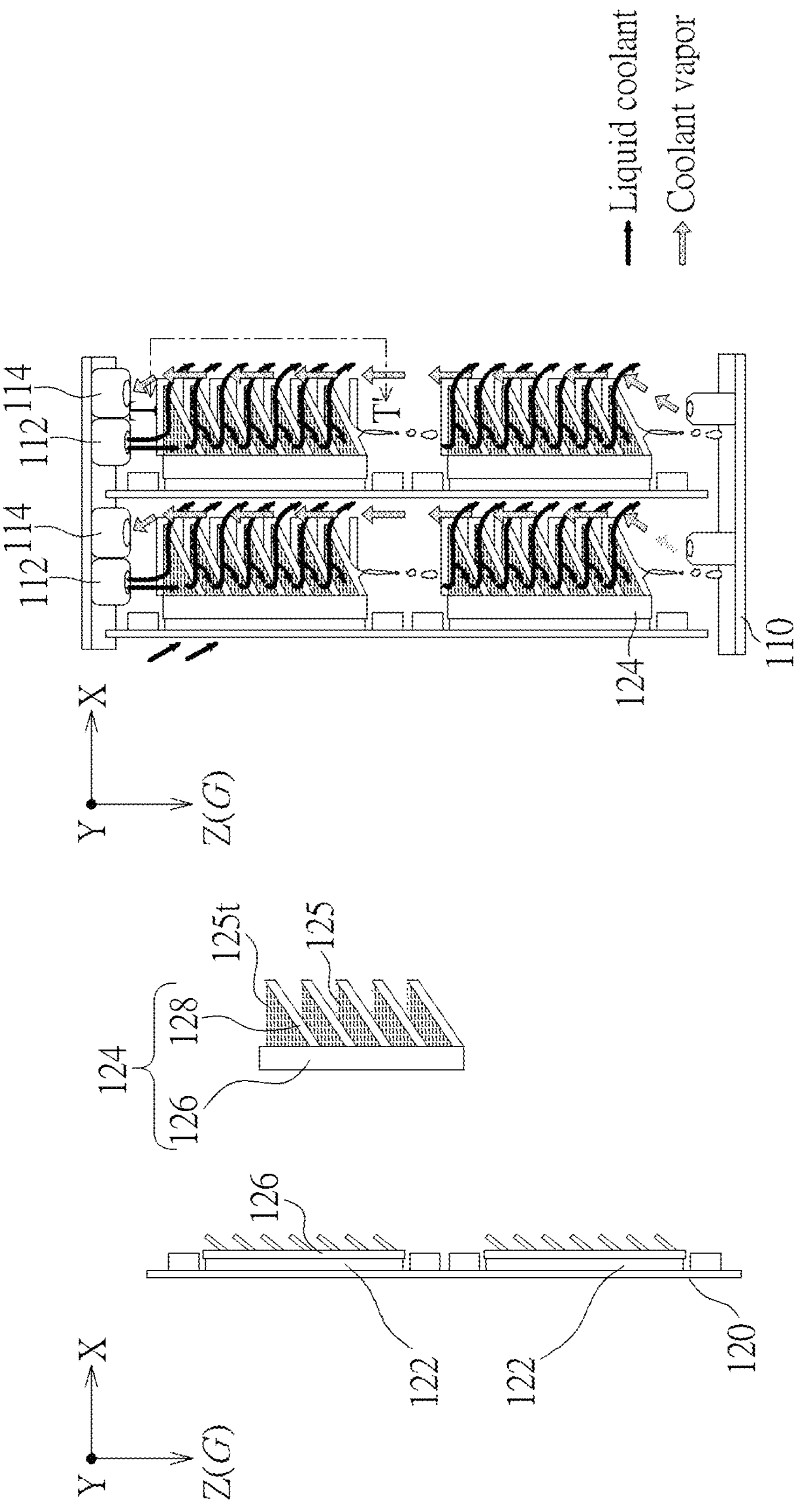
FIG. 4 is a schematic diagram of tilting fins according to an embodiment of the present invention.

The cooling system 10 comprises a plurality of heatsinks 124 disposed on the heat generating components 122. FIG. 4(*a*) illustrates a schematic diagram of the heatsink 124 according to an embodiment of the present invention. FIG. 4(*b*) is a diagram illustrating the flows of liquid coolant flowing through the heatsinks 124 and the flows of the coolant vapor flowing between circuit boards 120 according to an embodiment of the present invention.

The heatsink 124 comprises a (cold) plate 126 (optional) and a plurality of up-tilting fins 128 disposed on the cold plate 126. The plurality of tilting fins 128 tilts upward to the ceiling of the coolant chamber CSC. Furthermore, there are holes or gaps formed within or between the plurality of up-tilting fins 128 (will be detailed later). When the coolant is injected/showered from the top of the coolant chamber CSC, the coolant would first fill a space between a topmost up-tilting fin 128 and the cold plate 126 and flow downward over the tip of fin and through the holes/gaps formed within/between the topmost tilting fin 128. After filling the triangular pocket 125*t* formed by topmost fin 128, the coolant would fill a trapezoidal space 125, outlined between a first fin 128, a second fin 128 below the first fin 128, the horizontal line passing the tip of the second fin 128 and the cold plate 126, forming an ad hoc soaking pocket 125. After the first soaking pocket 125 is filled, coolant flow continues downward, over the tip and through the holes, gaps of the second fin 128, filling a second ad hoc soaking pocket 125 immediately below the first soaking pocket, and so on and so forth, as shown by FIG. 4(*b*). Eventually, the coolant will fill all soaking pockets 125 and the remaining (liquid) coolant will fall onto the bottom of the coolant chamber CSC and be collected by the liquid coolant collector 110.

From another perspective, one fin 128 or the plurality of fins 128 may be considered as a kind of pocket structure, where the pocket structure (e.g., the fin(s) 128) is formed on the side of the circuit board on which the heat generating component(s) 122 is disposed. The soaking pocket(s) 125, formed between the pocket structure and the circuit board, encompasses the heat generating component(s) 122.

As shown in FIG. 4(*a*), a plurality of coolant soaking pockets 125, the space between the cold plate 126 and the up-tilting fin 128 filled with the coolant in the embodiment shown in FIG. 4(*a*), is formed. The liquid coolant in the coolant pocket 125 has direct contact with (a portion of) surfaces of the cold plate 126 and the tilting fin 128 associated with the liquid coolant soaking pocket 125. In the embodiment shown in FIG. 4(*a*), the portion of surface of the cold plate 126 may be regarded as a heating surface associated with the heat generating component. In another embodiment, portions of surface of the cold plate 126 may be removed to allow direct contact between the silicon substrate underneath and the coolant flowing by. In either case, in the present invention, the heating surface associated with the heat generating component may generally be referred to a surface through which heat can be transferred from the heat generating component to coolant.

In the present invention, the heating surface associated with the heat generating component is soaked in the liquid coolant within the soaking pocket.

Furthermore, the liquid coolant within the liquid coolant soaking pockets 125 would continuously flow downward or toward the bottom while the cooling system 10 operates.

The "continuously flow downward" of coolant implies the existences of these soaking pockets are ad hoc, transitory, depending on continuously receiving coolant from above. The flow rate of coolant also affects the virtual immersion depth of D (in the direction of X, not G, see FIG. 16(*a*)). Slow coolant flow rate will diminish the value of D.

Note that, a convection of liquid coolant within the cooling system 10 is significantly enhanced, compared to the conventional liquid immersion cooling system, where in the conventional liquid immersion cooling system the liquid coolant almost remains static/stationary relative to the circuit boards 120 or the heat generating components 122. As known in the art, good liquid coolant convection would help a) release coolant vapor bubbles from heating surface, and b) dissipating heat generated by the heat generating component and thereby enhance a heat dissipation capacity and efficiency of the cooling system 10, compared to conventional cooling systems.

As shown in FIG. 4(*b*), during operation of system 10, streams of liquid coolant would be injected into the coolant chamber CSC through injector 112. These coolant streams will flow from top to bottom of the coolant chamber CSC. Some of the liquid coolant would accumulate or be collected in the successive layers of soaking pockets 125. The liquid coolant in the soaking pockets would be heated by the heat generating components and be vaporized as coolant vapor. Vapor produced by heat generating components 122 on one vertical oriented circuit board 120 will merge into one coolant vapor flow, passing through a space/channel between neighboring circuit boards.

Figure 5:
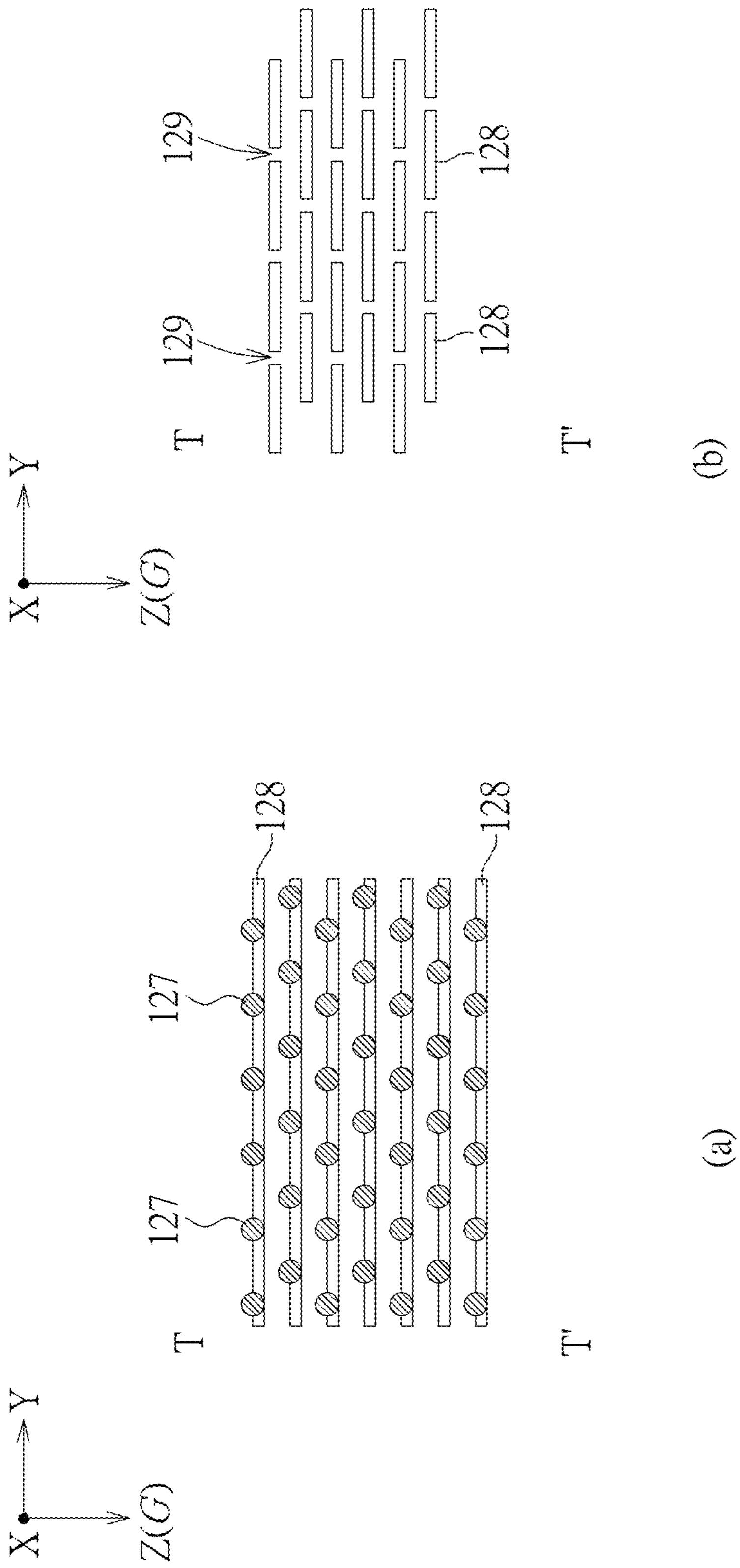
FIG. 5 is a schematic diagram of tilting fins according to an embodiment of the present invention.

FIG. 5 illustrates front/cross-sectional view (along T-T' line shown in FIG. 4(*b*)) of the plurality of tilting fins 128. In an embodiment, as shown in FIG. 5(*a*), holes 127 may be formed on the plurality of up-tilting fins 128. The liquid coolant flows downward through holes 127 due to gravity G. The holes 127 may be formed by CNC (Computer Numerical Control) drilling. To accommodate loss of liquid coolant to vaporization as it passes through heat generating components, and the resulting gradual reduction of the volume of coolant available to continue its flow downwards, the shape and dimensions of hole 127 may shrink from top to bottom to reduce the rate coolant flow gradually along direction of gravity G.

In another perspective, to enhance uniform distribution of coolant and direct contact between coolant and heating surfaces, the holes 127 and gaps 129 may be formed in an interleaved fashion over a set of tilting fins 128.

In an embodiment, as shown in FIG. 5(*b*), gaps 129 may be distributed between the tilting fins 128 in an interleaved fashion, allowing the liquid coolant to flow downward through the gaps 129 fluently and to spread evenly.

Figure 6:
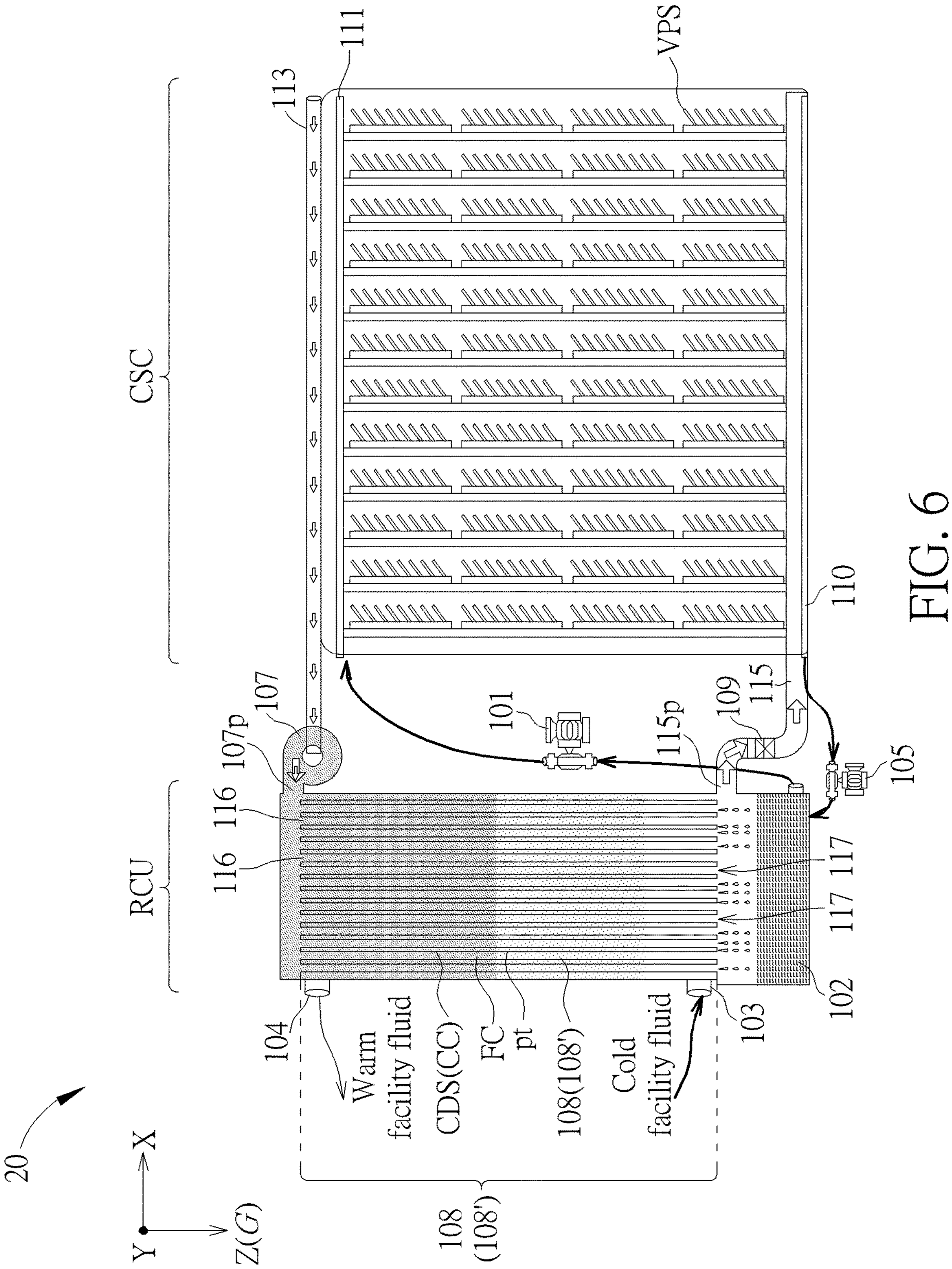
FIG. 6 is a schematic diagram of a cooling system according to an embodiment of the present invention.

FIG. 6 is a schematic diagram of a cooling system 20 according to an embodiment of the present invention. The cooling system 20 is similar to the cooling system 10, and thus, same components are denoted by the same notations. Slightly different from the cooling system 10, the condenser 108 is or comprises a modified plate heat exchanger (MPHE). Like a normal plate heat exchanger, MPHE comprises two sets of thin channels to accommodate two streams of opposing fluid flow. These two sets of channels may be formed between a stack of thin plates made of high thermal conductance material like stainless steel. These plates may further incorporate patterns, such as double fishbone, to enhance the heat exchange between the two opposing fluid flows.

The MPHE structure differs from normal plate heat exchanger in that the MPHE channel receiving the vapor-air flow (herein referred to as the first channel) is open at both its entry (openings 116 at the top of condenser 108) and its exit (openings 117 at the bottom of condenser 108), as illustrated in FIG. 6. During operation of RCU, two streams of fluid flowing in opposite directions will enter condenser 108, where a first stream of fluid of higher temperature, flowing in the first set of channels of condenser 108, rejects heat to a second stream of fluid of lower temperature, flowing in the second set of channels of condenser 108.

In system 20, the first higher temperature stream is the vapor-air mixture extracted from CSC. After this vapor-air stream is transported from the coolant chamber CSC to recycle condense unit RCU by blower 107, through port 107*p*, it enters the first set of channels in MPHE 108 via top openings 116, flows down MPHE by the force of blower 107 and the gravity G, toward bottom openings 117. By having ports/openings 117 fully open directly over tank 102, coolant condensates will fall freely into coolant tank 102.

In the case where blower 107 is employed to actively blow vapor-air mixture from CSC to RCU, there is a need for a return path from RCU back to CSC, so that vapor-air stream may exit the RCU via port 115*p* and return to CSC via return pipe 115. Port 115*p* may be located near the top of coolant tank 102, above the surface of coolant. Note that the desired pressure inside CSC, or VPS, may be different from the pressure in the space after condenser 108, or ACS, in coolant tank 102. Regulator 109 may be inserted into pipe 115 to provide a program-controllable flow resistance, which, when combined with flow rate control of blower 107, may achieve the desire pressures at both the RCU side and the CSC side.

In system 20, the second lower temperature stream is the facility fluid stream received by and return from the heat exchanger MPHE or the condenser 108. The condenser 108 receives cold facility fluid (e.g., source water) via a port 103 at the bottom, this cold facility fluid absorbs the heat rejected by the first higher-temperature vapor-air stream while traveling upward along the second set of channels, warming up gradually, and returns warm facility fluid via a port 104 at the top.

The condenser 108, functioning as a Multi-Plate Heat Exchanger (MPHE), comprises a plurality of plates (pt). Between the plates, condensing channels (CC) and facility channels (FC) are formed. The coolant vapor flows downward through the CC channels, while the facility fluid flows upward through the FC channels. Latent heat is subsequently transferred from the coolant vapor to the facility fluid via the plates (pt), thereby causing condensation of the vapor.

Note that, when comparing the operation of condenser 108 of system 20 against that of conventional 2P-LIC systems, such as the one shown in FIG. 25, both "the contact area between vapor-air mixture and facility fluid stream" and "the speed these two streams flow relative to each other" have both increased dramatically, indicating system 20 is capable of providing much higher heat exchange capacity (by larger contact area) at a far faster heat exchange rate (by higher relative flow rate). In addition, the space occupied by heat exchanged MPHE is drastically smaller compared to the 2P-LIC depicted in FIG. 25, meaning RCU of system 20 may require much smaller space to perform the same function as a conventional 2P-LIC system.

In addition, a tube 115 connecting (a bottom of) the condenser 108 and (a bottom of) the coolant chamber CSS is shown. Through tube 115, a mixture of residual vapor and air can be delivered/returned back to the bottom of coolant chamber CSC, creating an updraft within CSC to help sweeping the coolant vapor generated in CSC toward the vapor-air return channel 113 beneath the ceiling of CSC.

To maintain the pressure difference between CSC and RCU, a valve/regulator 109 may be disposed within the tube 115 to control a conduction status (flow resistance or open/close) associated with the tube 115.

In FIG. 6, VPS denotes "vaporization space" within the coolant chamber CSC and denotes the "condensation space" within the condenser 108.

Note that, in the cooling systems 10 and 20, the tiling fins and space between the tiling fins and the heating surface associated with the heat generating component are utilized to form the soaking packets, which is not limited thereto.

Figure 7:
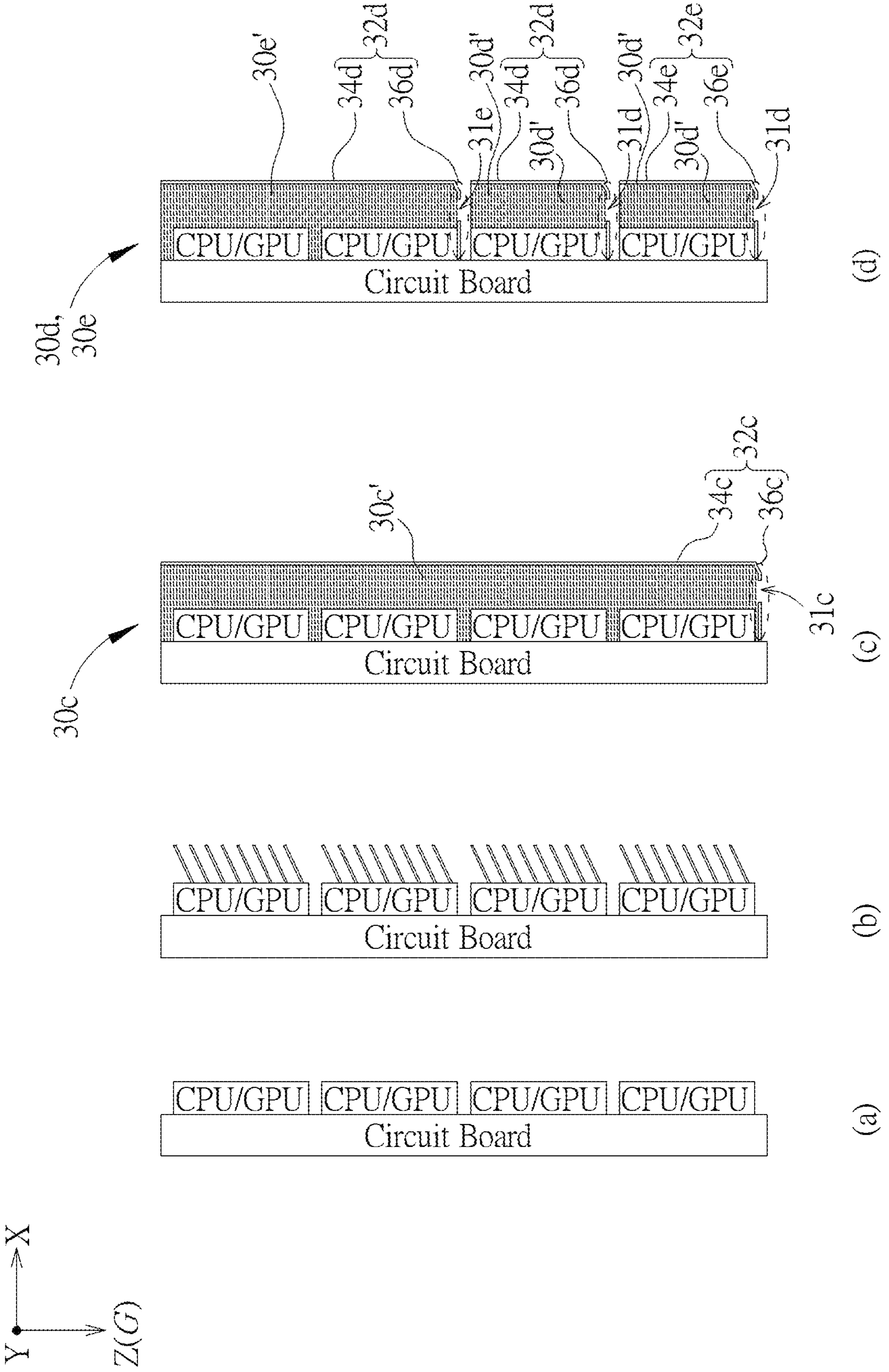
FIG. 7 illustrates schematic diagrams of soaking pockets according to an embodiment of the present invention.

FIG. 7 illustrates various embodiments of circuit board vertically disposed, with or without soaking pocket(s), of the present invention. FIG. 7(*a*) shows an embodiment of vertically disposed circuit board without soaking pocket. The circuit board with heat generating components (e.g. CPU/GPU) may be simply vertically disposed within the coolant chamber (e.g., CSC). Through the coolant showering on the heat generating components, heat generated by the heat generating components would be dissipated away so long as heating surfaces of heat generating components stay in direct contact with liquid coolant when the coolant flows from top to bottom.

FIG. 7(*b*)-7(*d*) illustrates various embodiments of circuit board with soaking pockets of the present invention. FIG. 7(*b*) illustrates an embodiment with up-tilting fins where virtual soaking pockets are formed ad-hoc by the up-tilting fins as shown/stated in the above.

FIG. 7(*c*)/7(*d*) illustrates soaking pocket 30*c*/30*d*/30*e* formed by/within casing 32*c*/32*d*/32*e* of the present invention. The casing 32*c*/32*d*/32*e* comprises a side wall 34*c*/34*d*/34*e*, and a bottom portion 36*c*/36*d*. The casing 32*c*/32*d*/32*e* and the circuit board forms a pocket (or a cavity/chamber) 30*c*'/30*d*'/30*e*'. The soaking pocket 30*c*/30*d*/30*e* is the pocket 30*c*'/30*d*'/30*e* filled with the liquid coolant. The heat generating component (CPU/GPU) is soaked in the liquid coolant within the soaking pocket 30*c*/30*d*/30*e*. In addition, a hole or slot 31*c*/31*d*/31*e* is formed within the bottom portion 36*c*/36*d*/36*e*. During the operation of the cooling system, the liquid coolant within the soaking pocket 30*c*/30*d*/30*e* flows downward via the hole 31*c*/31*d*/31*e* to soaking pockets subsequently below, e.g., 30*e*'⇒30*d*'(upper)⇒ 30*d*'(lower)⇒ . . . ⇒coolant collector 110 on the bottom of the coolant chamber CSC.

The soaking pocket may encompass all heat generating components on one circuit board (as shown by 30*c* in FIG. 7(*c*)) or encompass some or only one of the heat generating components on one circuit board (as shown by 30*e* and 30*d* in FIG. 7(*d*), respectively). All these cases are within the scope of the present invention.

Figure 8:
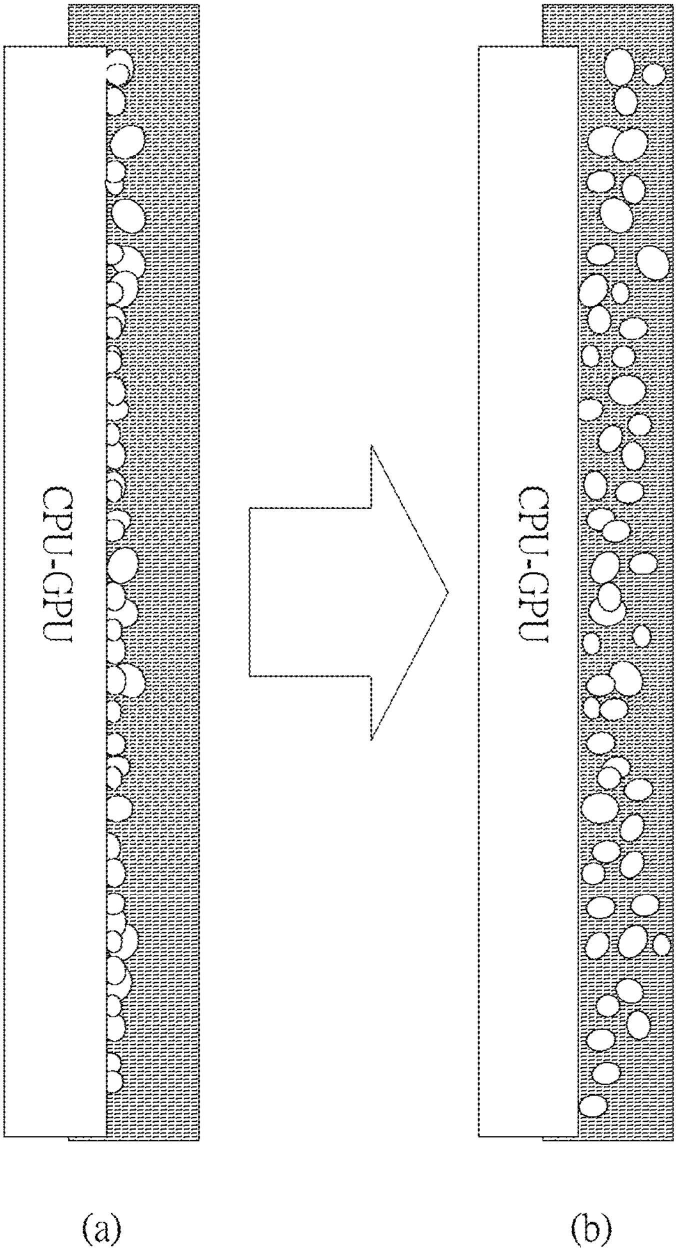
FIG. 8 illustrates schematic diagrams of heating surface and vapor bubbles of the present invention.

Note that, heat transfer efficiency of 2P-LIC system may be improved by minimizing the $A_V \times T_V$ product ($A_V$, $T_V$: the area and time heating surface is covered by vapor) of vapor covered surface VCS, and maximizing the $A_C \times T_C$ product ($A_C$, $T_C$: the area and time coolant contacts heating surface directly) of liquid coolant, as FIG. 8(*a*) shows.

When vapor bubbles adhere to and cover the heating surface, direct contact between coolant and heating surface is blocked, thermal resistance $R_H$ (from heat generating component to coolant) increases sharply, and heat transfer efficiency η (from heat generating component to coolant) degrades dramatically. By leaving the issue of vapor covered heating surface VCS unaddressed, conventional 2P-LIC systems leave a lot space uncovered in the journey to achieve the maximum potential of 2-phase cooling.

Before addressing this "vapor covered heating surface" issue, let's first study what happened: In any 2P-LIC cooling system, conventional or this invention, when liquid coolant first comes into contact with vertical oriented heating surface and vaporizes, the vapor will initially be locked/push against the heating surface by the combination of 4 forces: atmospheric pressure, adhesion of coolant to heating surface, surface tension of coolant, and immersion depth induced gravity. Vapor will gather and form tiny bubbles. Before these bubbles can break away from the heating surface, within the heating surface encircled by these bubbles, direct contact between coolant and heating surface is blocked, vaporization is stopped, and temperature of heating surfaces encircled by these bubbles rise above $T_{BP\_Coolant}$ locally. Concurrently, along the edges, or slightly outside, of these vapor bubbles'encirclements, vaporization by direct coolant contact continues, adding vapor to the encircling bubbles, causing the bubbles to grow. Since surface tension is inversely proportional to bubble diameter, as the bubbles grow larger, the adhesion force begins to overcome the surface tension, thereby causing the liquid coolant to penetrate beneath the bubbles, which results in the subsequent detachment (dislodgement or displacement) of the bubbles from the heat generating surface, re-establishing direct contact between the coolant and the heating surface.

One remedy for this vapor induced thermal (heat dissipation) roadblock is to perform vapor scrubbing and vapor purging within the soaking pocket(s). (Another remedy, using micro-surface-structure to create pattern of interleaved micro channels on heating surface, dedicated either to inbounding coolant flow, or to out-bounding vapor flow, will be detailed later.)

In the present invention, "vapor purging" refers to quickly sweeping away vapor bubbles from the soaking pocket while "vapor scrubbing" refers to rapidly and efficiently removing surface attached vapor bubbles from the heating surface. On one hand, "vapor scrubbing" maximizes the coolant to heating surface direct contact, or the $A_C \times T_C$ product, minimize thermal resistance $R_H$ from heating surface to coolant, thus firmly anchors the temperature of heating surface to liquid coolant's boiling point. On the other hand, "vapor purging" maximizes the supply of liquid coolant to the vicinity of heating surface to maximize the supply of fresh coolant and raise the limit of the amount of heat can be rejected by 2P-cooling.

In the present invention, the term "vapor purging" has been used under two different contexts. One refers to "vapor purging within the soaking pocket by liquid coolant" while the other one refers to "vapor purging for entire coolant chamber by air" during power down sequence (PDS). "Vapor purging for entire coolant chamber by air" will be examined in detail when discussing power-down sequence. In the coming paragraphs, "vapor purging" refers to "vapor purging by liquid coolant" associated with soaking pocket.

In an embodiment, vapor purging may be performed by creating moderate to fast liquid coolant movement relative to the heating surface in order to move the bubbles, once they are produced by the heating surface, quickly out of the soaking pocket.

One approach of vapor purging is self-reinforced coolant convection. (Self-)reinforced coolant convection is utilizing/reinforcing convention to establish or accelerate a liquid coolant flow to flush out vapor bubbles from the liquid coolant within soaking pockets. In addition, the faster movement of liquid coolants across the heating surface will also produce a scrubbing effect, i.e., the dislodging of vapor bubbles adhering to the heating surface will also be quickened.

In an embodiment, as shown in FIG. 4 and FIG. 16, heatsinks with the up-tiling fins with holes and gaps arrange in interleaved pattern may be attached to heating generating components. By gravity, liquid coolant will zig-zag across layers of fin, finding its way to the interleaved pathway to the next layer of fin below, causing movement against the surface of heat generating component, satisfying the objective of "creating a moderate liquid coolant movement relative to heating surface".

In addition, as shown in FIG. 16, vapor will be guided away from the heating surface by the down-point side of side up-tilting fins, furthering the objective of "move the bubble, once they are produced, quickly out of the soaking pocket".

In another embodiment, a partition (wall) may be included in the soaking pocket to create a first and second liquid coolant flows, and one of the liquid coolant flows may be used to accelerate a second coolant flow, where the second coolant flow is accelerated to flush out the bubbles more effectively.

Figure 9:
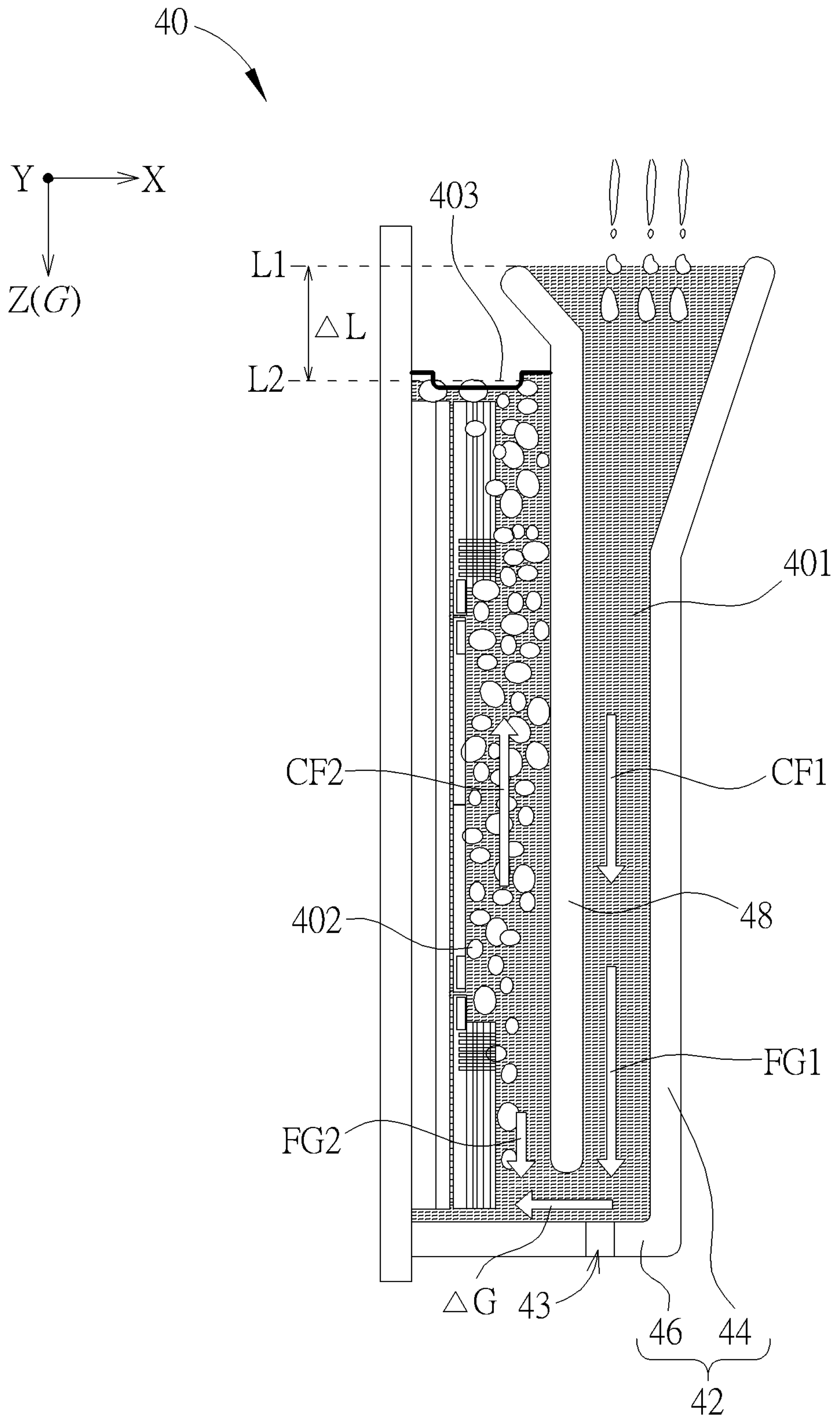
FIG. 9 is a schematic diagram of a soaking pocket according to an embodiment of the present invention.

FIG. 9 is a schematic diagram of a soaking pocket 40 according to an embodiment of the present invention. The soaking pocket 40 is formed by/within a casing 42, where the casing 42 comprises a vertical wall 44 and a bottom portion 46 with coolant release hole/slot 43. Different from the soaking pockets in FIG. 7, a vertical partition (wall) 48 is included to subdivide the volume within the soaking pocket 40 into two subspaces. Because of partition 48, a first coolant channel 401, in touch with vertical wall 44, and a second coolant channel 402, in touch with heating surface, are formed within the soaking pocket 40. The coolant flows in opposite direction in channel 401 and 402.

From another perspective, the casing 32*c*/32*d*/32*e*/42 may be considered as a kind of pocket structure, where the pocket structure (e.g., the casing 32*c*/32*d*/32*e*/42) is formed on the side of the circuit board on which the heat generating component(s) is disposed. The soaking pocket(s), formed between the pocket structure and the circuit board, encompasses the heat generating component(s).

Circulation within the soaking pocket 40 is established by two factors: 1) the height of 401 L1 is larger than height of 402 L2, as shown by ΔL in FIG. 9; and 2) gravity difference or density difference of coolant between the coolant in channels 401 and 402. Specifically, the heat generating component (e.g., high performance computing (HPC) GPU) is soaked within the coolant channel 402. Plenty of vapor bubbles are formed and floating within channel 402, but not within channel 401. As a result, effective density in the channel 402 would be significantly lower than channel 401, causing, a gravity force FG2 on channel 402 side of partition wall 48 that is significantly less than a gravity force FG1 on channel 401 side, creating a nonzero lateral force along bottom plane 46, pointing from channel 401 to channel 402, with a magnitude equals to gravity difference ΔG=FG1−FG2, pushing mostly clear (or some very tiny bubbles) liquid coolant from channel 401 to channel 402 causing a upward movement of coolant flow in channel 402, sweeping out newly generated vapor bubbles, bring these bubbles to the top surface of liquid coolant 403, where bubbles bursts and vapor is released.

In an embodiment, such as 40 in FIG. 9, the casing 42 may be shaped/designed such that nonzero level (channel length) difference ΔL exists between the channel 401 (L1) and 402 (L2), where ΔL=L1−L2>0, L1/L2 represents coolant overflow level for the channel 401/402. In the case of soaking pocket 40, both density difference and level/length difference contribute to gravity difference ΔG, reinforcing the liquid coolant circulation within the soaking pocket 40, which produces a first liquid coolant flow CF1 toward a first direction (downward) and a second liquid coolant flow CF2 toward a second direction (upward).

In an embodiment, a top portion of the first coolant channel 401 may be funnel-shaped, which introduces coolant mass/volume difference between the first channel 401 and the second channel 402 and contributes to gravity difference therebetween.

The discussion about FIG. 11 below borrows the numbering of FIG. 9.

In embodiments 11(*a*)-11(*d*) of FIG. 11, the outer walls 44 are straight, not funnel shaped, end caps (in the Y direction, not directly shown) are even, flush with wall 44, no notch, ΔL=0 between channel 401 and 402, and partition walls 48 submerge below coolant surface substantially when soaking pockets are filled to the brim. Note that, unlike embodiment 40 of FIG. 9, channel 401 is connected to channel 402 at both ends of partition wall 48 during operation (when soaking pocket is properly filled). This means coolant can flow in full cycle, enabling convection to occur within each pocket independently.

Figure 11:
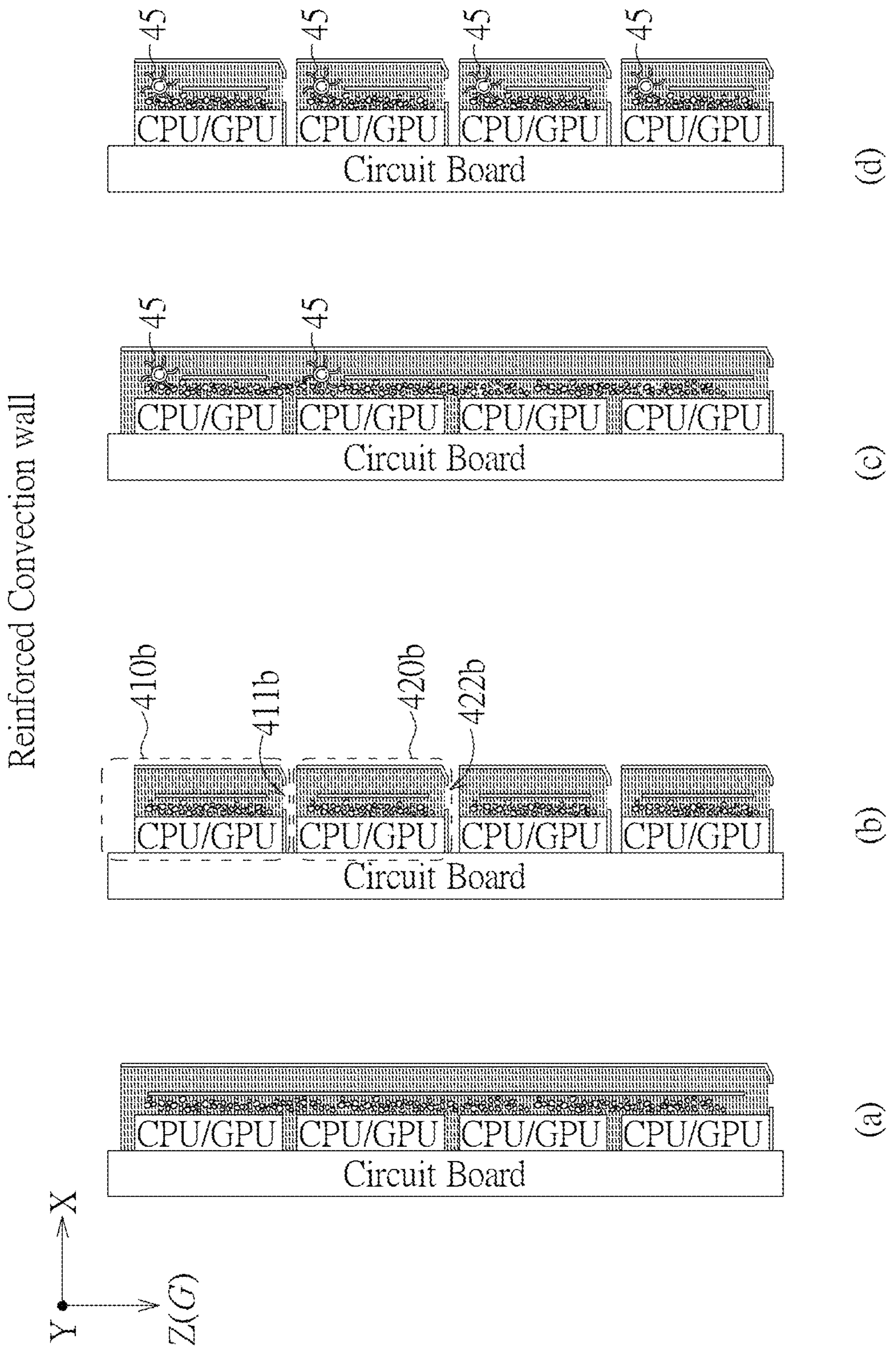
FIG. 11 illustrates schematic diagrams of convection walls in soaking pockets according to an embodiment of the present invention.

Note that, in embodiment 11(*a*)-11(*d*) of FIG. 11, strength/magnitude of the liquid coolant flow CF1/CF2 depends on the density difference, which in turn depends on volume density of vapor bubble in channel 402. When the workload of HPC GPU/CPU gets heavier, more heat is generated by the heat generating component, more vapor bubbles are generated within the channel 402, density will drop further, magnitude of ΔG increases, and the strength/magnitude of the liquid coolant flow (especially CF2) flushing out the vapor bubbles is increased. Hence, the entire vapor purging process becomes self-regulating or self-reinforced, ensuring that the vapor expulsion strength dynamically scales with the heat load within each soaking pocket in real time, thereby maintain the thermal stability of each soaking pocket independently.

Figure 10:
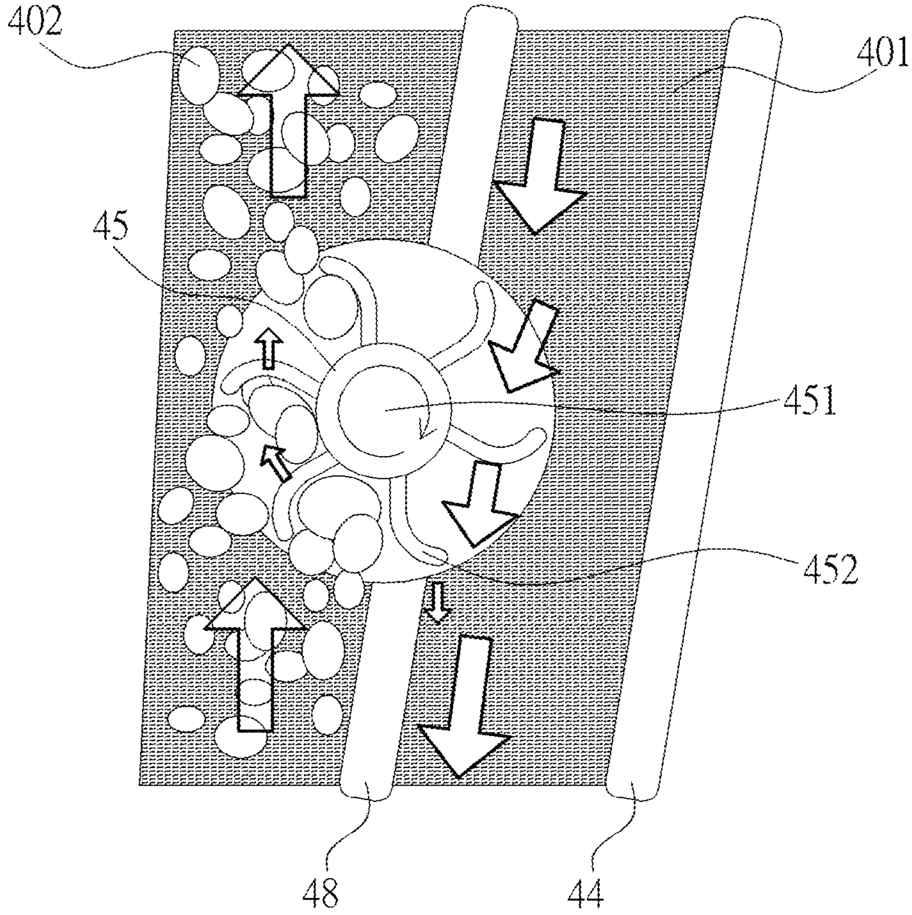
FIG. 10 is a schematic diagram of a rotating element according to an embodiment of the present invention.

Furthermore, a rotating element 45 (shown in FIG. 10) may be included and disposed between the first coolant channel 401 and the second coolant channel 402. The rotating element 45 comprises a hub 451 and blades 452 and performs a rotating movement. Blades 452 may be cupping hand shaped. When blade 452 enters the side of channel 402, their cupping hand shapes help blades 452 capture/gather the uprising bubbles, the upthrust (buoyant force) of these captured bubbles produce a torque, causing rotating element 45 to spin around hub 451. When blade 452 enters channel 402 side, a downthrust, equal in magnitude but opposite in direction to the upthrust, will be applied to the coolant flowing in channel 401. In other words, rotating element 45 turns a previously untapped force (upthrust from vapor bubbles in channel 402) into a force for accelerating coolant circulation (downthrust on coolant in channel 401), thereby further facilitating the virtuous self-reinforced convection and enhancing effects of both vapor purging and vapor scrubbing.

To perform the tasks optimally, tips of blade 452 would normally extend close to both the heating surfaces (to scoop up most rising vapor bubbles in channel 402) and the interior surface of wall 44 (to exert downthrust across the entire column of coolant in channel 401).

FIG. 11 illustrates various embodiments of soaking pockets with partition of the present invention. In an embodiment, the soaking pocket may encompass all or more than one heat generating components on the circuit board, as shown in FIGS. 11(*a*) and 11(*c*). In another embodiment, a plurality of soaking pockets may be formed on the circuit board, and one soaking pocket encompasses fewer heat generating components, as shown in FIGS. 11(*b*) and 11(*d*). In FIGS. 11(*b*) and 11(*d*), rotating elements 45 are also included to facilitate the convection.

For the embodiments of soaking pockets with partition, preferably, a (vertical) projection of an upper coolant release hole/slot 411*b* of an upper soaking pocket lies in the first coolant channel (the coolant channel between wall and partition) of a lower soaking pocket. For example, as shown in FIG. 11(*b*), a (vertical) projection of an upper coolant release hole 411*b* of an upper soaking pocket 410*b* lies in the first coolant channel of a lower soaking pocket 420*b*; and the coolant release hole 422*b* of soaking pocket 420*b* lies in the first coolant channel of its next lower soaking pocket, etc.

Furthermore, a vibrator 47 (shown in FIG. 12) may be included and disposed in the soaking pocket. The vibrator 47 configured to generate a liquid coolant disturbance to 1) create scrubbing movements along the heating surface to accelerate delodgement of vapor bubbles from the heating surface and maximize the coolant to heating surface direct contact product $A_C \times T_C$; 2) to break up large vapor bubbles into smaller ones and increase uniformity of liquid coolant density within channel 402.

Figure 12:
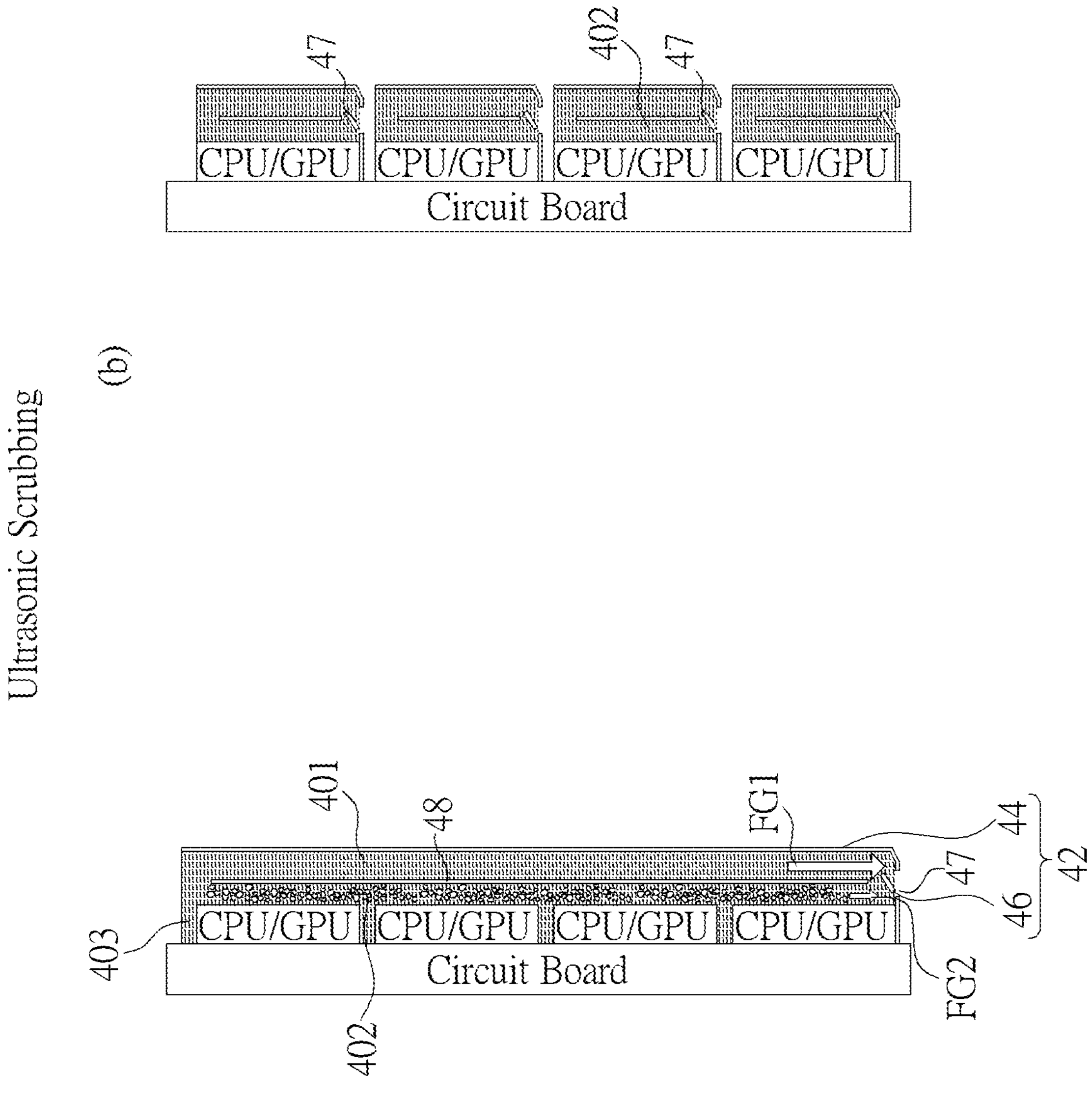
FIG. 12 illustrates schematic diagrams of convection walls in soaking pockets according to an embodiment of the present invention.

In the embodiment shown in FIG. 12, one or more vibrator 47 is disposed within soaking pocket and at least one vibration is disposed near the bottom of the soaking pocket, but not limited thereto. Moreover, at least one vibrator 47 is disposed in the coolant channel 402, with its primary beam of radiation encompasses the heat generating component(s).

In an embodiment, the vibrator 47 may vibrate to generate ultrasonic waves, to produce pressure and movement waves of liquid coolant along surfaces of immersed heat generating components, so as to scrub off coolant vapor bubbles from heating surfaces. Moreover, in an embodiment, the vibrator 47 may vibrate to establish a standing wave within the coolant channel (e.g., 402) or within the soaking pocket. In other words, it can be regarded that the vibrator 47 generates a liquid coolant wave corresponding to an ultrasonic frequency, and the liquid coolant disturbance comprises the liquid coolant wave. In yet another embodiment, vibrator 47 may vibrate to generate a multitude of standing waves in series, with changing durations, such that the nodes and antinodes of different standing waves cancel out one another in the time-average overall amplitude response, such that the overall amplitude response stays mostly flat across heating surface.

Rather than focusing on vapor removing/purging using convection or generating liquid coolant flow/disturbance, the real objective should be maximizing the coolant to heating surface contact. And one approach to achieve that objective is via Surface Treatment or surface microstructure. By appropriately designing geometric features and treating the characteristics of the heating surface, it is possible to increase both the wettability (direct contact of the heating surface with the liquid coolant) and the breathability (expedient removal of the coolant vapor after coolant vaporization) at the same time. To achieve the goals above, the surface microstructure should accomplish the following three activities simultaneously:

1) draw, smoothly & continuously, liquid coolant toward the plane of heat source (or bottom of the microstructure), e.g., by creating channels of relatively strong, or progressively stronger, capillary effect;
2) release, smoothly & continuously, coolant vapor away from the plane of heat source (or bottom of the microstructure), e.g., by creating areas or channels of very-weak (relative to #1 above) capillary effect; and
3) form stable lateral vapor travel channels, parallel to the plane of heat source, maintain the shape of these vapor travel channels to minimize disturbance of vapor flow.

The phase "smoothly & continuously" is a key. Unlike 2P-LIC with flat heating surfaces where the need to draw liquid coolant toward the heating surface and the need to send coolant vapor away from the heating surface would be random, erratic, and turbulent. Like a crowded train station during peak traffic hours, where one large group of riders want to get onto the trains and another large group of riders want to get off the trains. If the entire train has just one car, and all riders get on and off that one single car at the same time, without any organization or courtesy, then the process will be a total chaos, as water boiling in a pot would be. However, if train is divided into many shorter cars and people get on these cars from one end, get off from the other, then the process of boarding and deboarding the entire train will be completed promptly and smoothly, without much hassle, for all passengers.

Therefore, a successful embodiment to achieve the three 2P-LIC optimization stated previously (1. maximize coolant to heating surface contact; 2. speed up expelling vapor from vicinity of heating surface once it's generated; 3. Maximize coolant supply to heating surface) may produce three stable, densely populated, interweaved/interlocked patterns: a first pattern of areas of activity-1: draw coolant toward the heat source (getting onto the car); a second pattern of areas of activity-2: release/expel coolant vapor away from the heat source (getting off the car); a third pattern of areas of activity-3: links between action areas in the first pattern and the second pattern.

Figure 13:
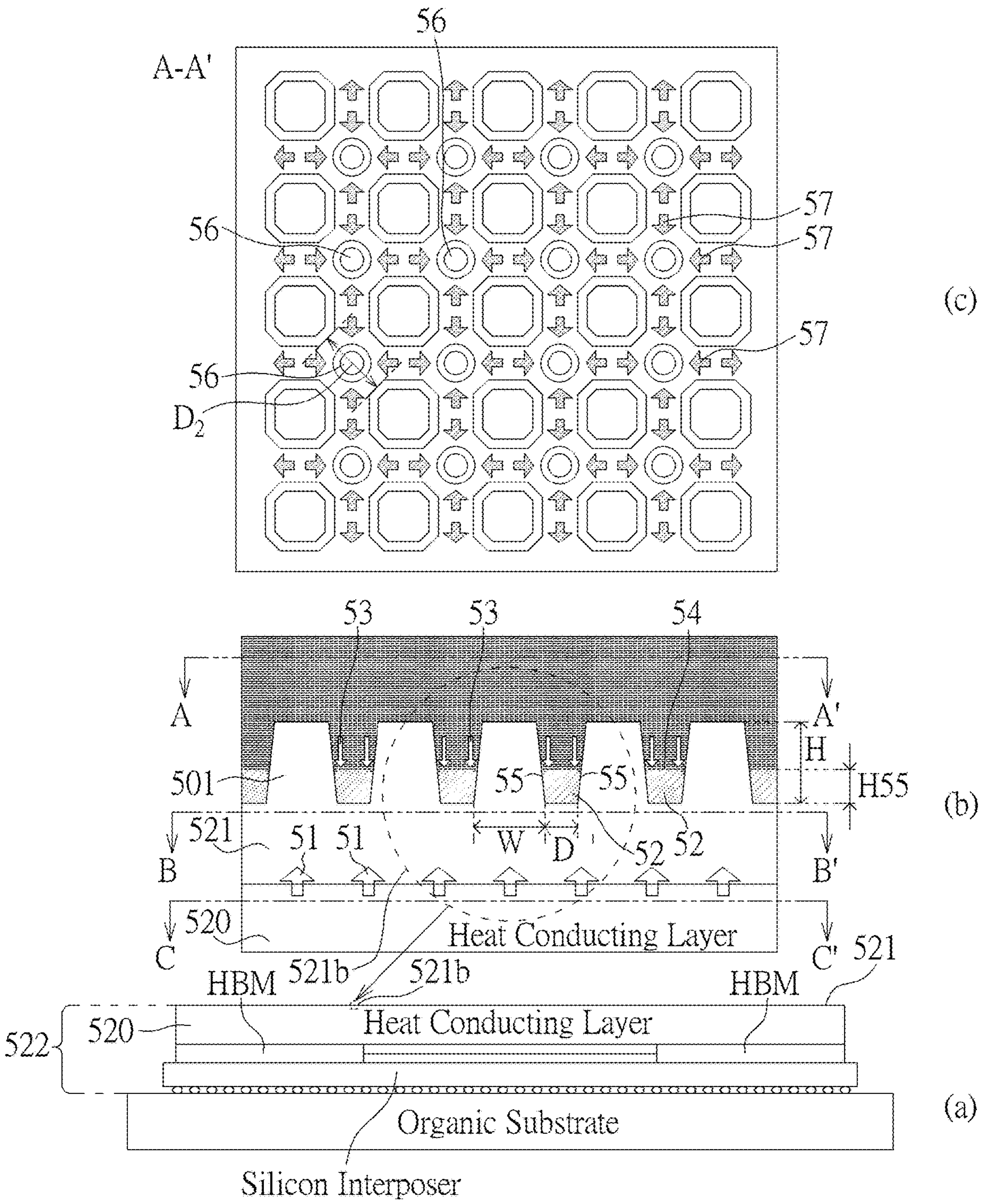
FIG. 13 illustrates schematic diagrams of heating surface or microstructure in soaking pockets according to an embodiment of the present invention.

FIG. 13 is a schematic diagram of an engineered heating surface 521 (e.g., created on the backside of a chip's silicon substrate (or generally on the backside of substrate of semiconductor device or heat generating components) according to an embodiment of the present invention. The heating surface 521, while sitting directly on heat conducting layer 520, would have direct contact with coolant. Specifically, FIG. 13(*a*) illustrates a cross-sectional view of a heat generating component 522, mounted on a PCB, FIG. 13(*b*) illustrates a detailed cross-sectional blowup view of spot 521*b* on the heating surface 521, and FIG. 13(*c*) illustrates a detailed top view of the same spot on the heating surface 521. In the present invention, notation "521" also refer to the microstructure formed on the heating surface of semiconductor or heat generating component.

In an embodiment, a heat conducting layer 520 may be the backside of silicon substrate of GPU-CPU die, with HBM and other dies mounted on the other (circuit/semiconductor device) side. The heating surface 521 may be fabricated, by techniques like epitaxy, ALD, CVD, epitaxy, DRIE etching, etc. directly on the surface of the heat conducting layer 520, as shown in FIG. 13(*b*).

The heat conducting layer 520 and the coolant-contacting heating surface/layer 521 may be made of material with high thermal conductivity. In an embodiment, the heat conducting layer 520 may be silicon substrate, and the heating surface 521 may be made of SiC (Silicon Carbide) or AlN (Aluminum Nitride, 140-320 W/m·K), which is not limited thereto. (For context, the thermal conductivity κ=150 W/m·K for Si; κ=140-320 W/m·K for AlN; κ=120-490 W/m·K for SiC.)

Figure 14:
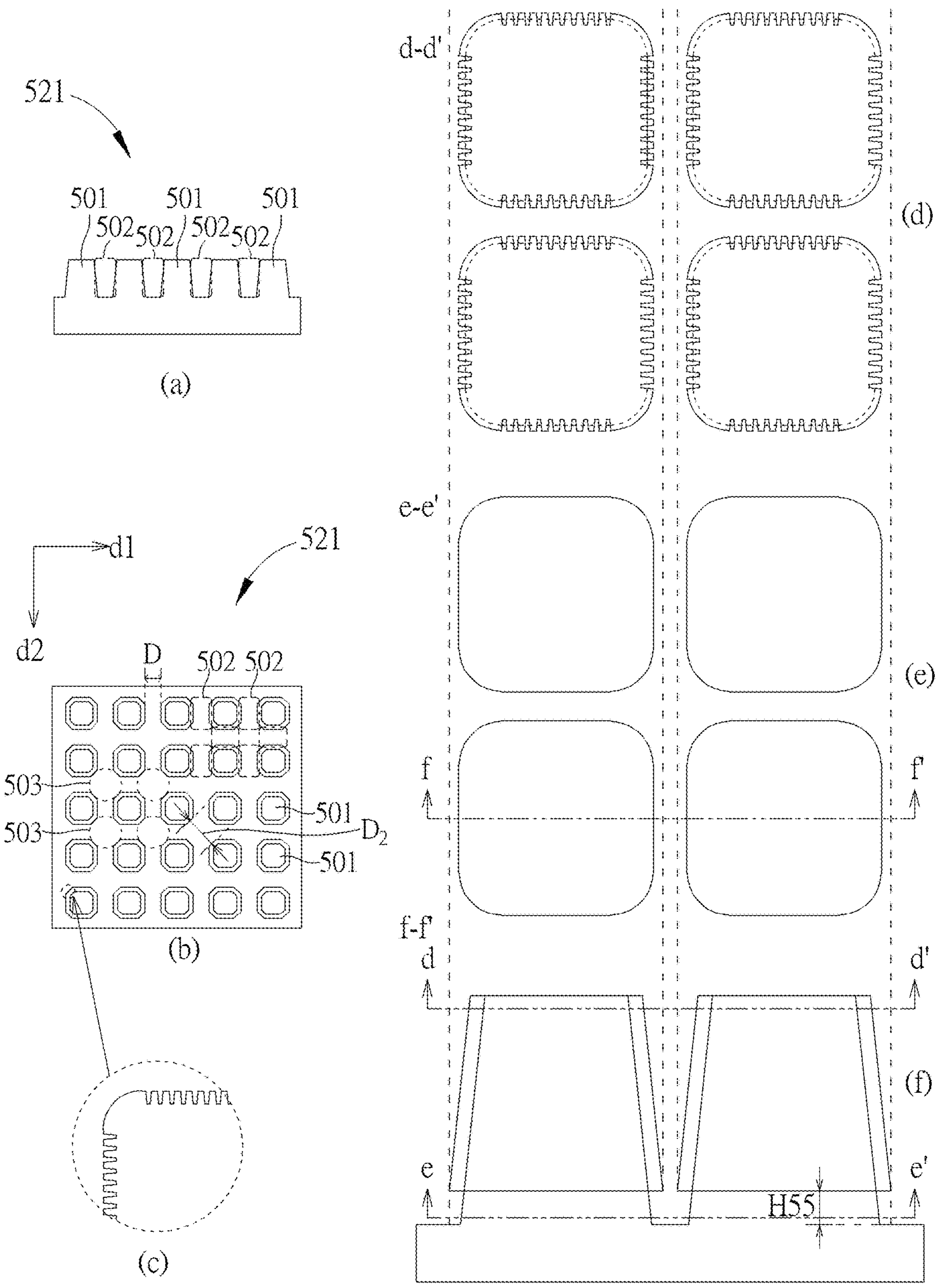
FIG. 14 illustrates schematic diagrams of heating surface or microstructure in soaking pockets according to an embodiment of the present invention.

The heating surface/layer 521 (due to the thinness of 521, "heating surface" and "heating layer" will be used interchangeably in the following discussion) comprises a fabric of microstructures made of a plurality of protrusions 501. FIG. 14(*a*) and FIG. 14(*b*) illustrate a cross-sectional view and a top view of the heating surface 521 and the protrusions 501 in detail. The protrusions 501 may be arranged as a 2D grid, like 13(*c*), 14(*b*), 15(*a*), or as an interleaved array, like 15(*b*). For the arrangement shown in FIG. 14, among adjacent protrusions 501, inter-protrusion gaps 502 and interstitial spaces 503 are formed therebetween. The inter-protrusion gap 502 of the present invention refers to a (narrow) gap between two adjacent protrusions, either in a first direction d1 or in a second direction d2 (in the embodiment shown in FIG. 14(*a*) and FIG. 14(*b*), where the protrusions 501 are arranged as a grid of rectangular/square protrusions with chamfered corners and tapered sides), shown as a corner-rounded rectangle with dashed line in FIG. 14(*b*). The interstitial space 503 is an open area that is bordered (or delineated) by four adjacent protrusions 501 in the array of protrusions, shown as a circle with dashed line in FIG. 14(*b*). The interstitial space 503 in FIG. 14 (corresponding to channels 56 in 13(*c*)) is positioned at the junction of the four protrusions 501, corresponding to the intersection between the volumes defined by the two inter-protrusion trenches, one in the d1 direction, the other in d2 direction. In other words, the interstitial space 503 is centrally located between four surrounding protrusions 501.

Note that, notation "502" in FIG. 14(*b*) is not only used to denote the inter-protrusion gap, notation "502" may also refer to (vapor moving) channels (similar to pathway 57 shown in FIG. 13(*c*)), through which coolant vapor is delivered to the interstitial spaces 503.

Preferably, the sidewalls of protrusion (e.g., 501) gradually tapers inward/backward from bottom to top, which can be seen from FIG. 13(*b*) and FIG. 14(*a*). This tapered walls means the inter-protrusion gaps 502 is getting narrower downward or toward the base of the protrusion 501, causing capillary action (interaction of adhesion and cohesion) to strengthen significantly toward the base of the protrusion 501, help pulling/attracting liquid coolant from beyond the tip of protrusions 501 to its base and to the heat conducting layer 520, where heat originates.

Preferably, the protrusion (e.g., 501) has a convex geometric shape at its four corners from a top view. For example, the protrusion 501 has an octagon shape from top view, where the octagonal protrusion 501 has four short sides facing four interstitial spaces 503 and four long sides facing four inter-protrusion gaps 502.

Furthermore, a first contact surface between the protrusions and the liquid coolant within the interstitial space (e.g., 503) is less (e.g., smaller area A, narrower width W, or both) than a second contact surface between the protrusions and the liquid coolant within the inter-protrusion gap (e.g., 502). In the embodiment with the octagonal protrusion (e.g., 501 of 14(*b*)), the first contact surface is associated with the short sides of the octagon and the second contact surface is associated with the long sides of the octagon. The first/second contact surface has an opposing contact surface across the interstitial space/inter-protrusion gap, and the distance between the first pair of contact surfaces is longer than the gap between the second pair of contact surfaces.

Since capillary force for narrow parallel plates is related/proportional to W/D, by finetuning the width W of different contact surfaces and the spacing D between different pairs of contact surfaces, the inter-protrusion capillary force (in 502*s*) can be made much stronger than interstitial capillary force (in 503*s*). This difference in capillary force, extending from the base to the tip of protrusion 501, can create two sets of interweaved micro channels, a first set of micro channels (arranged as first pattern or first array) with strong capillary force to draw liquid coolant toward heat conducting layer 520 (activity-1), and a second set of micro channels (arranged as second pattern or second array) with weak capillary force to release/expel coolant vapor away from heat conducting layer 520 (activity-2), where the first pattern/array and the second pattern/array are interwoven.

In a quick summary, by optimizing the geometries (spacing, area, tilting angle, nano grooves, etc.) and applying surface treatments (like various coating, surface polishing/roughing, etc.) to fine-tune the forces (capillary, adhesion, etc.) within these micro channels, two distinct fluids, liquid coolant and coolant vapor, can complete their respective objectives (entering vs. exiting) without fighting each other, much in the same way as the train boarding/deboarding analogy above.

A note about dimensions of these activity areas: given how small semiconductor circuits are nowadays, and how high the power density is rising, the pitch of those activity areas/dots in the first and second patterns may be 1-50 μM, and the height/depth of protrusion may be 5-100 μM but not limited thereto.

Now that we have a heating surface that can draw liquid coolant to, and release coolant vapor from, the heat conducting layer, we need a way to link these two activities to each other.

As indicated by block arrows in FIG. 13(*b*), the heat 51 originates in the heat conducting layer 520, it causes that temperature to be the highest at the base of the protrusions 501 and temperature falls along the height direction H as the heat is rejected to the coolant. Coolant vapor 52 would be generated when liquid coolant (which has been preheated to near $T_{BP\_Coolant}$ when going through the progressively narrowing channels defined by inter-protrusion gaps 502) comes in contact with protrusion 501 surface that is hotter than $T_{BP\_Coolant}$, shown as edge 55, at a distance H55 from the base (around the bottom of microstructure, where "around" means substantially underneath/below H55), in 13(*b*). Once vapor is generated, it is congregated/formed, by adhesion force (between liquid coolant and surface of protrusion 501) and surface tension (within the liquid coolant), into loaf-bread shaped vapor tunnel 52, atop/around the base of the protrusions 501 within the inter-protrusion gap 502. The location where the protrusion surface becomes hotter than $T_{BP\_Coolant}$, e.g., edge 55 at/with height H55 in 13(*b*), depends on the balance between three factors: the vapor pressure $P_{VPR}$ inside vapor tunnel 52, the adhesion or capillary force 53 and the resistance to vapor escaping from the second sets of micro channels, i.e., 56 in 13(*c*) or 503 in 14(*b*), which arises mainly from the capillary force within interstitial space 503.

The optimization of the microstructure geometry establishes a chain of beneficial thermal effects1. Specifically, a weaker capillary effect within the interstitial space 503 results in a lower vapor pressure ($P_{VPR}$) in the tunnel 52, which consequently lowers the vaporization edge 55. This action reduces the height H55, thereby establishing a higher temperature gradient $\Delta T/H55$, where $\Delta T = T_{520} - T_{BP\_Coolant}$, over the height H55, and ultimately leading to a higher heat transferring rate from the heat conducting layer 520 (at $T_{520}$ near 51) to the liquid coolant ($T_{BP\_Coolant}$ near edge 55).

In an ideal case, let's assume the resistance to vapor exiting micro channel 56 is zero, then vapor can exist with near no resistance, H55 can get really small, limited firstly by the thermal conductivity of heating layer 521 and conducting layer 520, and secondarily by the friction between vapor and the wall of tunnel 52, and thirdly by system's ability to supply abundant coolant speedily at a rate faster than the rate of coolant vaporizes.

In a nutshell, to maximize the gradient increase heat dissipation capacity, one of approach is to maximize the gradient ΔT/H55 by minimizing H55. Following previous discussions, there are two directions to minimize H55: a) maximize the capillary force within inter-protrusion gaps 502; and b) minimize the capillary effect within the interstitial space 503. However, lower capillary effect within interstitial space points to larger area per 503, but stronger capillary effect within inter-protrusion gaps points to smaller and denser packed protrusion 501. These two requirements conflict with each other, meaning an optimum point may be found by trading off one factor for another, indicating detailed modeling-simulations are required to optimize the design of micro surface on heating layer 521.

Other than minimizing H55, as discussed above, there is another angle to maximize the heat dissipation capacity of heating surface 521. Note that, in 2P-LIC system, due to the jump in T-S graph (temperature-entropy diagram) at boiling point, the only place where coolant vaporization really happens is along the edge 55, the location where surface temperature of protrusion 501 equals $T_{BP\_Coolant}$. That means, disregarding how many protrusions there are or how large each protrusion 501 is, all those surfaces serve only auxiliary functions, and the only part of the entire protrusion array that is doing the real "vaporization" work are those "edge 55". Therefore, an important metric to optimize will be "vaporization edge length density", i.e., "total length (mm) of edge 55 per $mm^2$ of heat conducting layer".

For flat surfaced protrusion 501, the criterium above points to "protrusions of smaller cross-sectional surface, packed densely", the same direction as maximizing capillary effect within inter-protrusion gaps points to. Which means, for flat surfaced protrusion 501, "protrusions of smaller cross-sectional surface, packed densely" may be a highly favored direction for searching optimal configurations.

Instead of flat surface, nano serrated grooves/structures, as shown in top-view 14(*c*), having pitch in 10-100 nm range, running from the tip of protrusion 501 to the base, may be etched onto the sides of protrusion 501 to further enhance capillary force. Or, alternatively, the bottom 5-25% of the protrusion may be left bare, without groove, as shown in top views d-d' in 14(*d*), e-e' in 14(*e*) and cross-sectional view f-f' 14(*f*), so that the bottom portion is optimized for lateral vapor traveling, rather than vaporization.

By sharply increasing capillary force using nano serrated grooves or serrated structures (as shown in FIG. 14(*c*) and FIG. 14(*d*), the ability to draw liquid coolant from protrusion's tip to its base will increase sharply, leading to greatly enhanced wettability of protrusion 501. Note, at the corner of 14(*c*), instead of nano-grooves, the surface is rounded, so as to suppress the capillary effect in the interstitial space, further differentiating the first set of micro channels from the second set of micro channels. In addition, nano-grooves are definitely going to increase the "total length (mm) of edge 55 per $mm^2$ of heat conducting layer" mentioned above.

When under the stable/balance state as described above, protrusion 501's surface around the edge 55 between vapor occupied space and liquid coolant will have temperature close to coolant's boiling point, surface below edge 55 (toward/include the base) will be hotter than coolant's boiling point while surface above edge 55 (toward/include the tip) will be colder than coolant's boiling point.

Furthermore, unlike the situation where heating surface is featureless and flat, the vapor no longer needs to fight to dig open a new pathway every time it needs to dislodge itself from the confinement of adhesion and surface tension. Instead, different pathways (57 for lateral/sideway vapor flows, 56 for perpendicular vapor flows) are prearranged in microstructure and surface features of 521 explicitly. This holistic design approach yields significant improvements by avoiding or minimizing wasteful cross-interferences between the incoming liquid coolant and the outgoing coolant vapor. This effectiveness speeds up the flow rates of both fluids (liquid coolant and coolant vapor), resulting in a much higher heat handling capacity per unit area.

Furthermore, cohesion or surface tension 54 of liquid coolant would force coolant vapor 52 to move sideways at pathway/directions 57 towards area 56 shown in 13(*c*), or equivalently, toward the interstitial spaces 503 shown in 14(*b*). Since distance D2 (diameter of the interstitial space 503) is larger than distance D of the inter-protrusion gap 502 and the first contact surface within the interstitial space 503 is significantly smaller/narrower than the second contact surface within the inter-protrusion gap 502, adhesion within the interstitial space 503 is much weaken and thus coolant vapor bubbles drift out from the interstitial space.

Figure 15:
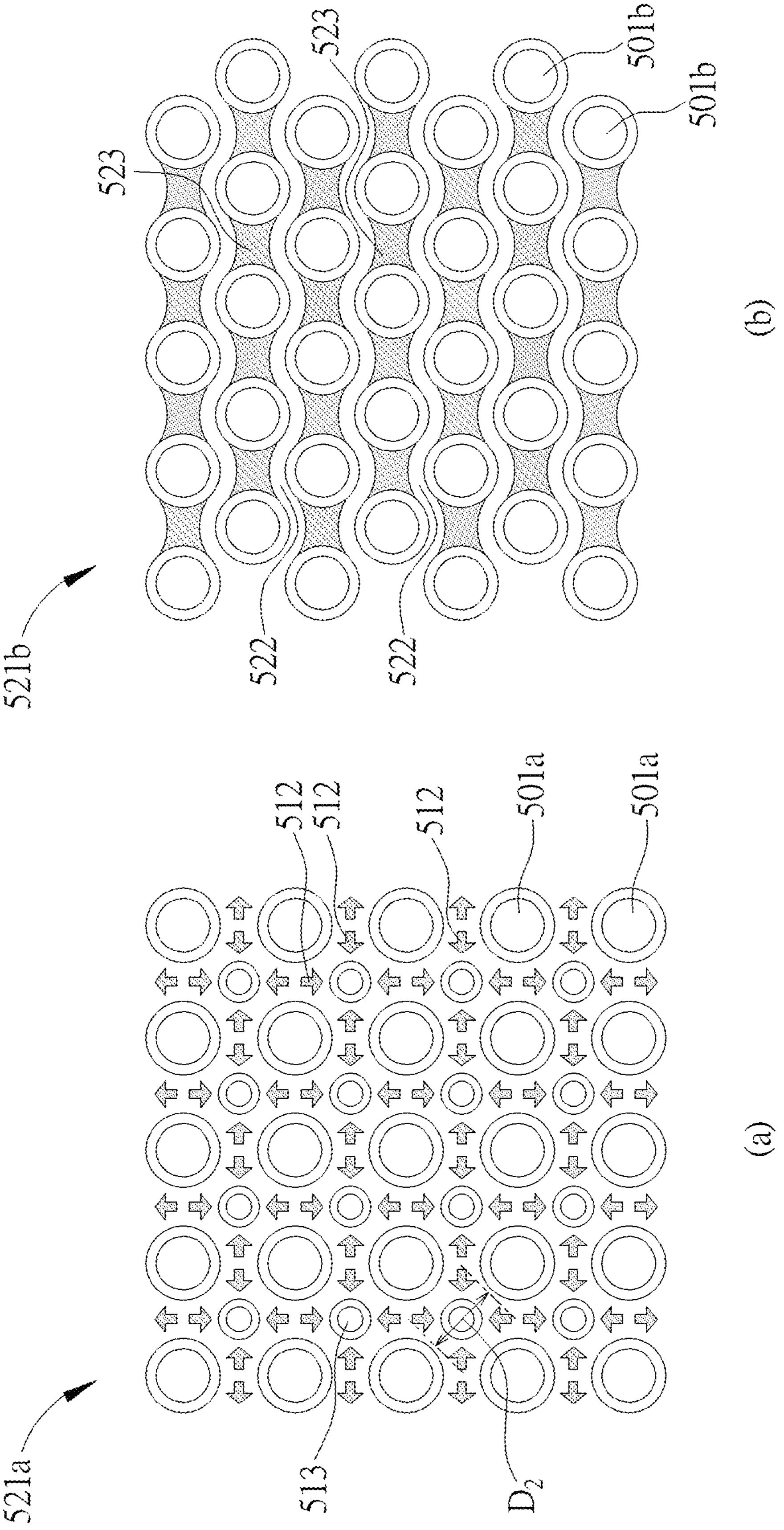
FIG. 15 illustrates schematic diagrams of heating surface or microstructure in soaking pockets according to an embodiment of the present invention.

FIG. 15 illustrates alternate embodiments of heating surfaces (in top view), 521*a* and 521*b*, of the present invention. In FIG. 15(*a*), the heating surface 521 *a* is similar to the heating surface 521. Protrusions 501*a* form a rectangular/square array. Inter-protrusion gaps 512 and interstitial spaces 513 lie within the protrusion array. Different from the heating surface 521, protrusions 501*a* have circular shape from a top view, which is also convex.

In FIG. 15(*b*), different from the array shown in FIG. 15(*a*), protrusions 501*b* in FIG. 15(*b*) form an oblique-and-staggered array. Similarly, inter-protrusion gaps 522 and interstitial spaces 523 lie within the oblique-and-staggered array, which is also within the scope of the present invention.

Figure 27:
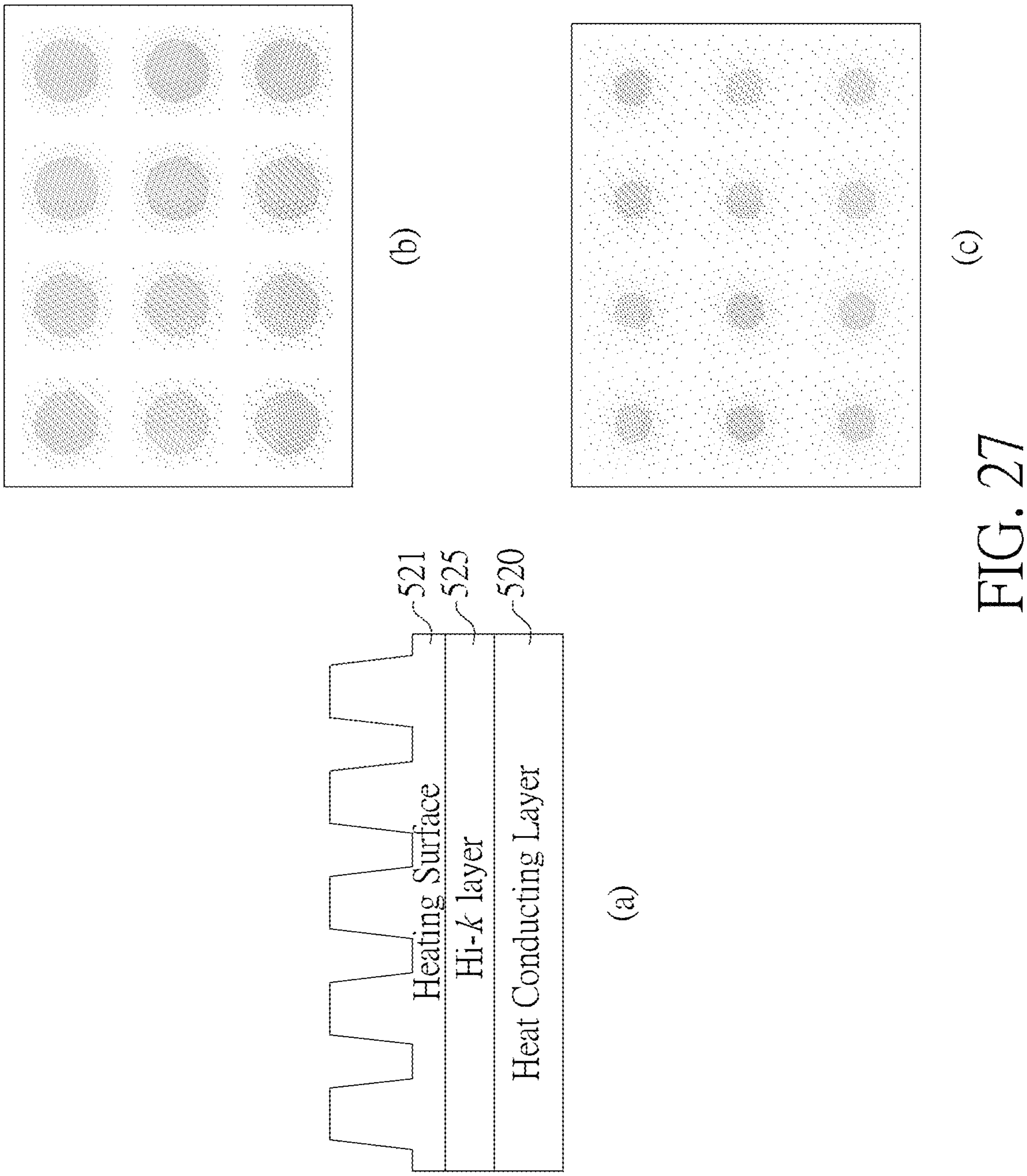
FIG. 27 illustrates schematic diagrams of heating surface or microstructure in soaking pockets according to an embodiment of the present invention.

After heating surface is optimized with approaches introduced in this invention, H55 can become very small. Due to the limited thermal conductivity of heating layer/surface 521, an image of edge 55 will be projected through the heating layer 521 down to heat conducting layer 520 below. In FIGS. 27(*b*) and 27(*c*), top view temperature profiles across cross-section B-B' and C-C' of 13(*b*) are shown, about ⅕ the protrusion pitch below the plane of protrusion base and plane of 520-521 bounding respectively. Darker means higher temperature. These temperature profile points out one weakness of configurations such as those shown in FIGS. 13-15, which is, due to limited thermal conductivity, heating surface 521, of single material, need to resort to increase of thickness to spread heat evenly across its interface with heat conducting layer 520. And the unevenness increases with the pitch of protrusion, i.e., for a given density of protrusion, increase the ratio of "the thickness of 521 base over the pitch of protrusion 501" improves the evenness, and vice versa. However, thicker 521 base means higher $R_H$, making this "thicken the base of 521" a suboptimal solution at best.

In cross-section view shown in FIG. 27(*a*), an addition High-κ Layer 525 is shown to be inserted between Heat Conducting Layer 520 and Heating Surface 521 where layer 525 may be made of material or structure having much higher conductivity (κ) than material of Heating Surface 521. In an embodiment, Layer 525 is a micro vapor chamber where a coolant operates at due/boiling points 1-5° C. higher than the coolant circulating outside of protrusion 501, spreading unevenly distributed heat from the Heating Surface 521 to an evenly distributed one to Heat Conducting Layer 520. In another embodiment, Layer 525 is a layer of synthetic diamond, whose κ is about 7-15× higher than AlN, SiC, for example.

One headwind to adding Layer 525 is obviously cost, other factors of concern include material compatibility, difficulties in manufacturing, etc. Although, adding Layer 525 will be neither cheap nor easy, the inclusion of a High-κ Layer 525 to even out the heat distribution from Heating Surface to Heat Conducting Layer can significantly improve their heat dissipation capacity and have a rightful place along the path of evolution of technologies from this patent.

In FIG. 16, vapor purging by liquid coolant may be realized by the bottom surfaces of the up-tilting heat sink fins and the interleaved gaps and holes formed on the heat sink with up-tilting fins. FIG. 16(*a*) illustrates a cross-sectional view and FIG. 16(*b*) illustrates a frontal view of a heat sink 224 comprising up-tilting fins 201 and 202 with a tilt angle θ. The tilting fins 201 and 202 may be metallic or plastic, e.g. Aluminum, Nylon. The tilting fins 201 and 202 may be capped at their two ends (in Y direction, not shown in FIG. 16) to retain coolant within the soaking pocket. The tilting fins 201 and 202 may have holes 204 formed thereon, and the holes 204 on the tilting fins 201 and 202 are arranged in an interleaving pattern/manner. Interleaving hole pattern/manner generally refers that vertical projections of the holes 204 on the tilting fin 201 would not overlap with vertical projections of the holes 204 on the tilting fin 202.

As liquid coolant fills the pockets between fins, vapor bubbles would be guided away from substrate by the bottom surface of the tilting fins above. Instead of floating across the heating surface to get back to the top of soaking pockets, the vapor is scooped away (i.e., removed/purged) immediately, as indicated by pointers 125, after vapor bubbles are generated. Due to the interleaving pattern, coolant flow may be formed both in horizontal/Y direction as coolant flow 206 and in vertical/Z direction 207, which would enhance liquid coolant flow and sweep across vapor generating surface, enhancing vapor purging in the soaking pocket.

In addition, gaps 203, formed between the tilting fin and the heating surface associated with the circuit board and at a bottom of the soaking pocket, may be added to enhance coolant flow. That is, the liquid coolant may flow downward through the heating surface via the gap 203, and the downward liquid coolant flow may flush out vapor bubbles formed on the heating surface.

In the embodiment shown in FIG. 16, the heating surface is a surface of Silicon substrate (with function similar to heat conducting layer 520, where the contact layer 521 may be also included), having direct contact with liquid coolant.

Back to FIG. 6, a key enabling the cooling operation of the cooling system (e.g., 20) is that the airflow (flow of vapor-air mixture) produced from the coolant chamber CSC to coolant tank goes through the condenser 108. In the embodiment shown in FIG. 6, the airflow is produced by the blower 107 and can be controlled by the blower 107. The airflow produced is adjustable, so as to adjust an air pressure within the condenser or a dew point of the coolant vapor within the condenser 108. Specifically, the airflow may be controlled by the blower 107 to adjust an air pressure within the condenser 108 or to adjust a dew point of the coolant vapor within the condenser 108. When the air pressure within the condenser 108 is adjusted to be higher/lower, the dew point of the coolant vapor within the condenser 108 would be increased/decrease as well. And higher dew point would facilitate condensation within the condenser 108, and blower 107 may be controller to raise the pressure within condenser 108 to be higher than atmosphere air pressure, e.g., 1.1 ATM.

In addition, the cooling system 20 may comprise the regulator 109, connected between the condenser 108 and the coolant chamber CSC. The blower 107 and the regulator 109 may work together to determine the air pressure within the condenser 108 and thus to determine the dew point of the coolant vapor.

In an embodiment, at the inlet of condenser 108 where partial pressure of vapor $P_{VPR}$ is at its highest, the dew point may be raised 2-6° C. by increasing the air-vapor pressure across the condenser 108 by 6-22 kPa (kilopascal), utilizing the blower 107.

In an embodiment, at the outlet of condenser 108 where partial pressure of vapor $P_{VPR}$ is at its lowest, the blower 107 and the regulator 109 can be controlled such that $T_{out} \leq T_{DP} - k$, where k=3-10° C., $T_{out}$ and $T_{DP}$ represent temperature of airflow at condenser output (e.g., temperature between condenser 108 and regulator 109) and temperature of vapor's dew point at 1 ATM.

Note that, raising the coolant vapor dew point enhances the ease of condensation in the condenser 108, which potentially allows for the use of warmer source water (e.g., 40° C.) without a need for a chiller. In other words, by properly designing or adjusting the blower 107 (and the regulator 109), an expense/expenditure of chiller (or even CDU, Coolant Distribution Unit) may be spared.

In short, the blower 107 and the regulator 109 are controlled to adjust the air pressure within the condenser 108 or to adjust the dew point of the coolant vapor within the condenser according to the temperature of the facility fluid received by the condenser 108.

So far, cooling system with single blower is introduced, which is not limited thereto. Cooling system with multiple blowers may be also within the scope of the present invention.

Figure 17:
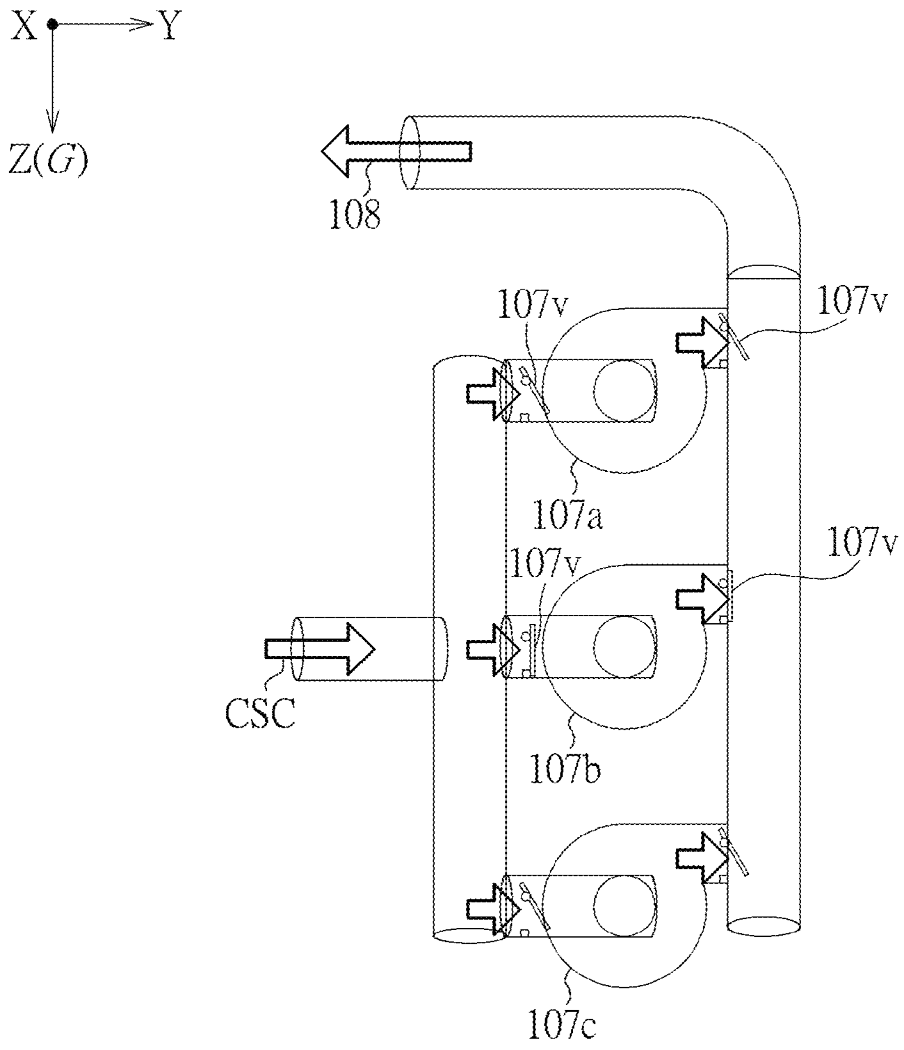
FIG. 17 is a schematic diagram of multiple blowers according to an embodiment of the present invention.

FIG. 17 illustrates a triple-redundant multi-blower scheme as an embodiment of the present invention. The cooling system of the present invention may comprise multiple blowers, e.g., 107*a*, 107*b*, and 107*c*. Valve(s) 107*v* is included and disposed either on an inlet of the blower connected to the coolant chamber CSC or on an outlet of the blower connected to the condense 108.

In an embodiment, the multiple blowers may be hot-swappable. Suppose all blowers are activated. When one of the multiple blowers is weakened or malfunctioned (or when a strength of the airflow flowing therethrough is too weak (or less than a threshold)), the corresponding valve 107*v* may be closed, because of the gravity and/or insufficient pressure difference between two sides of the valve 107*v*. The valve 107*v* may generate an indication signal in response to the valve being closed. That blower in question can be taken out and replaced by a new unit, while the remaining blowers continue to operate.

In an embodiment, some of the blowers may be active and some of the blowers may be reserved as "backup" by staying idle while in normal operation. When one of the active blower(s) is detected to have "malfunctioned" or "weakened", the backup blower will be powered-up and takes over the role of being the "active" blower.

Note that, in the cooling system (e.g., 20) shown in FIG. 6, the airflow from the coolant chamber CSC to the condenser 108 relies on the blower 107, which is not limited thereto. The airflow from the coolant chamber CSC to the condenser 108 may be produced naturally by the vapor pressure difference between the coolant chamber CSC and the space between condenser 108 output and surface of liquid coolant in tank 102, without utilizing the blower 107.

Figure 18:
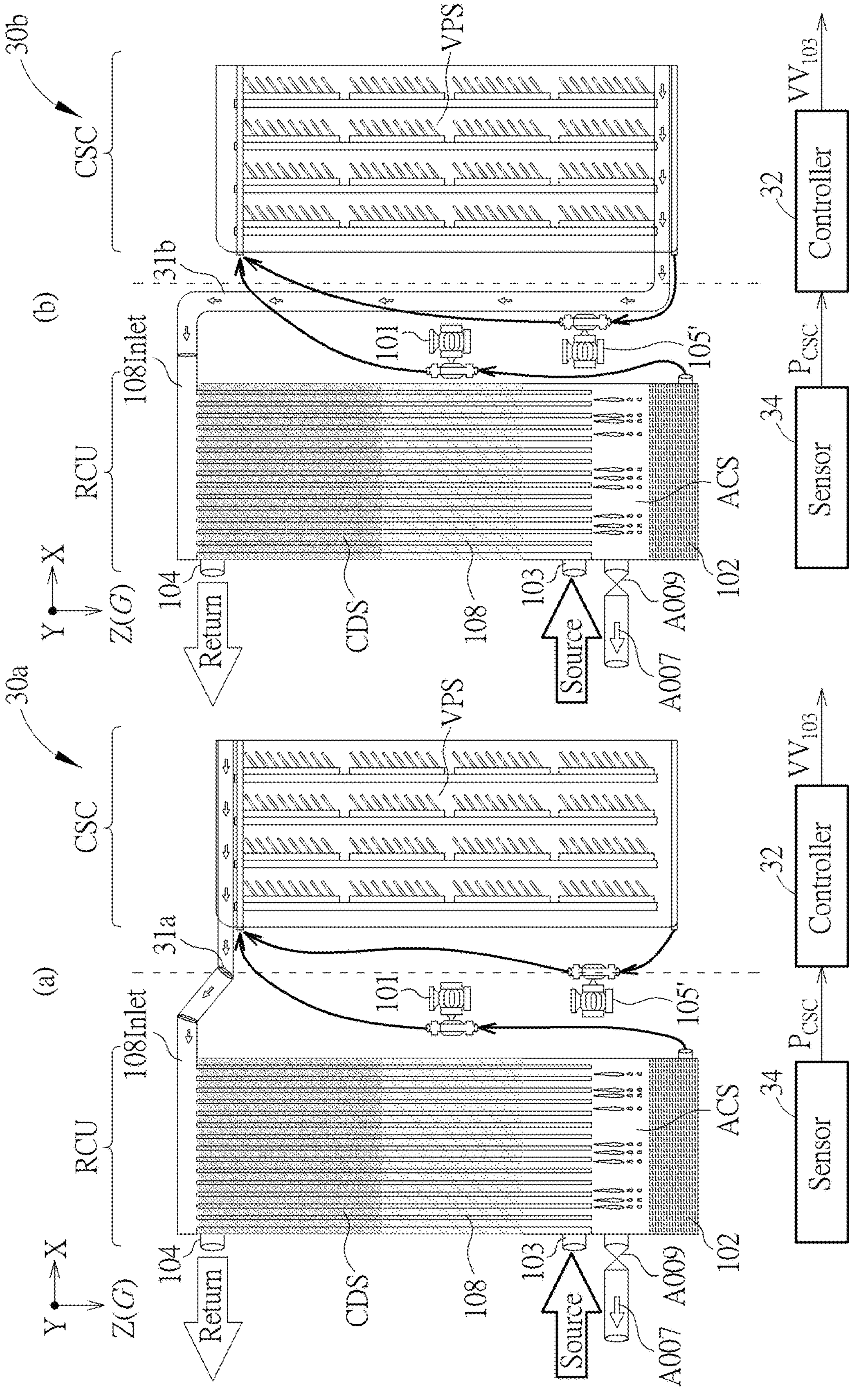
FIG. 18 illustrates schematic diagrams of cooling systems with blower-less configurations according to an embodiment of the present invention.

FIG. 18 illustrates schematic diagram of cooling systems 30*a* and 30*b* according to embodiments of the present invention. Different from the cooling system 20 in FIG. 6, the cooling system 30*a*/30*b* comprises no blower. Instead, the cooling system 30/30*b* comprises a tube 31*a*/31*b* connected between the coolant chamber CSC and the condenser 108. In the cooling system 30*a* the tube 31*a* is connected to a top of the coolant chamber CSC; while in the cooling system 30*b* the tube 31*b* is connected to a bottom of the coolant chamber CSC.

Besides, the condenser 108 shown in FIG. 18 may be a heat exchanger which comprises a plurality of condensing channels. Openings (117) are formed to connect to the plurality of condensing channels with the coolant tank 102, such that condensed liquid coolant may drip into and be collected by the coolant tank 102.

Let vaporization space VPS represent the space lies inside the coolant chamber CSC, let condensation space CDS represent the space lies inside the condenser 108, and let after condenser space ACS represent the space lies between condenser 108 output and coolant surface in coolant tank 102. Note, due to their unobstructed nature, the temperature and vapor pressure within either VPS and ACS should be roughly uniform, but different from each other, while temperature and vapor pressure within CDS will vary from those in VPS at the entry to those in ACS at the exit. In FIG. 18, except for connecting port(s) thereof, the vaporization space VPS and the condensation space CDS are enclosed except connecting port thereof. The vaporization space VPS and the condensation space CDS are separated/isolated from each other. In FIG. 18, the vaporization space VPS, the condensation space CDS and the after-condensation space ACS are also annotated.

In FIG. 18, the pump 105 connecting the coolant chamber CSC and the coolant reservoir/tank 102 is omitted. Instead, a pump 105' delivering collected liquid coolant from the coolant collector on the bottom of CSC to coolant injector at the top of the coolant chamber CSC is shown, facilitate the liquid coolant circulation within the CSC itself.

Purpose of FIG. 18 is to address two different kinds of connections between the coolant chamber CSC (bottom vs. top) and the condenser 108, to accommodate the need of different operation mode (e.g. if coolant vapor is heavier than air, then connected as 30*b* during normal operation and power-down sequence PDS, while connected as 30*a* during power-up sequence PUS), only a truncated portion of the coolant chamber CSC is shown.

During the cooling operation, the heat generating components (e.g., CPU or GPU) operate normally, continue to produce heat. A first pressure $P_{VPS}$ corresponding to the vaporization space VPS or a vaporization zone within the coolant chamber CSC would be higher than a second pressure $P_{ACS}$ corresponding to the after condenser space ACS. The airflow, carrying the mixture of coolant vapor and air, is produced because of a vapor pressure difference between the first pressure within VPS and the second pressure within ACS, $\Delta P = P_{VPS} - P_{ACS}$. Herein, the vaporization zone VPS is a subspace of the vaporization space and within the vaporization zone the liquid coolant is vaporized as the coolant vapor. Similarly, the after condenser space ACS is a subspace where most coolant vapor has condensed into liquid coolant when passing through condenser 108 and the temperature in ACS is same as coolant in tank 102 which may be 3-8° C. warmer than the source facility fluid.

Figure 24:
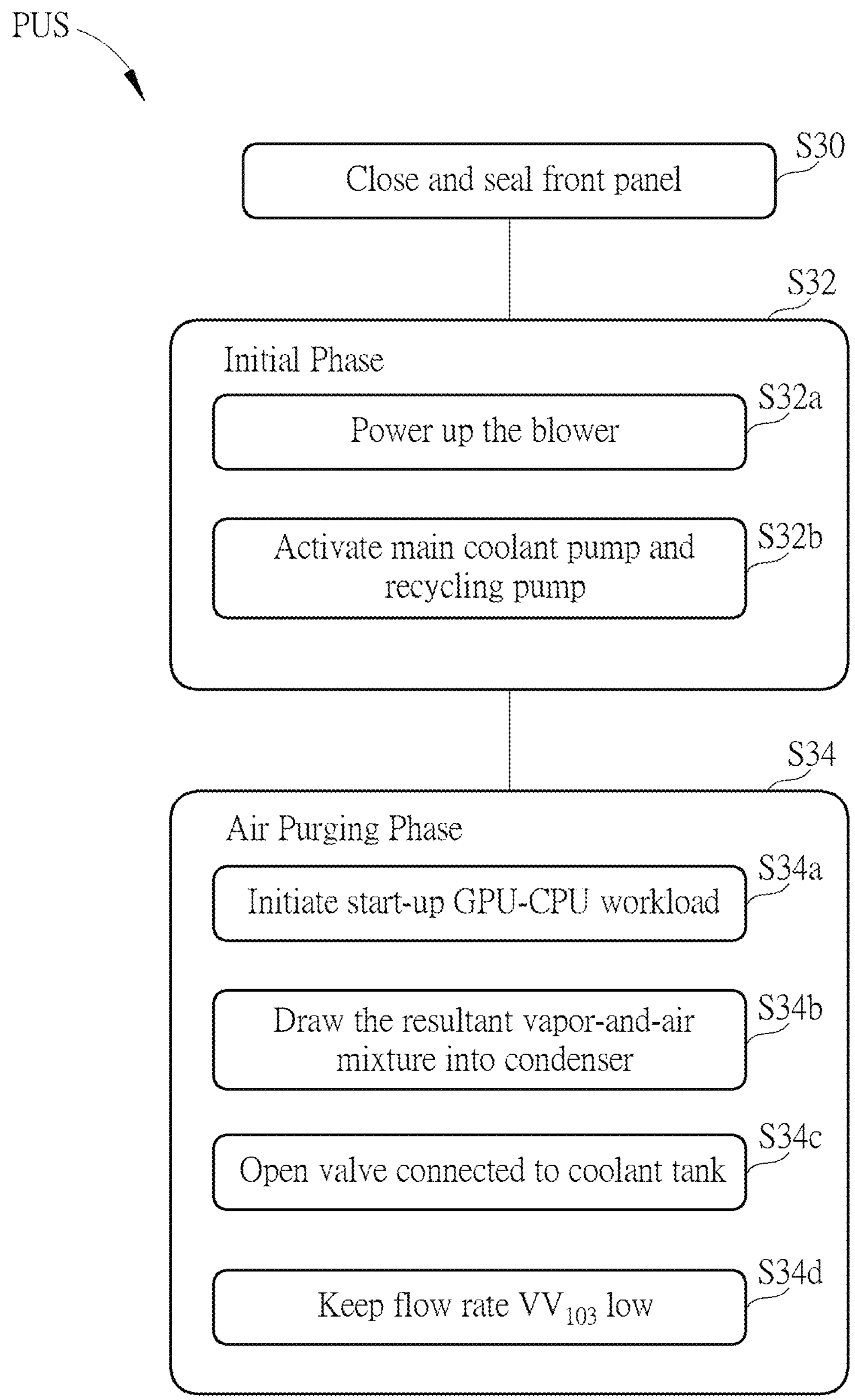
FIG. 24 is a schematic diagram of a power-up sequence PUS according to an embodiment of the present invention.

Since vapor pressure $P_{VPR}$ is directly related to vapor temperature, therefore, so long as the gas mixtures within VPS, CDS and ACS are predominantly (≥90%) coolant vapor (e.g. ≥90% ambient air is removed in the Air Purging (degassing) phase during power-up sequence PUS, as shown in FIG. 24), the operation described in last paragraph can be restated equivalently as follows: During the cooling operation, the heat generating components (e.g., CPU or GPU) operate normally and continue to produce heat. A first temperature $T_{VPS}$ corresponding to the vaporization zone VPS within the coolant chamber CSC would be higher than a second temperature $T_{ACS}$ corresponding to the after condenser space ACS within the tank 102. The air flow, carrying the mixture of coolant vapor and air, is produced because of a temperature difference between the first temperature and the second temperature, $\Delta T = T_{VPS} - T_{ACS}$.

For example, in the vaporization space VPS the first temperature may be target at or slightly above the boiling point temperature of the liquid coolant (e.g., 56° C., corresponding to the first temperature), and in the after condenser space ACS the second temperature may be 3-8° C. above the temperature of the source facility fluid (e.g., 30° C. from cooling tower or 10° C. from chiller, corresponding to the second temperature, leading to ACS temperature of 33-38° C. or 12-18° C.). The vapor pressure difference corresponding to the temperature difference between the first temperature and the second temperature would naturally produce the airflow at $108_{Inlet}$. Because of this naturally occurring airflow due to ΔP, coolant circulation is established across VPS, CDS and ACS in system 30*a*, 30*b* without employing blower 107 as in system 20 of FIG. 3.

Figure 19:
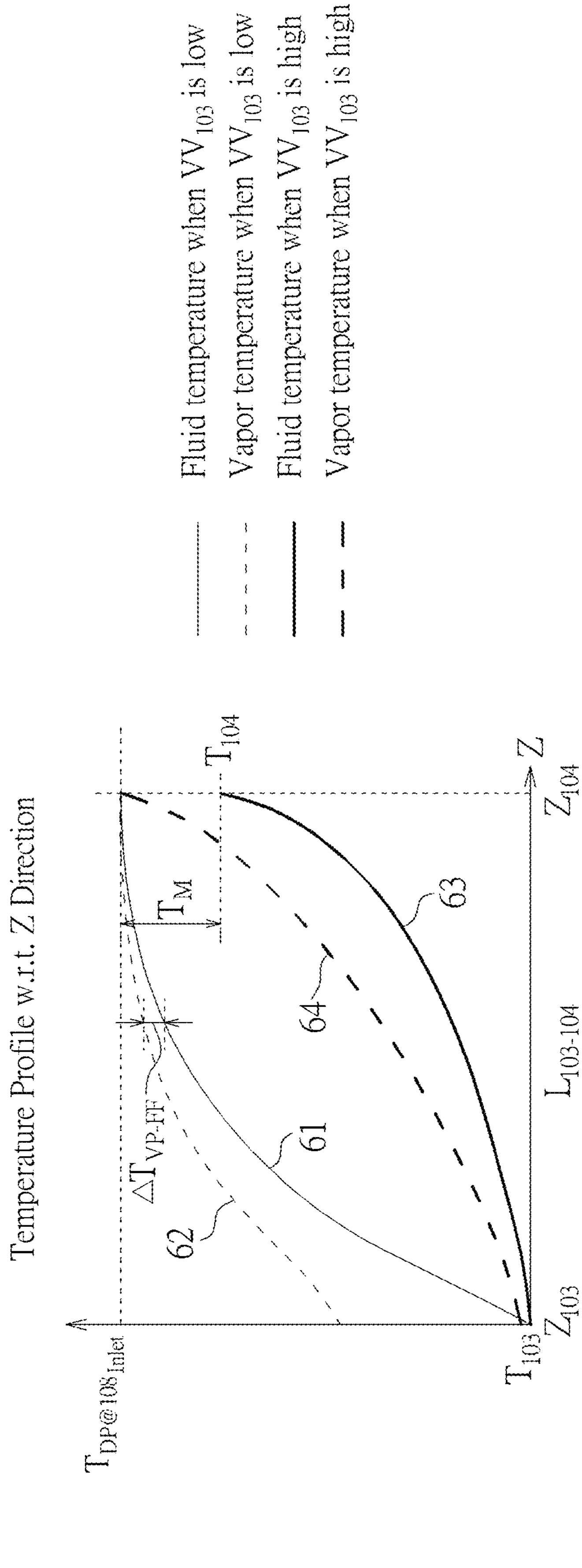
FIG. 19 is a schematic diagram of temperature profile with respect to Z direction.

FIG. 19 illustrates a diagram of temperature profiles, both within the facility fluid channel (solid lines) and within the coolant vapor channel (dashed lines), of condenser 108, with respect to Z/vertical direction, from $Z_{103}$ (Z/vertical position of port 103) to $Z_{104}$ (Z/vertical position of port 104).

In the diagram of FIG. 19, temperature is shown as vertical axis, Z/vertical position is shown as horizontal axis, $T_{DP@108Inlet}$ (on vertical axis) represents dew point temperature at inlet of 108 (also denoted/abbreviated as $108_{Inlet}$) where coolant vapor is received from CSC, $Z_{103}$ and $Z_{104}$ (on horizontal axis) represents Z positions of port 103 and port 104 respectively. Condenser 108 receives/returns facility fluid (e.g., source water) from/to port 103/104. $T_{103}/T_{104}$ represents temperature at port 103/104. L103-104 represents length of the condenser 108 between ports 103 and 104. Solid curves represent facility fluid (e.g., water) temperature variation within the facility fluid channel of condenser 108. Dashed curves represent vapor temperature variation within the vapor-air channel of condenser 108. $VV_{103}$ represents flow rate or volume velocity of facility fluid flowing to port 103. Thick solid/dashed curves correspond to an operating condition where $VV_{103}$ is quite high. Thin solid/dashed curves correspond to an operating condition where $VV_{103}$ is quite low.

When flow rate of facility fluid is slow/fast (see curve 61/63 label: when $VV_{103}$ is low/high), after entering port 103, the amount of heat rejected to per unit of volume of facility fluid will be high/low, causing the temperature of facility fluid to rise more quickly (curve 61)/slowly(curve 63) toward $T_{DP@108Inlet}$, increases/decreases the slope of curve 61/63 at $Z_{103}$.

When $VV_{103}$ is low and the slope of facility fluid temperature profile at $Z_{103}$ is higher than a slope of $(T_{DP@108Inlet}-T_{103})/L_{103-104}$, the facility fluid temperature profile will plateau, its slope flattens, when approaching $Z_{104}$ (see curve 61). Since heat exchange between vapor and facility fluid is positively related to temperature difference $\Delta T_{VP-FF}$ between coolant vapor $T_{VP}$ and facility fluid $T_{FF}$, the rapidly diminishing $\Delta T_{VP-FF}$ from $Z_{103}$ toward $Z_{104}$, means the slope of vapor temperature (see curve 62) would flatten toward $Z_{104}$, producing a mild temperature change near $Z_{104}$, implying low pressure gradient at $\mathbf{108}_{Inlet}$, resulting in slow vapor flow rate at the interface from coolant chamber CSC to condenser 108.

When flow rate of facility fluid is high and the slope of facility fluid temperature profile at $Z_{103}$ is smaller than a slope of $(T_{DP@108Inlet}-T_{103})/L_{103-104}$ then the slope of facility fluid temperature profile will rise toward $Z_{104}$ (see curve 63). When $VV_{103}$ is raised to a level such that facility fluid temperature at the return port 104 $T_{104}$ is significantly (e.g., 4-9° C.) below $T_{DP@108Inlet}$, such significant temperature difference from coolant vapor to facility fluid $\Delta T_{VP-FF}$ facilitates heat exchange between vapor and facility fluid, leading to both steep rise of facility fluid temperature (see curve 63) near return port $Z_{104}$ and steep fall of vapor temperature (see curve 64) before condenser $\mathbf{108}_{Inlet}$. Such steep slope of vapor temp change implies high pressure gradient at $\mathbf{108}_{Inlet}$, resulting in fast vapor flow rate at the interface from coolant chamber CSC to condenser 108.

As illustrated in FIG. 19, for an blower-less embodiment (e.g., cooling system 30*a*/30*b*), the cooling effectiveness can be estimated by $T_M$, temperature difference between dew point temperature at $\mathbf{108}_{Inlet}$ and fluid temperature at output port 104, i.e., $T_M=T_{DP@108Inlet}-T_{104}$ and the cooling capacity can be determined by: 1) $VV_{103}$, flow rate of facility fluid or specifically source water, 2) $P_{CSC}$, the (sensed) pressure in CSC or equivalently $P_{108Inlet}$, the pressure at inlet of condenser 108, and 3) $T_{103}$, temperature of source water. Dew point temperature $T_{DP@108Inlet}$ may be obtained according (sensed) pressure $P_{CSC}$ or $P_{108Inlet}$. Temperature $T_{104}$ may be obtained by a temperature sensor disposed around the port 104, where the port 104 of the condenser 108 is for returning facility fluid.

In this regard, a control scheme may be proposed to adjust $VV_{103}$ according to $P_{CSC}$ or $P_{108Inlet}$, to achieve optimal vapor pressure difference $\Delta P_{VPR}$, temperature difference $T_M$, or even optimal cooling effectiveness or cooling capacity.

In an embodiment, the cooling system (e.g., 30*a*/30*b*) of the present invention may comprise a controller 32 and a sensor 34. The controller 32 is configured to control or adjust the flow rate $VV_{103}$ of the facility fluid according to the sensed pressure $P_{CSC}$. The sensor 34 is configured to obtain the sensed pressure $P_{CSC}$. The sensor 34 may be disposed within the coolant chamber CSC or at inlet of the condenser 108.

In an embodiment, the controller 32 may be configured to execute a control scheme shown as pseudo code below.

If($P_{CSC}$<$P_0$−dP)
$VV_{103}=VV_{103}-4$; //coarse decrease
else if ($P_{CSC}$<$P_0$)
$VV_{103}=VV_{103}-1$; //fine decrease
else if ($P_{CSC}$>$P_0$)
$VV_{103}=VV_{103}+1$; //fine increase
else if ($P_{CSC}$>$P_0$+dP)
$VV_{103}=VV_{103}+4$; //coarse increase
goto Loop;

General principle of the above control scheme is to increase/decrease the flow rate $VV_{103}$ moderately when the sensed pressure $P_{CSC}$ is moderately larger/smaller than target $P_0$ and increase/decrease flow rate $VV_{103}$ significantly when the sensed pressure $P_{CSC}$ is significantly larger/smaller than target $P_0$. Note that, numerical values 1, 4 of increment/decrement shown in the pseudo code above are for illustrative purposes. Those skilled in the art shall be able to modify according to practical requirements.

In an embodiment, $P_0$ may be 1.25 kPa(g)≈12.7 g/cm$^2$ and dP may be 0.25 kPa(g) for a $P_{CSC}$ working range of 1.0-1.5 kPa(g).

The same control scheme above can be adapted to $T_M$. In an embodiment, controller 32 may be configured to execute the control scheme below.

If($T_M$<$T_0$−dT)
$VV_{103}=VV_{103}-4$; //coarse decrease
else if ($T_M$<$T_0$)
$VV_{103}=VV_{103}-1$; //fine decrease
else if ($T_M$>$T_0$)
$VV_{103}=VV_{103}+1$; //fine increase
else if ($T_M$>$T_0$+dT)
$VV_{103}=VV_{103}+4$; //coarse increase
goto Loop;

Similar discussion as prior paragraphs applies here and will be omitted for brevity.

Moreover, conventional two-phase immersion cooling faces another critical operational and environmental challenge: the messy, hazardous process of extracting server boards for service and maintenance. When a high-power server board requires service, the procedure typically involves lifting a coolant-saturated PCB, massive in both size and heft, from a deep immersion tank, resulting in inevitable coolant dripping and spillage across the data center floor. This not only creates significant operational mess but, more critically, contributes to the release of Per- and Polyfluoroalkyl Substances (PFAS), raising serious environmental, health, and regulatory compliance concerns. How to reconcile ultra-high-density cooling with clean, safe, and environmentally compliant serviceability is a significant objective in the field.

To fundamentally resolve this dilemma, a Power-Down Sequence (PDS) applying for the cooling system of the present invention would completely transform the maintenance experience. The PDS is a multi-step post-cooling process that acts as a quasi-encapsulated "auto dry/clean-up" procedure, before the server enclosure is ever opened, for the cooling system of the present invention. By incorporating processes such as Recirculated Forced Evaporation and Condensation (rFEC), this power down sequence may actively remove over 99% of the coolant, both in liquid and vapor, from the component area within CSC where IT (Information Technology) technician needs to access to perform service. This ensures that the PCB is virtually dry when accessed by the IT technician, thereby eliminating messy dripping, dramatically reducing the release of regulated coolant vapors (PFAS) into the environment, and elegantly allowing the board to be slid out horizontally for maintenance service conveniently. This breakthrough PDS sequence redefines high-density cooling maintenance, making it clean, safe, and compliant with the highest environment protection standards.

The PDS sequence is initiated by stopping the full-intensity normal GPU-CPU workload (Step S10) and starting a low-intensity power-down workload. This is followed by a managed termination of liquid coolant circulation (Step S11) which starts by shutting down the main coolant pump 101 and, as the heat from low-intensity power-down workload continues to vaporize coolant, deactivating the recycling pump 105 once the coolant level in the recycle trench of liquid coolant collector 110 drops below a predetermined “minimum” level. This termination step utilizes the heat from a low-intensity workload to turn most of the liquid coolant remaining in the CSC into coolant vapor and then, in the RCU, condenses that coolant vapor back into liquid coolant, stores the liquid coolant in the coolant tank 102, isolates the liquid coolant from (re-)entering the coolant chamber CSC, preparing the coolant chamber CSC for the subsequent drying process.

Note that, keeping GPU-CPU in the low-intensity workload represents that GPU-CPU functions as and can be regarded as a kind of heating element, where heating element in the present invention is configures to vaporize residual liquid coolant within CSC after normal or full-intensity GPU-CPU has been shut down. Heating elements in the present invention are not limited to dummy loaded or low-intensity loaded GPU-CPU, resistive layer printed on the circuit board or any suitable realization may be incorporated and is within the scope of the present invention.

Following the cessation of circulation (completion of step S11), all heating elements, including the heat-generating components such as CPU-GPU, may be again activated to a higher power workload to force the remaining liquid coolant, on PCB or somewhere inside CSC, to vaporize within the CSC (Step S12). Step S12, termed the “pseudo dryer” procedure, may be executed in multiple, carefully managed steps to maximize the reclamation of liquid and vapor coolant in the coolant chamber CSC.

In the present invention, the cooling system may comprise heating element(s). The heating element(s) is configured to generate heat to have liquid coolant, especially after supply of liquid coolant from the coolant tank to the CSC is ceased, be vaporized. The heating element(s) may be or comprise a (printed or otherwise created) resistive layer disposed on the main or auxiliary circuit board within the coolant chamber CSC. The heating element(s) may be the heat-generating components such as CPU-GPU, SSD, HBM, PMIC, NIC, etc. That’s, by letting CPU-GPU run some dummy programs, CPU-GPU and the companion components may generate heat while running the dummy programs, and thus computing components such as CPU-GPU can be regarded as heating elements in the context of PDS. In an embodiment, temperature sensor(s) may be included and disposed by the CPU-GPU, PMIC, etc. in order to monitor the temperature variation and control the temperature in real time. Controller may be also included (and may be embedded inside the CPU-GPU) to control the operation of the dummy programs.

First (Step S12*a*), at this stage, there may still be abundant liquid coolant remaining inside soaking pockets, hiding in crevices beneath/amongst PCB components, etc. Suddenly raising the temperature too high may cause explosive vapor generation, potentially causing mechanical damages. The purpose of step S12*a* is to mitigate such risk by raising temperature moderately for a brief period of time, remove most of the liquid coolant hiding within gaps & crevices (where explosive vapor generation causes greatest damages) gently. In step S12*a*, the heating elements are activated such that the on-silicon temperature (or generally, temperature corresponding to heat generating component) is initially set to $T_{BP}$+Q° C., where $T_{BP}$ is the coolant’s boiling point (e.g., $T_{BP}$=49° C. for coolant Opteon™ 2P50 coolant, assume Q is set to 3° C., the in-silicon temperature target will be $T_{BP}$+Q° C.=49+3=52° C.). In an embodiment, this temperature (e.g., 52° C.) may be maintained briefly, for approximately 10 to 30 seconds, ensuring that over 95% of the liquid coolant hiding beneath/within/amongst PCB components is vaporized.

Second (Step S12*b*): After completing first step S12*a*, the worry of explosive vapor generation has been dealt with, and the temperature can now be raised much higher to shorten the time required to vaporize all the coolant remain within CSC. In step S12*b*, the heating elements are activated such that the temperature offset Q is raised to 36° C. (e.g., $T_{BP}$+Q° C.=49+36=85° C.) and may be held for 2 to 5 minutes. This action raises the overall temperature of the space within CSC to 36° C. above the boiling point ($T_{BP}$) to quickly vaporize all remaining residual liquid coolant inside the chamber CSC.

Note that, Step S12*a* and Step S12*b* are only for illustrative purposes. It can be modified according to practical situations. Main purpose of Step S12 is to vaporize the residual liquid coolant within CSC.

After step S12*b* uses high temperature to accelerate liquid coolant vaporization within CSC, the CSC may be left in high vapor pressure state and, if the door of CSC is to be opened in this state, such high-pressure vapor may condense to mist of liquid coolant, bleed into HVAC system of the datacenter. The goal of step S14 is to circumvent/minimize this issue by first lowering the temperature of CSC to be close to (or slightly above) the room temperature of datacenter and remove those high concentration vapor utilizing condenser 108.

In step S14, the temperature offset Q may be lowered to, e.g., −22° C., so that $T_{BP}$+Q° C.=49-22=27° C. which is slightly above office temperature of 22-23° C., while maintaining the temperature for 2-3 minutes, utilize the condenser 108 as a dehumidifier (or more precisely, de-vaporizer) to condense/remove vapor from the vapor-air mixture, significantly lower the coolant vapor pressure in the CSC. Finally, a connection (e.g., for case where vapor is heavier than air, via one-way valves 703 in FIG. 22) between the coolant chamber CSC and ambient may be opened, allowing the ambient air to gently flow into the coolant chamber CSC and, along with the movement of ambient air, purge/flush residual vapor in the CSC into the condenser 108 (e.g., for case where vapor is heavier than air, via port 712 and valve 702) minimize the quantity of coolant vapor in CSC. The flow rate $VV_{103}$ is maintained at a significant level during step S14 such that the residual vapor can be condensed, stored in coolant tank 102, and tugged away from the IT technicians performing services of the PCB.

Note that, the numerical value of Q stated above is for illustration purposes. Those skilled in the art may alter according to practical situations.

Note that, in order to perform Steps S12*a*, S12*b* and S14, temperature sensor may be included in the coolant chamber CSC and disposed by the heat generating component or by the silicon-made component.

Steps S12*a* and S12*b* may be considered as a vaporization process, turning liquid coolant in CSC into vapor. Step S14 may be considered as a de-vaporization (akin to dehumidification of atmospheric humidity) process, turning coolant vapor in CSC and RCU back to liquid coolant and store it in a coolant tank. Collectively, Steps S12*a*, S12*b* and S14 serve to remove all coolant, liquid or vapor, from the coolant chamber CSC to a coolant tank in recycle-and-condense unit RCU.

Meanwhile, the blower 107 continuously cycles the vapor-air mixture through/toward the condenser 108 in Step S16. Step S16 achieves several goals simultaneously: 1) it utilizes condenser in RCU to condense the vapor coolant back into its liquid phase, which is then stored in the coolant tank 102; 2) it assists step S14 to actively lower the CSC coolant vapor pressure to a value approaching the saturated vapor pressure at "room temperature" or ambient temperature.

After that, the blower 107 may be powered off (Step S18). Since the blower operation is often used (together with regulator 109) to establish negative pressure within CSC (vacuum assisted chassis sealing), powering it off allows the negative pressure within the CSC to equalize with the ambient air.

Figure 20:
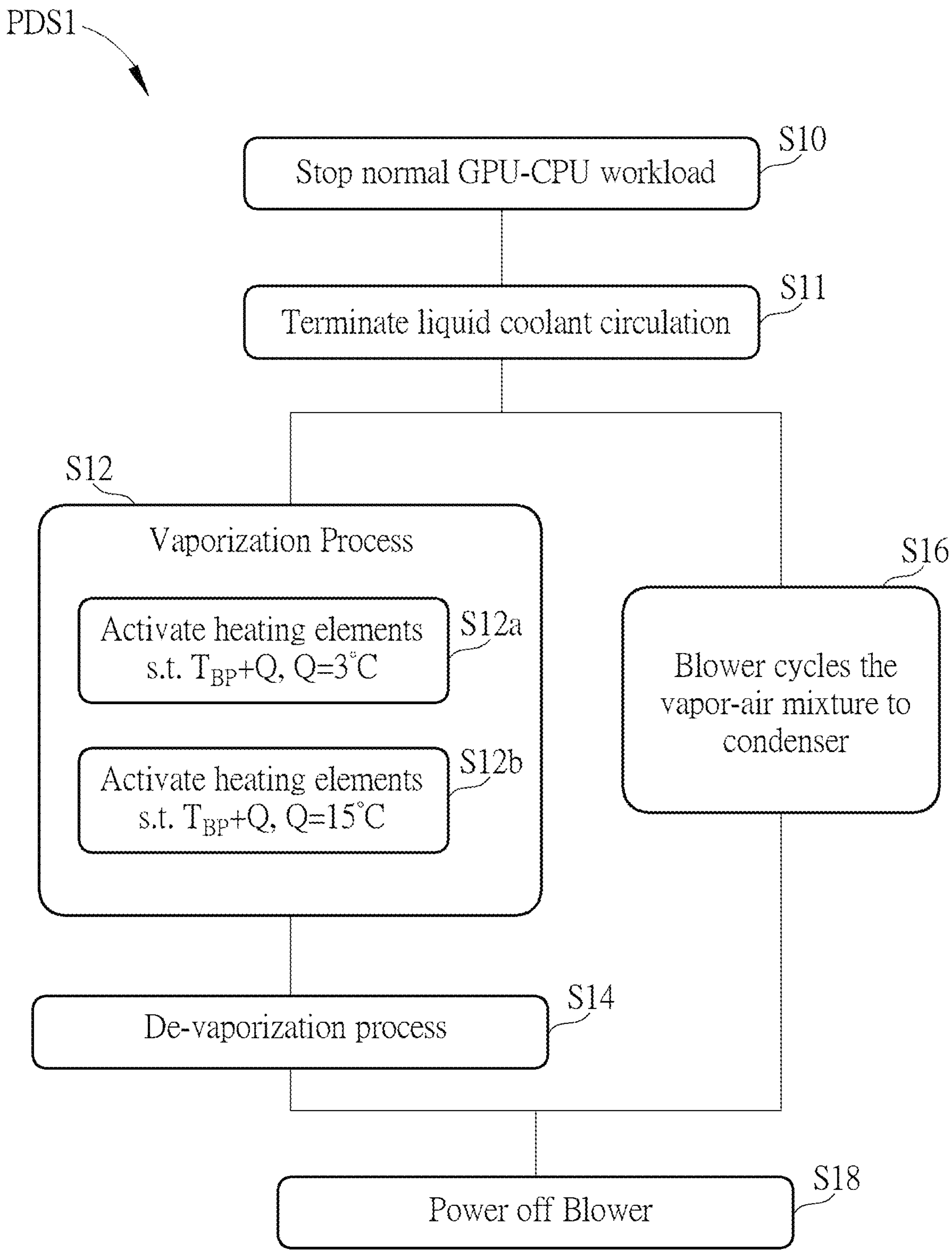
FIG. 20 is a schematic diagram of a post-cooling process (power down sequence) PDS1 according to an embodiment of the present invention.

The steps of power-down sequence (with blower) may be summarized as a post-cooling process PDS1 shown in FIG. 20. The power-down sequence and/or the post-cooling process may be considered as comprising a vaporization (coolant drying) process, taking place in the CSC, followed by a de-vaporization (vapor-removing) process, taking place in the RCU, configured to remove 99% of the coolant, liquid or vapor, from the coolant chamber CSC before the coolant chamber CSC is unsealed.

Figure 21:
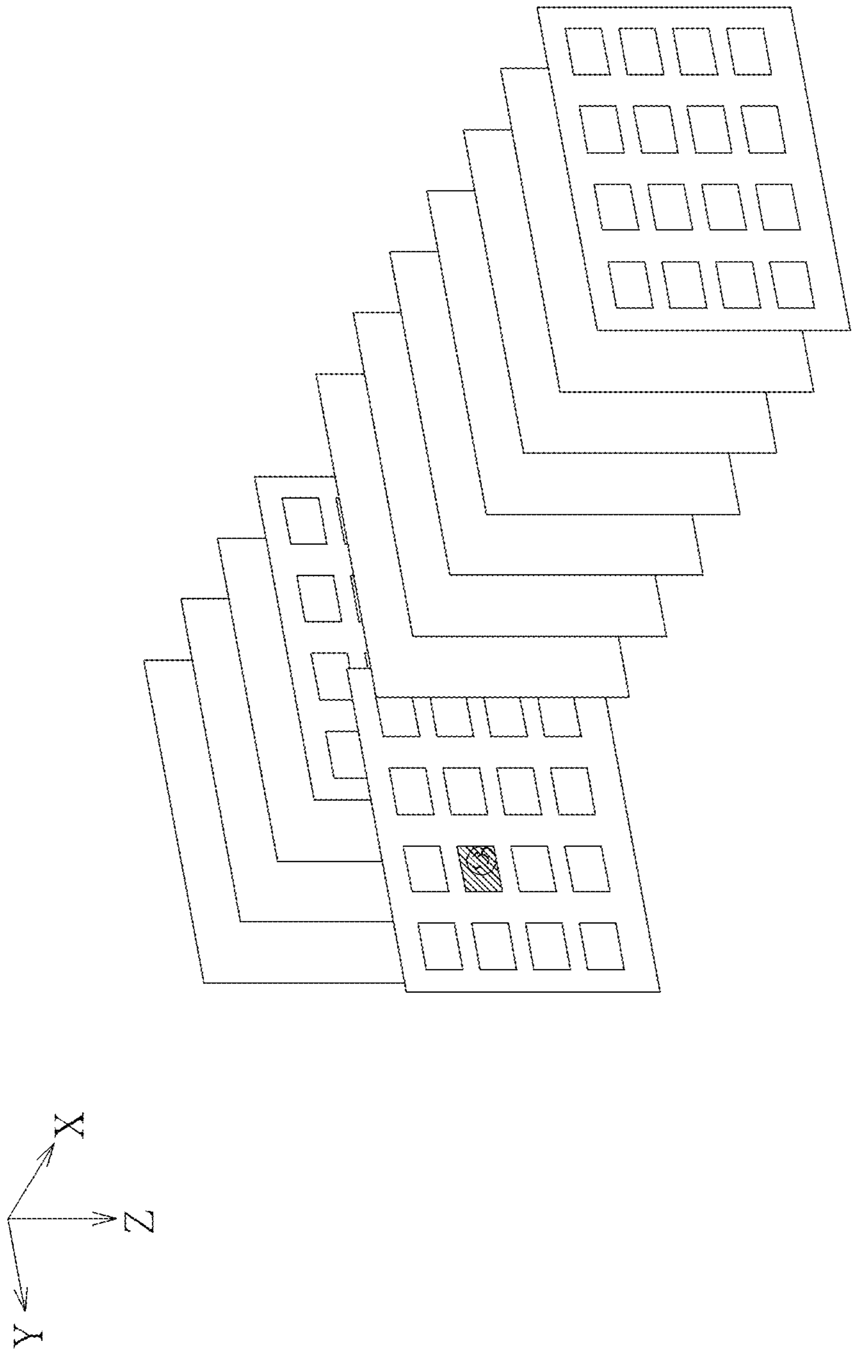
FIG. 21 illustrates a schematic diagram of sliding out one PCB from perspective of IT technician.

With the chamber CSC effectively dried and de-vaporized (dehumidified) and the pressure equalized, the front panel can be safely opened. In other words, after the post-cooling process or the power-down sequence is performed, the technician can then slide out the PCB containing faulty parts horizontally (e.g., with the help of extension-slide, along with Y direction) for service, as shown in FIG. 21. In addition to ridding the need for vertical lifter and being "easy, neat, clean", the horizontal movement of PCB enabled by this invention also allows highly effective backplane implementations, which becomes nearly impossible in the vertical-lift arrangement of conventional 2P-LIC.

In a short remark, the PDS or post-cooling process of the present invention would maximize packing density while eliminating the messy/tedious process of lifting boards out of deep immersion tanks, ensuring no dripping coolant and enabling the use of a chassis design without a vertical opening sealing lid, or vertically lifts to pull PCB out of deep immersion tanks when services are required. This rigorous, sequenced power-down approach guarantees that high-performance computing is accomplished not only with the utmost GPU-CPU packing density/efficiency, but also paired with an operationally clean, environmentally conscious/safe, and elegantly efficient maintenance model.

Critically, this sequence constitutes a fundamental breakthrough in minimizing 2P-LIC system's environmental impact. The compulsory two-phase reclamation process, involving the aggressive "pseudo dryer" vaporization (S12*a*-S12*b*) followed by the condenser 108's dehumidification (S14) and continuous vapor cycling (S16), ensures near-total coolant recovery. By removing virtually all residual liquid coolant and coolant vapor from the coolant chamber CSC before the front panel is released for opening, this methodology drastically mitigates fugitive emissions. This hyper-efficient containment is paramount to significantly lowering the overall Global Warming Potential (GWP) and actively reducing the risk of PFAS leakage and environmental contamination associated with maintenance procedures.

Note that, the post-cooling process PDS1 of FIG. 20 is for cooling system with blower. In addition, the present invention also provides post-cooling process or power-down sequence for blower-less configuration (e.g., cooling system 30*a*/30*b* shown in FIG. 19). Similarly, the power-down sequence for the blower-less construct is initiated to ensure near-complete recovery of the coolant into the reservoir, thereby minimizing potential volatile organic compound (PFAS) leakage and environmental impact.

Figure 23:
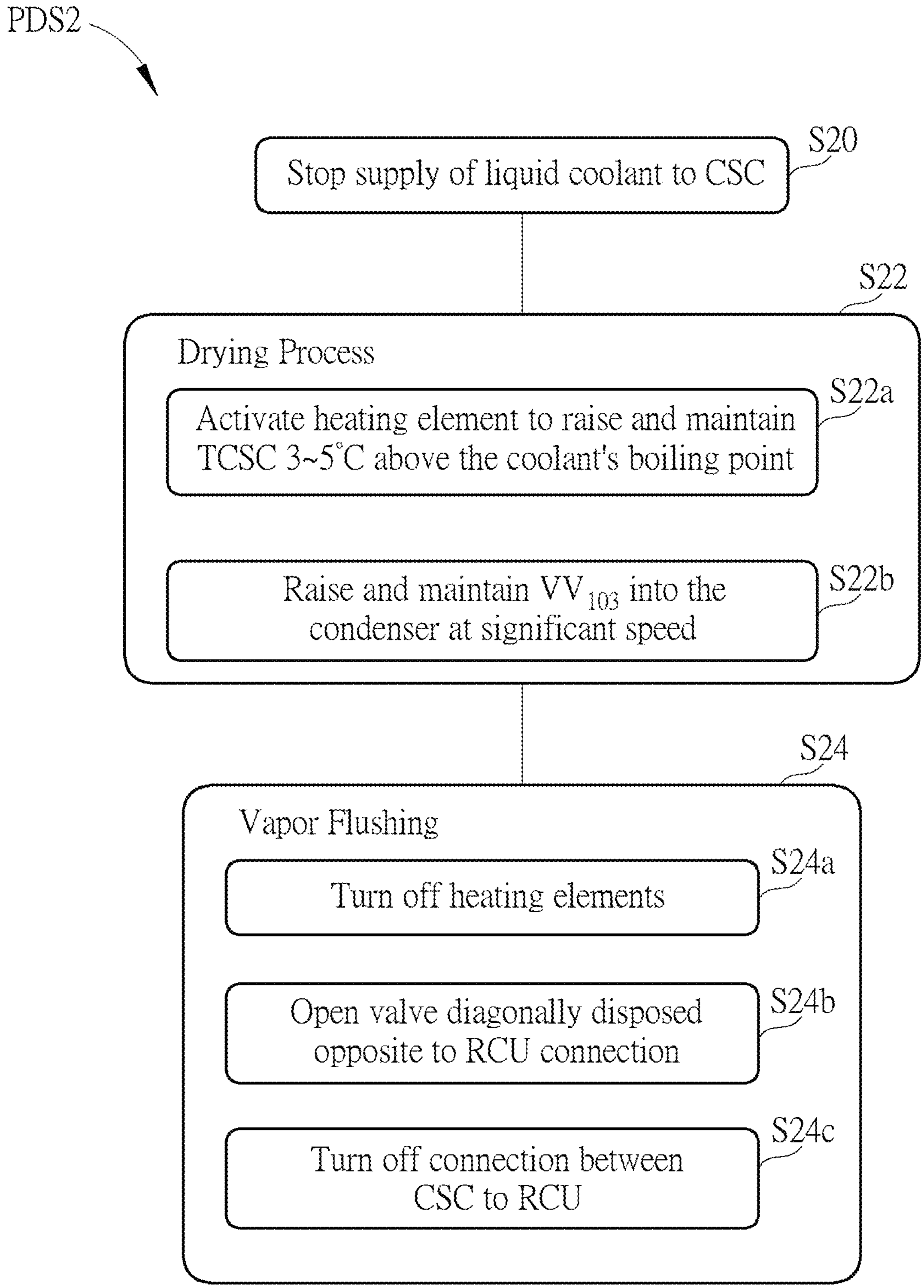
FIG. 23 is a schematic diagram of a post-cooling process (power down sequence) PDS2 according to an embodiment of the present invention.

In FIG. 23, a process PDS2 (PDS for blower-less configuration) is illustrated. The process PDS2 begins by stopping the supply of liquid coolant from coolant reservoir in the RCU to the coolant chamber CSC (Step S20). This is followed by a controlled Coolant Dry-up phase (or (pre-) drying process, Step S22, to gently drive out liquid coolant hiding in crevices/gaps beneath/amongst components and PCB before engaging the forceful main drying process), where internal heating elements or the CPU/GPU are activated to raise and maintain the CSC temperature $T_{CSC}$ 3-5° C. above the coolant's boiling point (at 1 ATM) (Step S22*a*). This operation raises the vapor pressure $P_{VPR}$ in coolant chamber CSC to 1.05-1.3 ATM on the condenser inlet side, creating a high-pressure gradient to drive vapor flow across the condenser. Simultaneously, the source water (as facility fluid) flow rate $VV_{103}$ into the condenser is raised and maintained at a significant speed, e.g., 50-70% of its full speed (Step S22*b*), which will create significant $T_M$ (see FIG. 19), establish high vapor pressure gradient at $\mathbf{108}_{Inlet}$, and significantly lowers the vapor pressure $P_{VPR}$ in the coolant tank to about 0.2-0.4 ATM. High vapor pressure gradient at $\mathbf{108}_{Inlet}$ is crucial for moving the coolant vapor from the CSC into/through the condenser and low vapor pressure in the ACS in the coolant tank, together with gravity, is crucial for the air-vapor to move, and the condensed coolant to drop, into coolant tank 102.

The drying process can be monitored either by tracking the condenser's pressure difference $\Delta P_{108.In\text{-}Out}=(P_{108.Inlet}-P_{108.Outlet})$ or by tracking the facility fluid temperature difference $\Delta T_{104\text{-}103}=(T_{104}-T_{103})$, where $P_{108.Inlet}/P_{108.Outlet}$ represents pressure at condenser inlet/outlet, and $T_{103}/T_{104}$ represents temperature at source/return port of condenser receiving/returning source water (or generally facility fluid). When the rate of change of these metrics drops below a predefined threshold (e.g., under 30 Pa/sec or under 0.06° C./sec), signifying that the rate which vapor condenses inside condenser (gram/sec) is approaching zero, meaning little vapor is left in the coolant chamber CSC to be condensed, in other words, CSC is essentially dry, the system is deemed to have reached equilibrium and vapor pressure everywhere is close to $P_{Satu@T103}$ ($P_{VPR}\approx P_{Satu@T103}$), where $P_{Satu@T103}$ represent saturated vapor pressure at temperature $T_{103}$, the temperature of source water or generally incoming facility fluid.

If CSC and RCU stay closed to this point, the pressure inside CSC and RCU will be $P_{AIR}+P_{VPR}$ where $P_{AIR}$ is the air pressure after the Air Purging (degassing) phase S24 of the power-up-sequence (to be detailed later) and $P_{VPR}$ is vapor pressure, e.g., an embodiment may have $P_{AIR}+P_{VPR}$=0.1 ATM+0.3 ATM=0.4 ATM, or −0.6 ATM(g)=−8.8 PSIG (for context, an NBA regulation basketball inflation is 8 PSIG). On one hand, such strong negative pressure creates challenges in aspects such as chassis construction, operation, etc. as it necessitates the use of thick panels, hefty construction, elaborate sealing, etc., but on the other hand, it creates a good opportunity for Vapor Flushing, as will be discussed below.

The next phase/process is Vapor Flushing (Step 24). All heating elements, including the CPU/GPU, are turned off (Step 24*a*). By opening a valve diagonally disposed opposite to the recycle-and-condense unit RCU connection (Step 24*b*) (will be detailed later), ambient air is introduced into the combined space of coolant chamber CSC and recycle-and-condense unit RCU by the negative pressures—from the side horizontally/diagonally opposite the recycle-and-condense unit RCU connection and from the bottom (or top) of the coolant chamber CSC, depending on whether the coolant vapor is lighter (or heavier) than ambient air. The flow rate is carefully controlled to create a smooth, sweeping airflow pattern so that incoming ambient air pushes any remaining coolant vapor inside the coolant chamber CSC towards the condenser inlet $\mathbf{108}_{Inlet}$. During this process, the coolant vapor is continuously swept from the coolant chamber CSC to the recycle-and-condense unit RCU, maintaining a non-equilibrium state. The Vapor Flushing is terminated before the airflow from ambient stops completely, by closing off the connection from the coolant chamber CSC to the recycle-and-condense unit RCU (such as shutting off valve 701/702 in FIG. 22) when the coolant chamber CSC pressure $P_{CSC}$ is near ambient pressure (e.g., $P_{Ambient}-P_{CSC}$=150-300 Pa or 1.5-3.1 g/cm$^2$) (Step 24*c*) or when the ambient air fills the coolant chamber. This CSC-RCU isolation by closing off opening at $\mathbf{108}_{Inlet}$ traps most remaining coolant vapor within the recycle-and-condense unit RCU, so that vapor won't be able to diffuse back into the CSC once the airflow from ambient stops, achieving a final $P_{VPR}$ within the coolant chamber CSC that is much lower than $P_{Satu@T103}$, effectively completing the quasi-encapsulation of the coolant inside the RCU and minimizing environmental release of coolant due to vapor diffusing backward from RCU to CSC when CSC is opened for service.

As discussed, if CSC and RCU stays closed until $P_{CSC}$ reaches $P_{Satu@T103}$, the pressure in CSC and RCU can reach −0.6 ATM(g) or −8.8 PSIG, a very high pressure which making the goal "pulling ambient air into CSC smoothly" difficult to achieve. One solution to this problem is to overlap process step S22 with S24 in a controlled manner: start Drying Step S22 first, wait until pressure in CSC falls to a pre-determined pressure level, e.g., −2 kPa or −0.3 PSIG, then start Vapor Flushing Step S24, and run these two process steps in parallel. In this approach, the value of $VV_{103}$ may be used to control the process. $VV_{103}$ not only affects the rate vapor condenses to liquid within condenser 108, by absorbing rejected heat, but also affects the $T_M$ at $\mathbf{108}_{Inlet}$ (FIG. 19) which contributes to the gradient around $\mathbf{108}_{Inlet}$, which in turn determines the rate vapor is drawn from CSC to RCU.

Other than $VV_{103}$, $T_{103}$ is another candidate to serve as control parameter to achieve similar effects described above. To control $T_{103}$, a chiller is usually needed in order to control the temperature facility water before supplying it to port 103 of the RCU. Due to the cost of this extra chiller, controlling via $T_{103}$ may be less desirable in practice. But, nonetheless, theoretically speaking, $T_{103}$ is a viable control parameter in the hybrid S22+S24 scheme mentioned above and is within the scope of this invention.

There are at least two ways to dispose the controlled valve diagonally opposite to the recycle-and-condense unit RCU connection, which depends on relative density between vapor and air. If the coolant vapor is heavier (lighter) than air, vapor will concentrate near the bottom (top) of the coolant chamber CSC while air may concentrate near the top (bottom) of the coolant chamber CSC. In this case, when performing Step 24*b*, it is suggested that the recycle-and-condense unit RCU is connected to the bottom (top) of the coolant chamber CSC and the valve diagonally disposed opposite to the recycle-and-condense unit RCU connection, so that when the valve is opened during the Vapor Flushing step in order to allow ambient air to gently flow into CSC and sweep coolant vapor out of the coolant chamber CSC (or even expel coolant vapor from the coolant chamber CSC), into the RCU without disrupting the vapor-air separation by density, so as to fill the coolant chamber with the ambient air.

Figure 22:
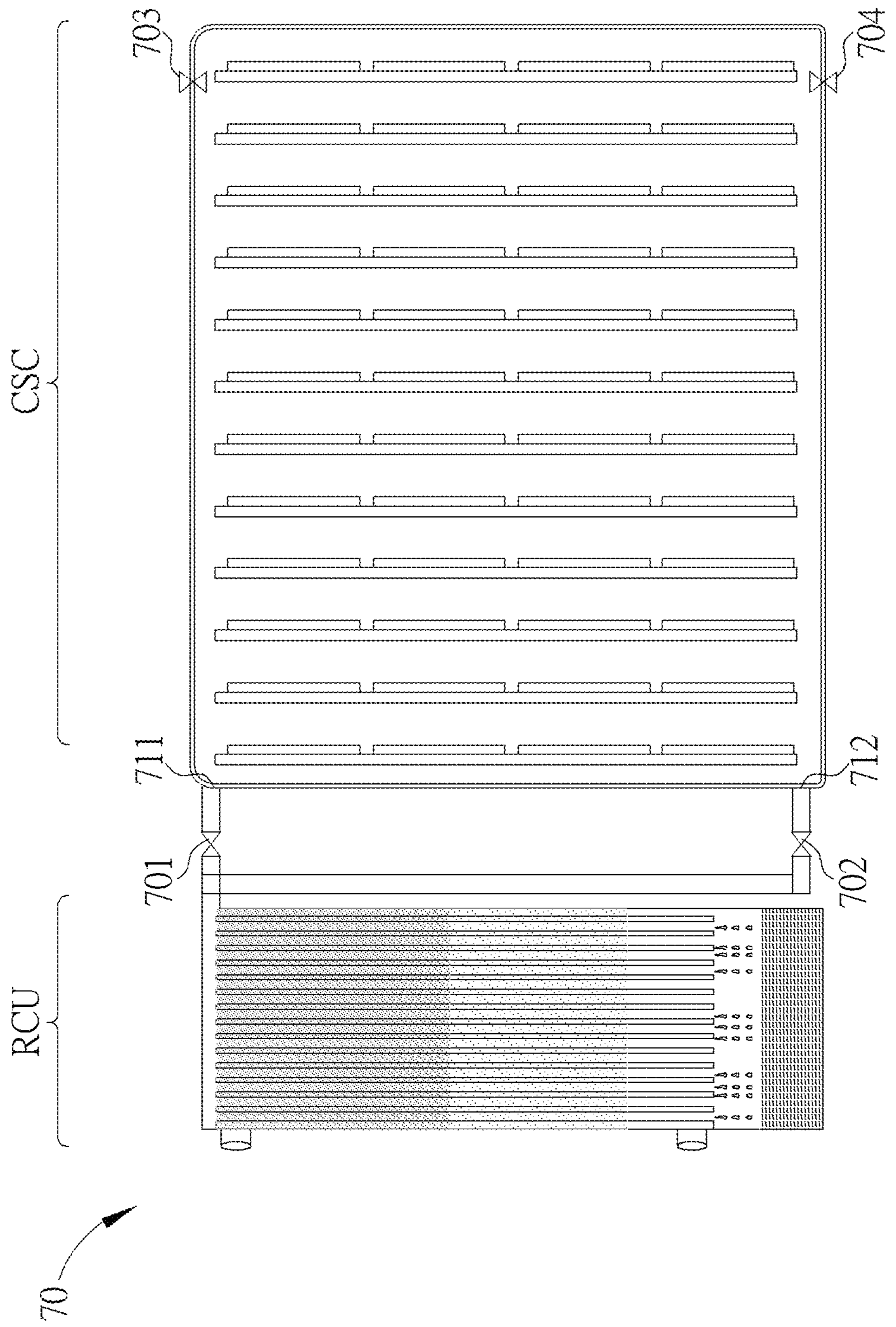
FIG. 22 is a schematic diagram of a cooling system according to an embodiment of the present invention.

For example, FIG. 22 illustrates a cooling system 70 according to an embodiment of the present invention. The cooling system 70 comprises valves 701-704. When the coolant vapor is heavier than air, the recycle-and-condense unit RCU may connect to a bottom port 712 of the coolant chamber CSC via opened valve 702. In this case, the opened valve 702 (or the bottom port 712 of the coolant chamber CSC) represents the recycle-and-condense unit RCU connection stated in Step 24*b*. When performing Step 24*b*, the diagonally disposed valve 703 is opened to allow ambient air to gently flow in. In this case, with the help from layer separation by density, the lighter air will stay near the top/right of CSC, sweeping the heavier vapor diagonally to RCU via port 712 on the lower/left corner. On the other hand, if the coolant vapor is lighter than air, the recycle-and-condense unit RCU may connect to a top port 711 of the coolant chamber CSC via opened valve 701. When performing Step 24*b*, the diagonally disposed valve 704 is opened to allow ambient air to flow in. In this case, with the help from layer separation by density, the heavier air will stay near the lower/right of CSC, sweeping the heavier vapor diagonally to RCU via port 711 on the top/left corner.

Note that, hybrid embodiment such as the cooling system 70 comprising the valves 701-704 offers several advantages: 1) during "Cooling Operation" phase, it is desirable to extract vapor from bottom (top) when vapor is heavier (lighter) than ambient air; 2) flexibility to accommodate ambient air density change due to site elevation, weather, etc.; 3) flexibility to accommodate any coolant whether its vapor density is heavier or lighter than ambient air.

The steps of power-down sequence of blow-less configuration (operate without blower) may be summarized as a post-cooling process PDS2 shown in FIG. 23.

While the preceding power-down sequence ensures a clean and environmentally conscious maintenance event, on the other hand, the cooling system also involves a Power-up Sequence or a pre-cooling process. Power-up sequence (or pre-cooling) shall be performed before the server is actual powered up for normal operation (or be performed before the cooling system initiates its normal cooling operation).

Upon installation/service completion and chassis closure, the coolant chamber CSC is initially filled with ambient air at approximately one atmosphere (1 ATM). The critical challenge of the power-up sequence is to purge, as completely as possible, this ambient air, which acts as a non-condensable gas. If not expelled, this air would raise the total operating pressure (the sum of coolant vapor pressure and residual air pressure) too high, severely degrading the condenser's efficiency, increasing difficulty in sealing the chassis, and preventing stable operation. Therefore, the primary objective of the Power-up Sequence is to initiate a controlled process that actively drives the air out of the chamber. This air-purging/flushing/removing process transforms the volume (or, specifically, gaseous atmosphere) within the coolant chamber CSC into a vapor-dominated state, ensuring that residual air pressure is minimal. Once the chamber is prepared, the system can achieve and sustain the desired low-pressure operating condition in RCU (e.g., 0.3 to 0.7 atm) essential for stable, high-efficiency two-phase cooling.

The Power-Up Sequence (PUS) is designed to establish the optimal Vapor-Dominated state within the coolant chamber CSC and RCU, from Ambient-Air-Dominated state. In other words, the power-up sequence is to remove (non-condensable) air from the coolant chamber CSC and to fill the coolant chamber CSC with (condensable) coolant vapor.

The PUS commences (once) after the front panel is confirmed to be securely closed and sealed (Step S30). The coolant chamber CSC is now filled with ambient air, acting as a non-condensable gas at approximately 1 ATM. The system control mechanism performs an initial phase (Step S32) comprising a sequential power-up of auxiliary components: 1) the optional blower 107, if included in the system, is powered up (Step S32*a*) and subjected to an operational range check, ensuring it can maintain the necessary airflow and pressure difference; 2) the main coolant pump 101 and the recycling pump 105 are activated (Step S32*b*), which is to inject liquid coolant into the coolant chamber CSC, and exercised across their respective operating ranges, where these pumps are responsible for establishing and maintaining the liquid coolant circulation throughout the coolant chamber CSC and reclaiming coolant from the trench of liquid coolant collector 110 back to the reservoir 102.

After that, the PUS enters the critical air purging phase (Step S34) to displace the non-condensable air from the system, including both the space of coolant chamber CSC and the space of recycle-and-condense unit RCU.

Before proceeding, preferably, the connection between coolant chamber CSC and recycle-condense unit RCU will be arranged to favor circulating air over circulating coolant vapor. Use FIG. 22 as reference, if air is lighter/heavier than vapor, then CSC-RCU will be connected via port 711/712 by opening valve 701/702 and closing valve 702/701.

Since the cooling system is yet to be brought up, the full cooling capacity is not yet available, the GPU-CPU will run a variable-intensity start-up workload instead (Step S34*a*).

With the main coolant pump and recycling pump both activated, GPU-CPU will be virtually/fully immersed in liquid coolant. The start-up workload should start with a light-to-moderate workload such that the resulting moderate heat generation causes the dispensed liquid coolant to vaporize gently, allow the vapor-air layer separation to occur naturally, while gradually increasing the coolant vapor pressure ($P_{VPR}$) within the coolant chamber CSC and the recycle-and-condense unit RCU.

In configuration with blower, the blower 107 draws the resultant vapor-air mixture into the condenser 108 (Step S34*b*). In configuration without blower, the total pressure $P_{TOTAL}=P_{AIR}+P_{VPR}$ pushes the resultant vapor-air mixture into the condenser 108 (Step S34*b*). Once entered the condenser 108, the coolant vapor is condensed back into the liquid phase by rejecting heat to facility water when passing through condenser. The condensed liquid is collected and returned to the reservoir.

The introduction of vapor from the coolant chamber CSC, driven by the blower 107 or total pressure $P_{Total}$, and the subsequent constant circulation and condensation of the mixture, ensures the continuous conversion of coolant vapor back to liquid, which is recycled. Critically, this circulation establishes a flow where the newly generated (re-condensable) vapor expels the non-condensable air from the space in the CSC chamber to the space in the RCU chamber.

In an embodiment, the coolant vapor generated in the coolant chamber CSC flows from the coolant chamber CSC across the condenser 108, where the re-condensable vapor coolant condenses into liquid coolant and gets stored in the coolant tank while non-condensable air pass through the empty volume of the coolant tank 102, and exits the coolant tank 102 via valve A009 as an air-vapor flow A007 (as shown in FIG. 18), accomplishing the goal to flush out residual non-condensable air which was trapped within the coolant chamber CSC and the recycle-and-condense unit RCU.

Valve A009 is only opened during the "air purging/flushing/removing" phase (Step S34*c*), allowing the flow of air-vapor mixture to vent to the ambient, and is closed otherwise.

Air-vapor flow A007 does not have to be output directly/straight toward ambient. For example, due to the infrequency of servicing a server rack, a specialized RCU, having the facility fluid specially chilled to 1-2° C., may be shared across many racks or facility wide, which may be used to further de-vaporize A007, sharply reducing the $P_{VPR}$ from A007, before finally releasing it to the atmosphere, minimizing the amount of coolant escaping the facility.

For blower-less configuration, such as system 70 in FIG. 22, there is no blower to circulate vapor-air mixture within CSC-RCU. For such systems, because the desired final operating pressure in ACS will be «1 ATM (e.g. in a prior example, $P_{Total}=P_{AIR}+P_{Satu@T103}=0.1$ ATM+0.3 ATM=0.4 ATM), in order to purge air out to the ambient during PUS, partial pressure $P_{VPR}$ needs to be raised during PUS to create a $P_{Total.PUS}$ that is 0.2-0.3 ATM higher than ambient. For example, in a system, the target operational $P_{AIR}$, $P_{AIR.OP}=0.1$ ATM and a $P_{Total}$ during PUS, $P_{Total.PUS}=1.2$ ATM, then the required $P_{VPR}$ during PUS, $P_{VPR.PUS}=P_{Total.PUS}-P_{AIR.OP}=1.2-0.1=1.1$ ATM. This $P_{VPR.PUS}$ may be generated by vaporizing coolant using heat generated from GPU-CPU and other components on PCB, under the control of the variable intensity startup workload, which means the purged air will be accompanied by significant amount of coolant vapor. For example, near the end of the "Air Purging" phase, to reach $P_{AIR.OP}=0.1$ ATM during normal operation, each part of air purged will be accompanied by at least 9 parts of vapor(!).

Therefore, to maintain high $P_{VPR.PUS}$S for blower-less configuration during the "air purging/flushing/removing" phase, the flow rate $VV_{103}$ is maintained at a low level or shut off entirely (or is minimized or zeroed) (Step S34*d*). This action, which is exactly the opposite for configuration with blower, ensures that the extent of condensation passing through the condenser is minimized, so that, the high partial vapor pressure ($P_{VPR}$), created within the coolant chamber CSC by heat from components mounted on PCB, can be successfully maintained across the condenser, to the coolant tank, and establish the total pressure $P_{Total}=P_{AIR}+P_{VPR}$ at 1.2-1.3 ATM to forces the air out of the condenser-tank region.

In addition, referring back to FIG. 22, suppose coolant vapor is heavier than air, during the air purging phase, air would likely be accumulated near top of the coolant chamber CSC (and to be driven out by coolant vapor), a port 711 disposed on a top of the coolant chamber CSC may be connected to the recycle-and-condense unit RCU of the condenser 108, where the corresponding valve 701 is turned on (and valve 702 is turned off or closed) during the air purging phase. On the other hand, during (normal) cooling operation, coolant vapor would likely be accumulated near bottom of the coolant chamber CSC (due to relative density and gravity), in an embodiment, a port 712 disposed on a bottom of the coolant chamber CSC may be connected to the recycle-and-condense unit RCU of the condenser 108, and the corresponding valve 702 may turned on (and valve 701 is turned off or closed) during (normal) cooling operation. By establishing & taking advantage of vapor-air separation, air can be driven from CSC out to RCU first, and when vapor finally starts emerging from RCU-CSC connection port, the air within CSC has already largely been purged, thereby, for those blowerless systems, the amount of vapor coolant needs to be spent in order to reach target residual air pressure level (e.g., $P_{AIR} \leq 0.1$ ATM) is greatly reduced.

Furthermore, to minimize the loss of coolant (and the GWP) during the Air Purging Phase S34, the flow resistance of regulator A009 may be set to high. This is true for both blower and blower-less configuration, but especially useful for blower-less configuration such as 30$a$, 30$b$ of FIG. 18. By choosing the CSC-RCU connection port (e.g. 711 vs. 712 in the discussion above) to draw mostly air out, followed by setting the flow resistance of A009 to high, the high $P_{TOTAL}$=1.2-1.3 ATM within ACS (needed to push out non-condensable air) can be achieved without consuming a large amount of coolant vapor along with the airflow of A007. Alternatively, instead of the un-assisted Air Purging step described above, for blower-less configuration, it might be reasonable, economical, or more GWP sensible, to involve a (mobile, portable) vacuum pump during the Air Purging phase. When such a vacuum pump is involved, the required $P_{TOTAL}$ can be reduced significantly, e.g., from 1.2-1.3 ATM to 0.3 ATM, which in turn reduces the required $P_{VPR}$, e.g., $P_{VPR.PUS.VACUUM}=P_{TOTAL\_PURG}-P_{AIR\_Target}=0.3\text{-}0.1=0.2$ ATM, much lower than the 1.1 ATM calculated previously without using a vacuum pump, which may simplify the start-up workload during S34 Air Purging phase.

This pre-cooling power-up process would actively purge the non-condensable air ($P_{Air}$) out of the system and continue until the coolant chamber CSC and the recycle-and-condense unit RCU volumes are successfully transformed into a Vapor-Dominated state, minimizing the Total Operating Pressure ($P_{Total}=P_{Vapor}+P_{Air}$) in ACS to a stable, relative low operating regime.

In blower-less configuration, to maintain the vapor-dominant state in the system, it is paramount to prevent any (non-condensable) air from seeping into the system during normal operation, accumulating in RCU causing total pressure within RCU to rise continuously, leading to system failure eventually. One approach to achieve this is to create mild positive pressure of 1-2 kPa(g) in CSC, so any imperfection in sealing will only lead to mild coolant vapor leakage into the ambient but not affecting the vapor-dominant state in the system which, if not maintained, may lead disastrous malfunction of the entire cooling system.

In the present invention, "air purging", "air flushing" and "air removing" refer to the same concept, and may be used interchangeably. Similarly, "vapor purging", "vapor flushing" and "vapor removing" refer to the same concept, and may be used interchangeably The structural design innovations, particularly the absence of vertical extraction mechanisms and the integrated nature of the local Recycle-and-Condense Unit (RCU), directly translate into a groundbreaking increase in computing density. Depending on the configuration of the RCU—whether dedicated or shared/redundant within the chassis (referring back to FIG. 2)—the PCB count per chassis can be significantly elevated. For instance, an embodiment utilizing a dedicated RCU allows for 12 PCBs per chassis at a pitch of 32 mm (millimeters), while a design incorporating a shared or redundant RCU can accommodate up to 16 PCBs per chassis at a pitch of 29.5 mm. Assuming a typical arrangement of four such chassis per rack, this yields an exceptionally dense concentration of processing power, ranging from an estimated 192-384 GPU/CPU pairs per rack. This density is calculated, for example, by 4 chassis multiplied by 12 PCBs per chassis, each containing four processors, resulting in 192 pairs; or 4 chassis multiplied by 16 PCBs per chassis, each containing 6 processors, yielding 384 pairs. This dramatic enhancement in packaging efficiency is a key technical achievement, far surpassing the spatial limitations of prior art immersion systems.

The present invention fundamentally addresses the aforementioned deficiencies of the prior art through a novel two-phase shower immersion cooling system, enabling unparalleled packing density, clean serviceability, and simplified infrastructure. By implementing horizontal PCB insertion/extraction, the system eliminates the need for vertical lifting clearance and cumbersome motorized top-lids, thereby achieving superior vertical packing density and maximizing utilization of rack space. Furthermore, the inherent cabling disadvantages are resolved, as horizontal access allows for the use of short power and high-speed Tbps optical networking cables without the routing restrictions associated with V-lifting clearance.

Crucially, the architecture replaces the concept of "real immersion" with "virtual immersion," utilizing only a fraction of the coolant required by conventional systems. This shower-based approach, combined with highly efficient Power-Down and Power-Up Sequences, solves critical environmental and maintenance problems. Specifically, the novel Power-Down Sequence incorporates a multi-step drying process—including vaporization and subsequent dehumidification—to actively purge and condense virtually all residual liquid coolant and vapor from the circuit board area before the chassis is unsealed. This ensures the PCB is completely dry when horizontally slid out for service, thereby eliminating coolant dripping and dramatically minimizing the release of fugitive emissions and mitigating the major environmental compliance risks associated with PFAS-containing coolants.

To overcome the thermal limits imposed by passive condensation and poor volume utilization, the present invention employs forced vapor circulation, either through an active blower or by leveraging vapor pressure differential ($\Delta P_{VPR}$) between separate vaporization and condensation chambers. This active vapor management sharply reduces the required space for vapor circulation and the size of the condenser, leading to vastly improved heat transfer rates and overall superior horizontal space utilization. Finally, the novel use of this active vapor management, which allows for adaptive control of the condenser's dew point, may effectively raise the required facility fluid temperature, often enabling the system to operate efficiently without reliance on dedicated chillers or Coolant Distribution Units (CDU), thus simplifying the entire data center infrastructure.

In summary, the present two-phase shower immersion cooling system represents a fundamental paradigm shift away from the constraints of conventional liquid immersion cooling. By replacing static immersion with dynamic, gravity-assisted showering, implementing horizontal service access, and utilizing an innovative coolant Power-Down Sequence, this invention concurrently achieves several critical objectives: it enables unprecedented hardware density (up to 384 GPU/CPU pairs per rack), ensures clean and compliant component serviceability with near-zero fugitive emissions (eliminating the messy dripping and PFAS risks), simplifies the cooling infrastructure by reducing coolant volume and potentially eliminating the need for complex chiller/CDU components, and overcomes the inherent thermal bottlenecks of prior art IHS and conventional D2C schemes. This integration of thermal efficiency, operational cleanliness, and mechanical density provides a revolutionary and scalable cooling solution for future ultra-high-power data center demands.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cooling system, comprising:

a coolant chamber;

wherein liquid coolant in the coolant chamber is vaporized as coolant vapor because of a heat generating component on a circuit board disposed within the coolant chamber and bubbles are produced from a heating surface associated with the heat generating component;

wherein a pocket structure is formed on a first side of the circuit board;

wherein a soaking pocket is formed between the pocket structure and the circuit board and encompasses the heat generating component;

wherein a liquid coolant movement relative to the heating surface is produced within the soaking pocket in order to remove the bubbles produced from the heating surface.

2. The cooling system of claim 1, wherein a liquid coolant flow relative to the heating surface is produced within the soaking pocket to remove the bubbles produced from the heating surface.

3. The cooling system of claim 1, wherein the soaking pocket is formed and the heating surface is soaked in the liquid coolant within the soaking pocket.

4. The cooling system of claim 3, wherein a liquid coolant flow is produced due to a liquid coolant convection formed within the soaking pocket.

5. The cooling system of claim 4, wherein the liquid coolant convection produces a first liquid coolant flow toward a first direction and a second liquid coolant flow toward a second direction.

6. The cooling system of claim 4, wherein the liquid coolant convection flows through a first coolant channel and a second coolant channel;

wherein the liquid coolant convection is formed due to a density difference or a gravity difference between the first coolant channel and the second coolant channel.

7. The cooling system of claim 3, wherein the pocket structure comprises:

a wall;

wherein the soaking pocket is formed between the wall and the circuit board.

8. The cooling system of claim 7, comprising a partition, disposed between the wall and the circuit board within the soaking pocket;

wherein a first coolant channel is formed between the wall and the partition;

wherein a second coolant channel is formed between the partition and the circuit board.

9. The cooling system of claim 8, wherein a liquid coolant flow relative to the heating surface is produced due to a gravity difference or a density difference between the first coolant channel and the second coolant channel.

10. The cooling system of claim 8, wherein the bubbles float within the second channel.

11. The cooling system of claim 8, wherein a first level of the first coolant channel is higher than a second level of the second coolant channel.

12. The cooling system of claim 8, wherein a top portion of the first coolant channel is funnel-shaped.

13. The cooling system of claim 7, comprising a rotating element, disposed between the wall and the circuit board within the soaking pocket;

wherein the rotating element rotates to facilitate a liquid coolant convection within the soaking pocket, and the liquid coolant convection facilitates a liquid coolant flow relative to the heating surface.

14. The cooling system of claim 3, wherein a gap is formed at a bottom of the soaking pocket and the liquid coolant flows through the heating surface via the gap.

15. The cooling system of claim 3, comprising:

a vibrator, disposed in the soaking pocket, configured to generate a liquid coolant disturbance to flush out the bubbles produced from the heating surface.

16. The cooling system of claim 15, wherein the vibrator is disposed at a bottom of the soaking pocket.

17. The cooling system of claim 15, wherein the vibrator is disposed in a coolant channel formed in the soaking pocket;

wherein the coolant channel encompasses the heat generating component.

18. The cooling system of claim 15, wherein the vibrator generates a liquid coolant wave corresponding to an ultrasonic frequency;

wherein the liquid coolant disturbance comprises the liquid coolant wave.

19. The cooling system of claim 1, wherein the pocket structure comprises:

a tilting fin;

wherein the tilting fin tilts upward;

wherein the soaking pocket is formed between the tilting fin and the circuit board.

20. The cooling system of claim 19, wherein a gap is formed between the tilting fin and the heating surface associated with the circuit board and at a bottom of the soaking pocket;

wherein a liquid coolant flows downward through the heating surface via the gap.

21. The cooling system of claim 19, wherein a hole is formed on the tilting fin;

wherein a liquid coolant flows downward through the heating surface via the hole.

22. The cooling system of claim 1, wherein a liquid coolant flow comprises a liquid coolant disturbance;

wherein the liquid coolant disturbance flushes out the bubbles produced from the heating surface.

* * * * *